United States Patent
Nakashima et al.

(10) Patent No.: US 7,061,669 B2
(45) Date of Patent: Jun. 13, 2006

(54) OPTICAL APPARATUS WITH LOSS COMPENSATION CAPABILITY AND OPTICAL AMPLIFIER FOR LOSS COMPENSATION

(75) Inventors: Hisao Nakashima, Kawasaki (JP); Miki Onaka, Kawasaki (JP); Masato Nishihara, Kawasaki (JP); Etsuko Hayashi, Kawasaki (JP); Hideyuki Miyata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/950,699

(22) Filed: Sep. 28, 2004

(65) Prior Publication Data

US 2005/0088727 A1   Apr. 28, 2005

Related U.S. Application Data

(63) Continuation of application No. PCT/JP03/03106, filed on Mar. 14, 2003.

(30) Foreign Application Priority Data

Mar. 28, 2002 (JP) .............................. 2002-092443

(51) Int. Cl.
*H01S 3/00* (2006.01)

(52) U.S. Cl. ................................................ 359/341.41
(58) Field of Classification Search ............ 359/341.41
See application file for complete search history.

(56) References Cited

U.S. PATENT DOCUMENTS

| | | | |
|---|---|---|---|
| 5,131,069 A | 7/1992 | Hall et al. ................... | 385/142 |
| 5,323,474 A | 6/1994 | Hornung et al. ............... | 385/24 |
| 5,966,228 A | 10/1999 | Akiba et al. ................. | 398/147 |
| 5,995,274 A * | 11/1999 | Sugaya et al. .............. | 359/337 |
| 6,246,514 B1* | 6/2001 | Bonnedal et al. ...... | 359/341.41 |
| 6,307,668 B1* | 10/2001 | Bastien et al. ........... | 359/337.1 |
| 6,850,360 B1* | 2/2005 | Chen et al. ................. | 359/334 |

FOREIGN PATENT DOCUMENTS

| EP | 0 497 140 A1 | 5/1992 |
|---|---|---|
| EP | 0 527 265 A1 | 2/1993 |
| EP | 0 777 347 A2 | 6/1997 |
| JP | 3-296025 A | 12/1991 |
| JP | 4-303980 | 10/1992 |
| JP | 5-48178 | 2/1993 |
| JP | 5-502334 | 4/1993 |

(Continued)

OTHER PUBLICATIONS

Agrawal, Govind P. Fiber-Optic Communication Systems. 2nd Edition. John Wiley & Sons. 1997. p. 69.*

(Continued)

*Primary Examiner*—Deandra M. Hughes
(74) *Attorney, Agent, or Firm*—Staas & Halsey LLP

(57) ABSTRACT

An optical apparatus having a loss compensation capability includes between an input connector 1A and an output connector 1B an input side optical parts 2 including an input monitor, an amplification medium 3, a loss medium 4, and an output side optical parts 5 including an output monitor in this order, and is provided with a control circuit 6 for controlling a gain based on a monitor result of input/output light. The amount of reflection attenuation on all points, on which the light can be reflected on the optical path from the output end of the amplification medium 3 to the output connector 1B, can be smaller than the amount of reflection attenuation on the end face of the output connector 1B.

14 Claims, 59 Drawing Sheets

FOREIGN PATENT DOCUMENTS

| JP | 5-291668 | 11/1993 |
|---|---|---|
| JP | 7-218726 A | 8/1995 |
| JP | 9-162805 | 6/1997 |
| JP | 10-107350 A | 4/1998 |
| JP | 11-068201 A | 3/1999 |
| WO | 91/09475 | 6/1991 |

OTHER PUBLICATIONS

Hecht, Jeff. Understanding Fiber-Optics. 2nd Edition. Sams Publishing. 1993. pp. 195-199.*

Kawashima et al.; "Fabrication and achievement of the high-performance of 2-dimensional photonic crystal polarization splitters", Technical Report of IEICE, OPE99-109; pp. 25-30 (with English abstract). 1999.

Chiba et al.; "Propagation loss trimming by $CO_2$-LASER irradiation on PLC" The Institute of Electronics, Information and Communication Engineers (IEICE) Electronics Society Convention 2000, C-3-20, p. 145 (with translation).

Ohira et al.; "Characteristics of Multi/Demultiplexer by pure $SiO_2$ cladding layer", The Institute of Electronics, Information and Communication Engineers (IEICE) Electronics Society Convention 2000, C-3-21, p. 146 (with translation).

Tanaka et al.; "Hybrid Integrated External Cavity Laser with a Monitor PD (2)", The Institute of Electronics, Information and Communication Engineers (IEICE) Electronics Society Convention 2000, C-3-107, p. 233 (with translation).

Ohyama et al.; "An Emission Frequency Controlled Hybrid Integrated Multiwavelength Light Source Using Planar Lightwave Circuit", The Institute of Electronics, Information and Communication Engineers (IEICE) Electronics Society Convention 2000, C-3-109, p. 235 (with translation).

Fukuyama et al.; "Steady-State Amplification Characteristics of Erbium-Ytterbium Codoped Optical Waveguide-Type Amplifiers Using Garnet Crystal Thin Films", The Institute of Electronics, Information and Communication Engineers (IEICE) Electronics Society Convention 2000, C-3-98, p. 224 (with translation).

* cited by examiner

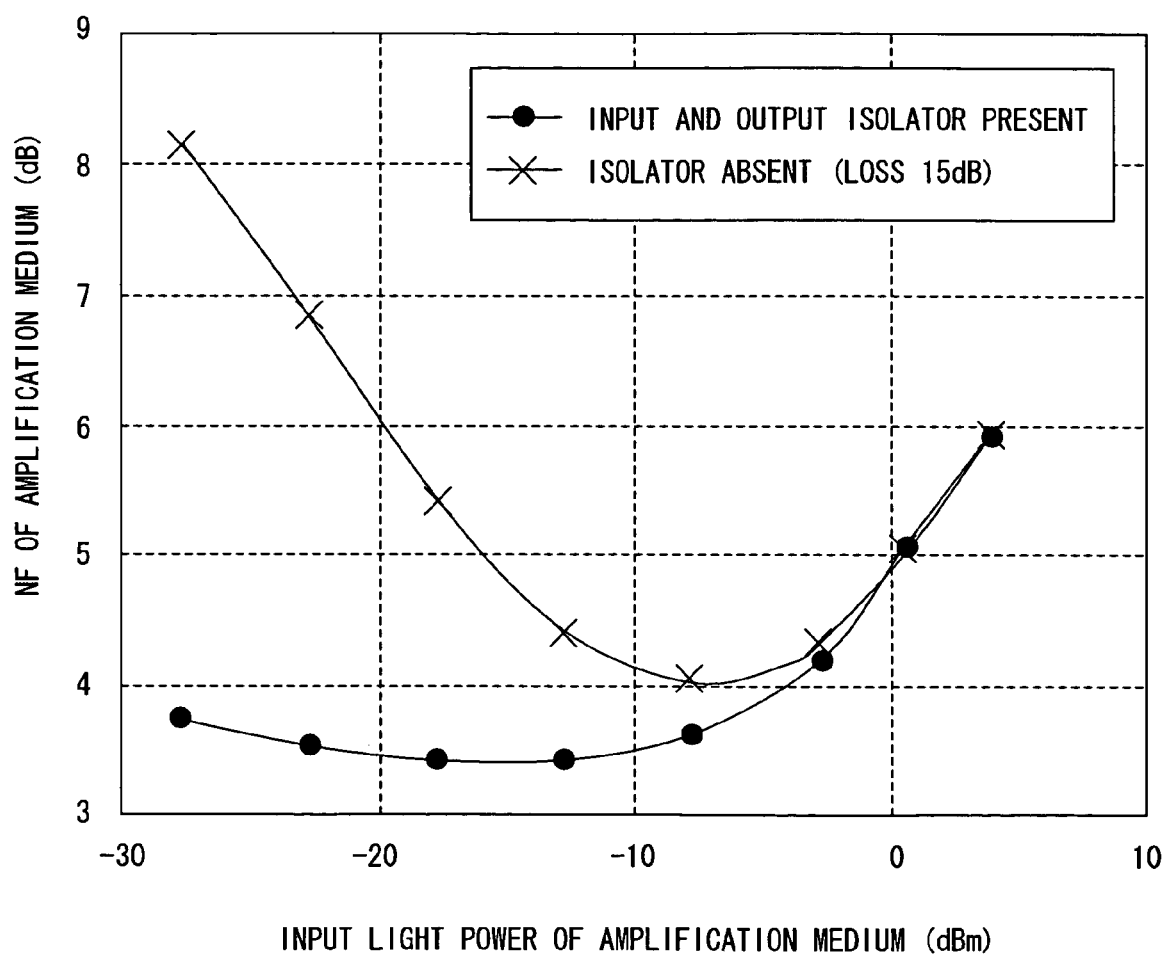
F I G. 6

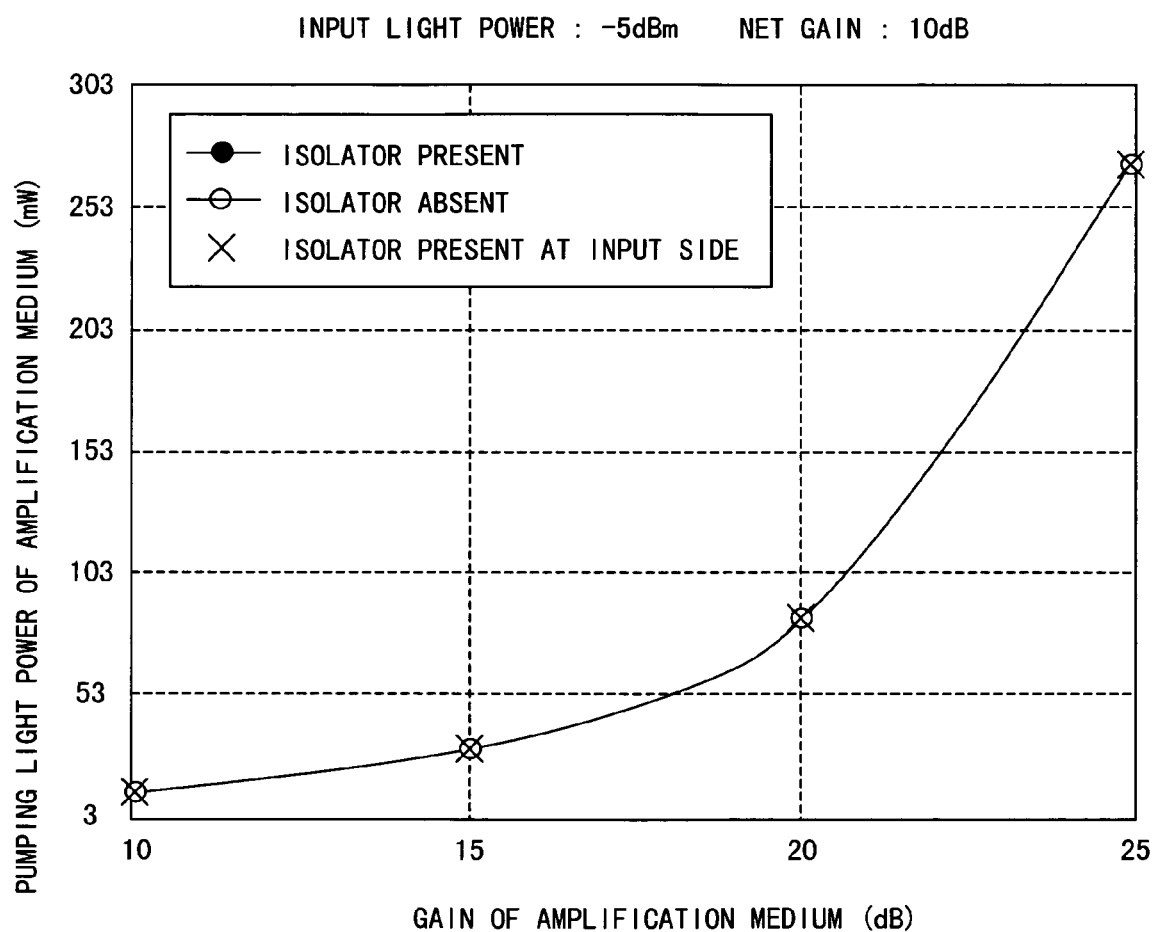
F I G. 8

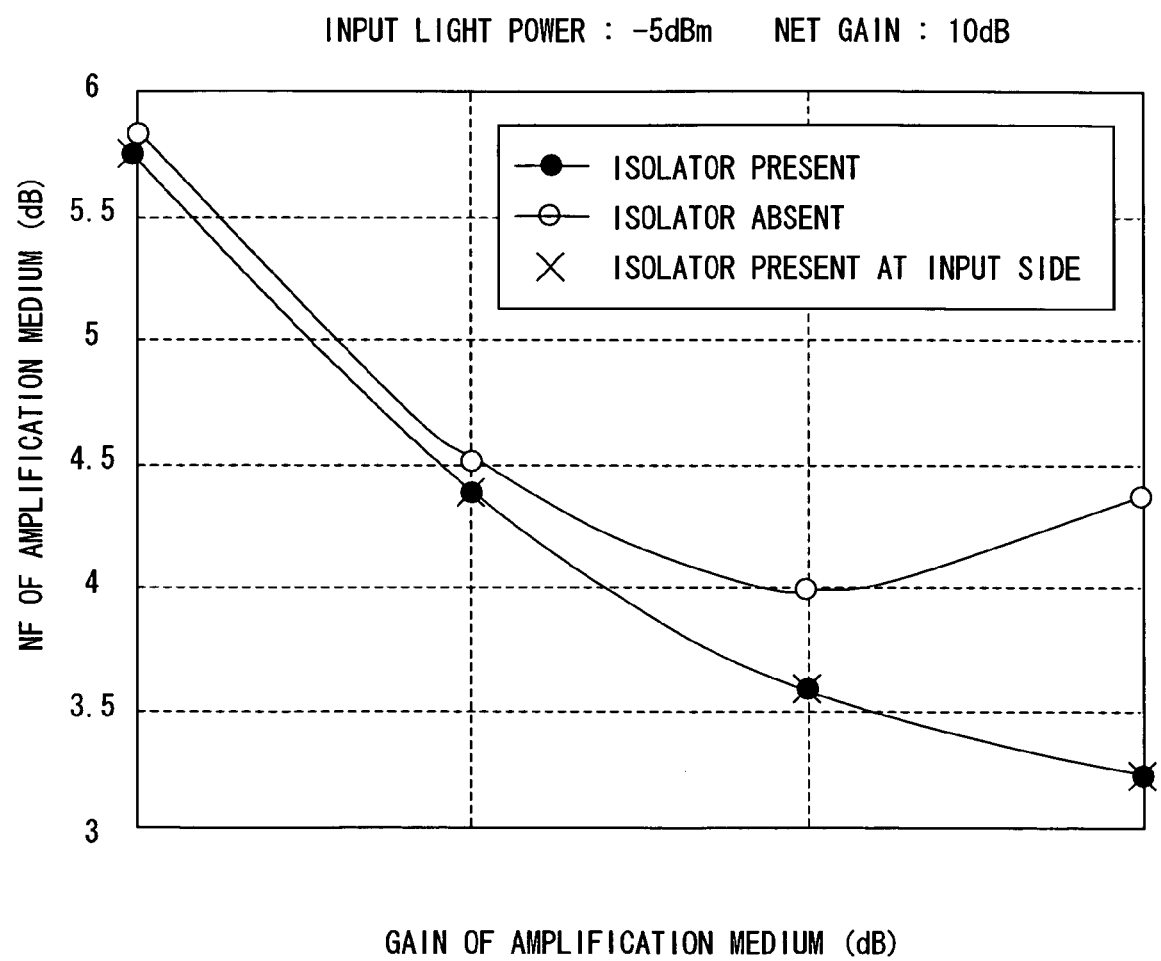
F I G. 9

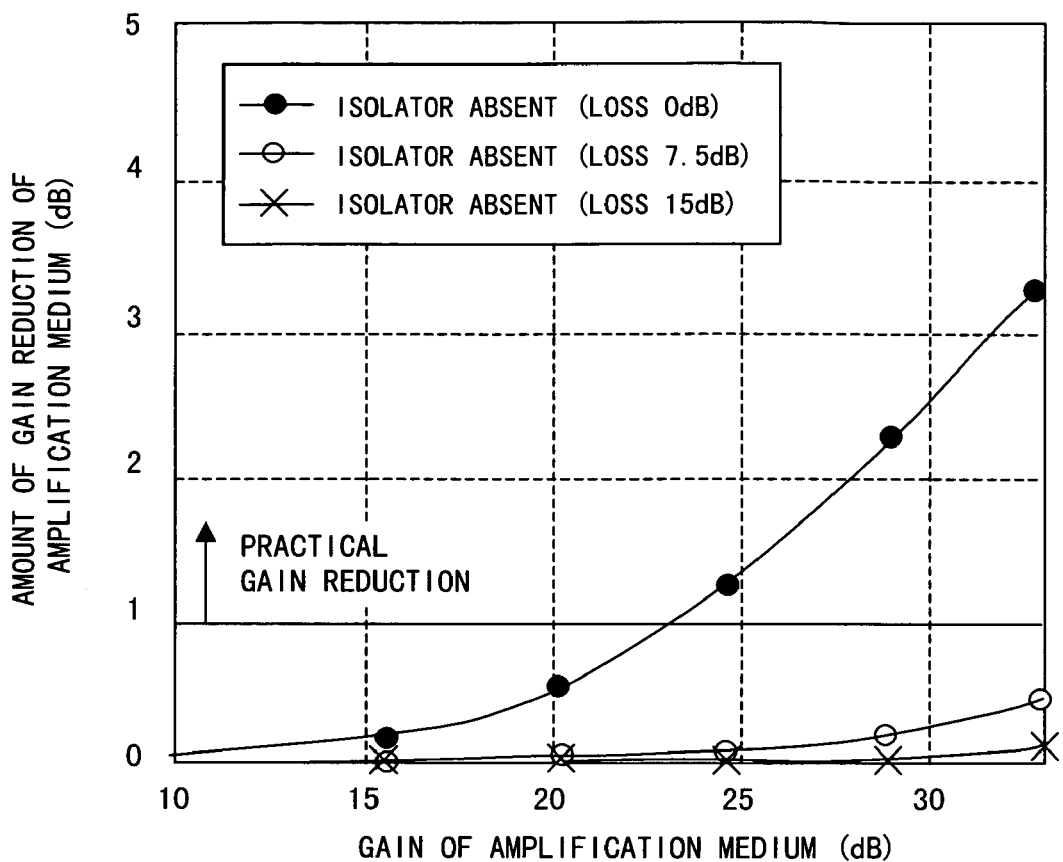
F I G. 1 1 A
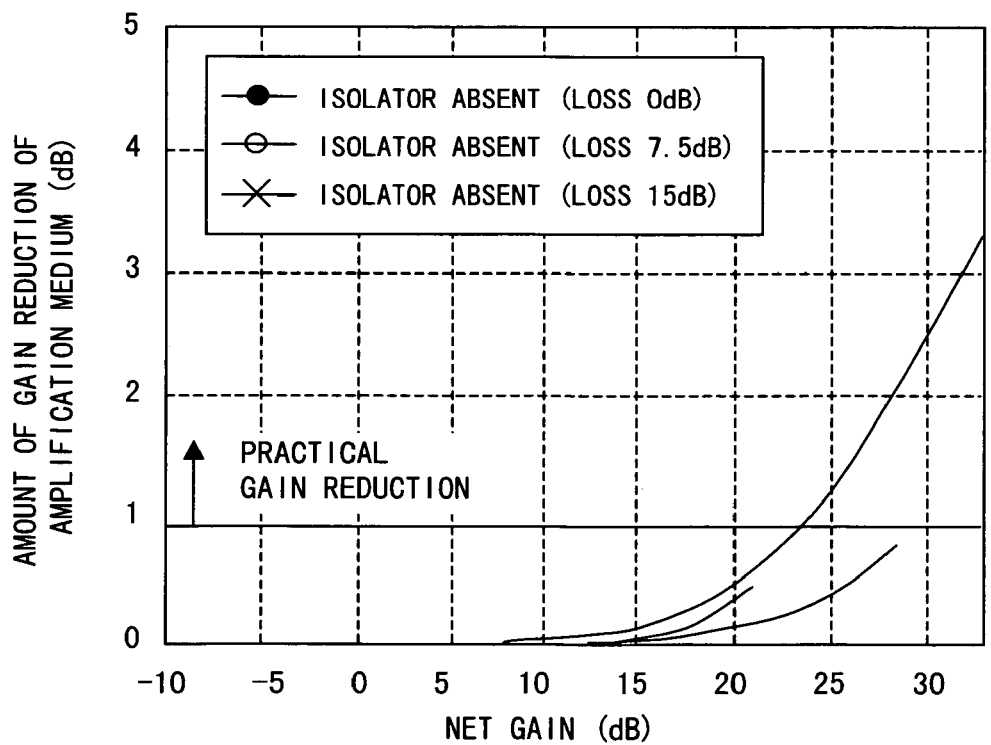
F I G. 1 1 B

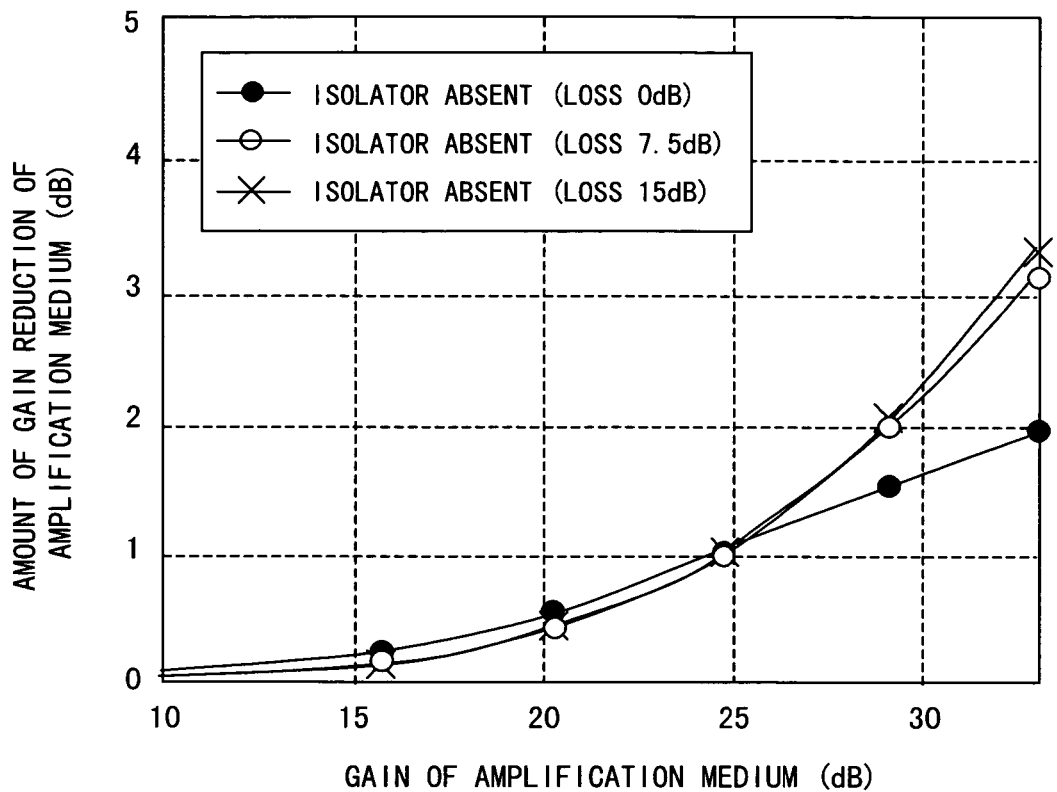
F I G. 1 2 A
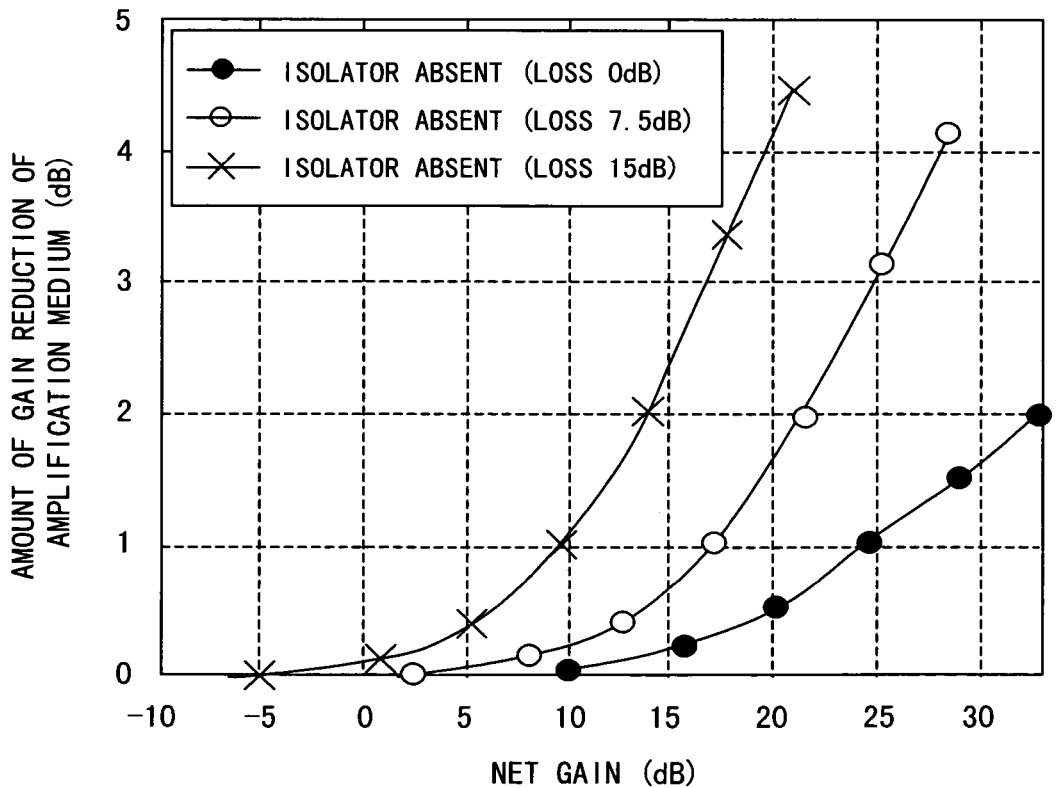
F I G. 1 2 B

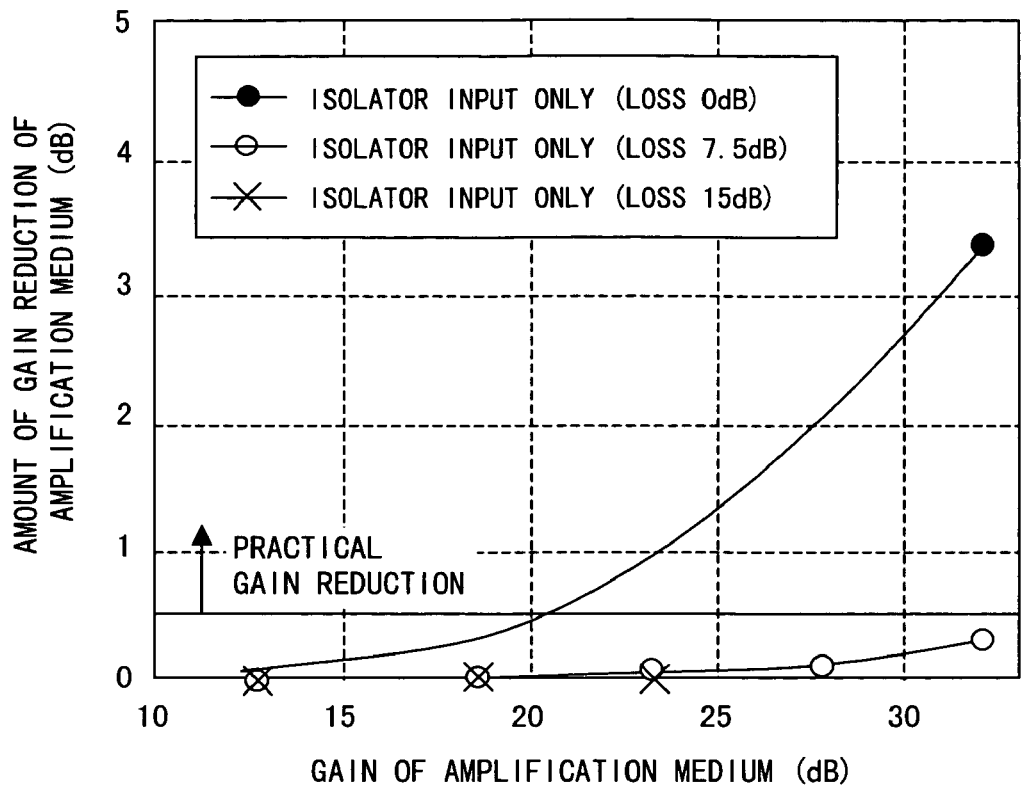
F I G. 1 4 A
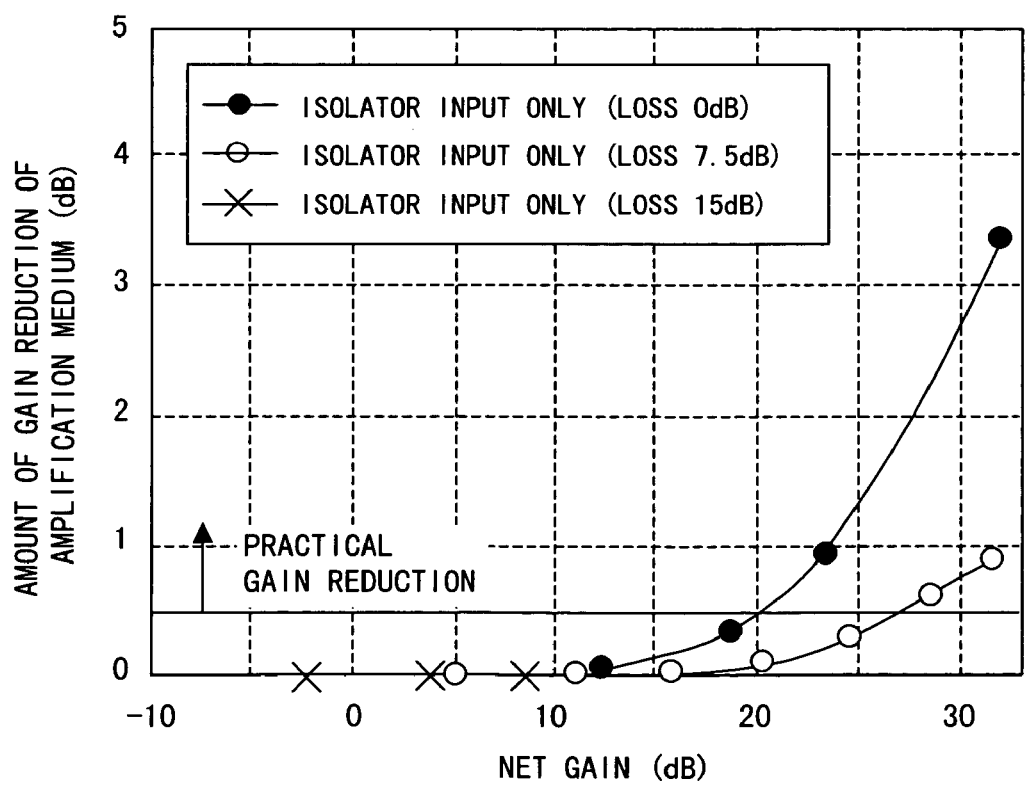
F I G. 1 4 B

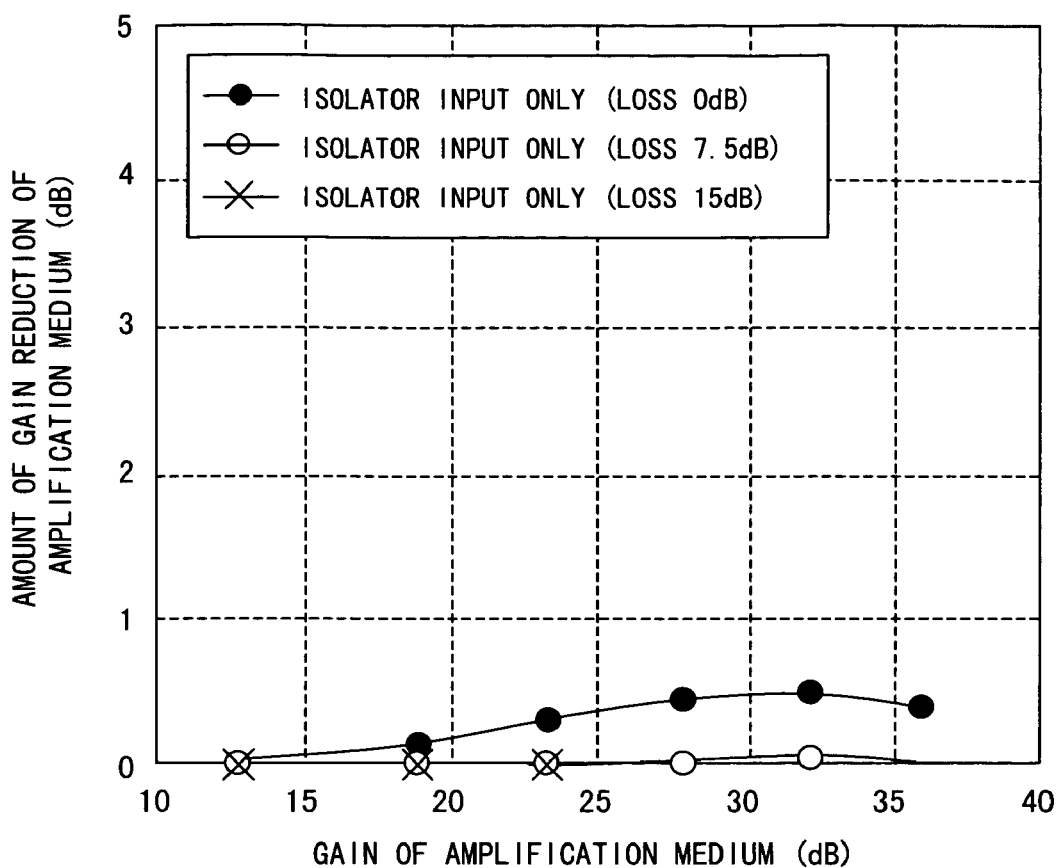
F I G. 1 5 A
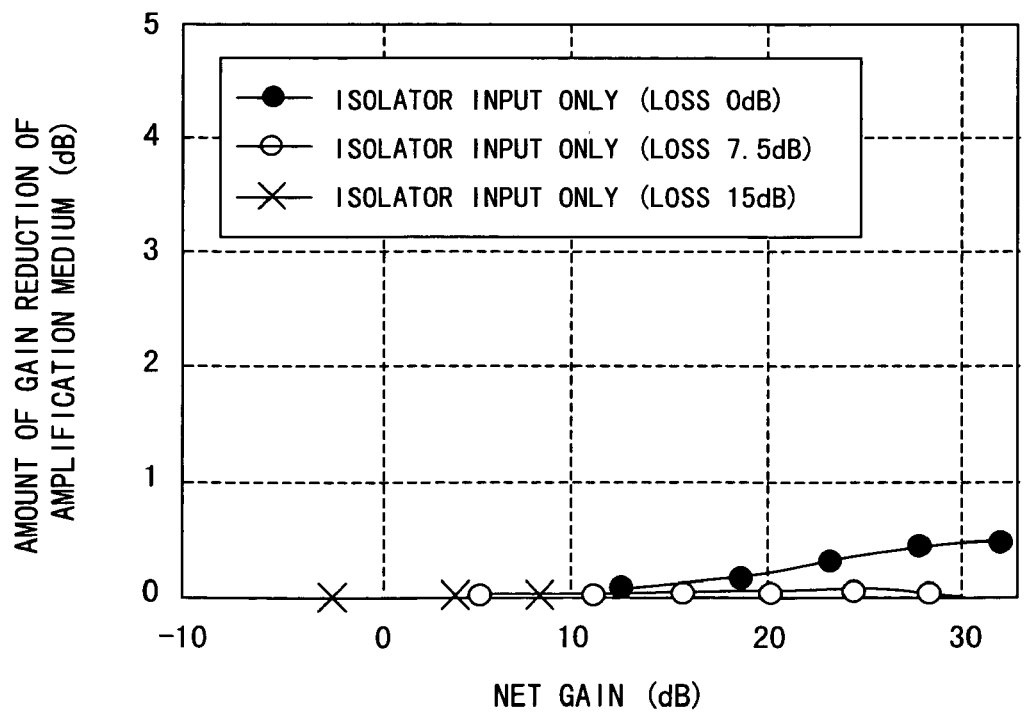
F I G. 1 5 B

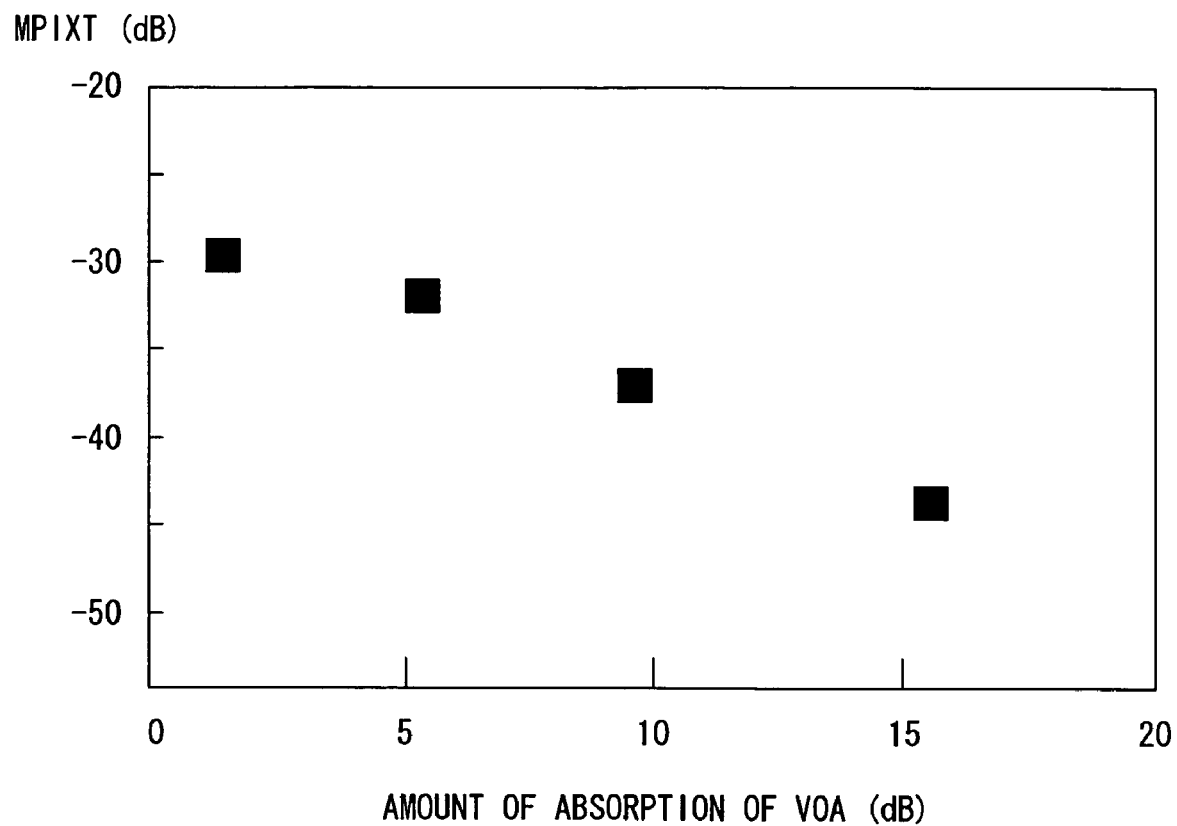
F I G. 17

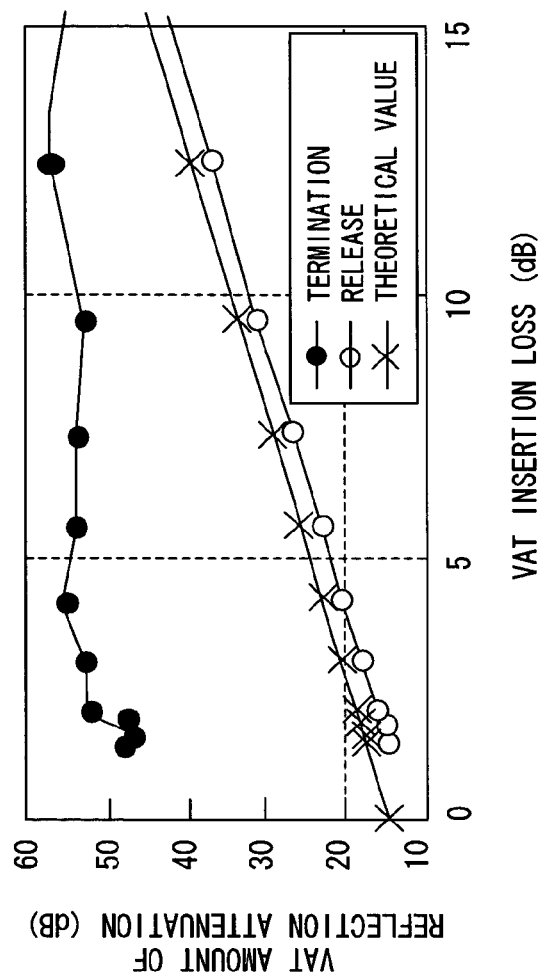
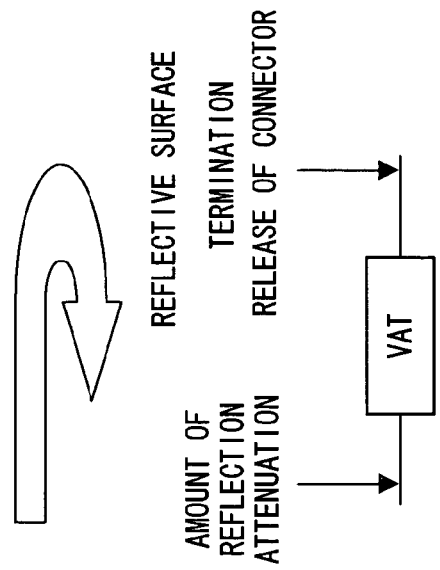
F I G. 19

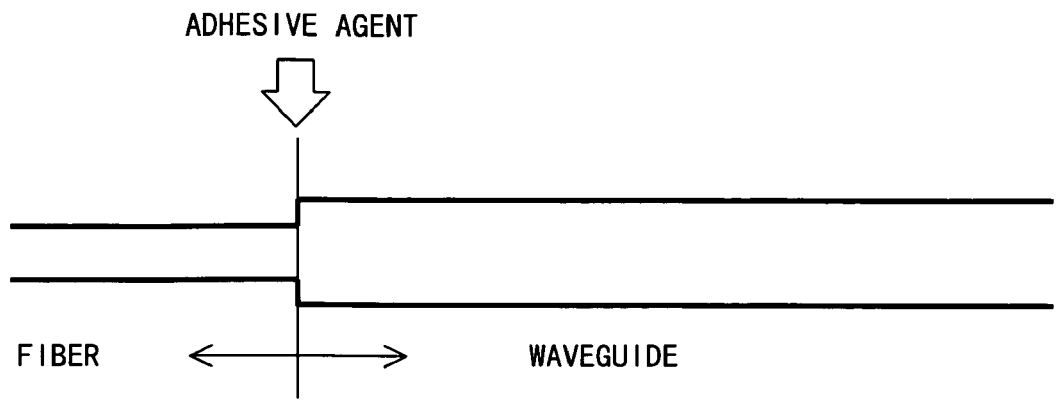
F I G. 2 7 A
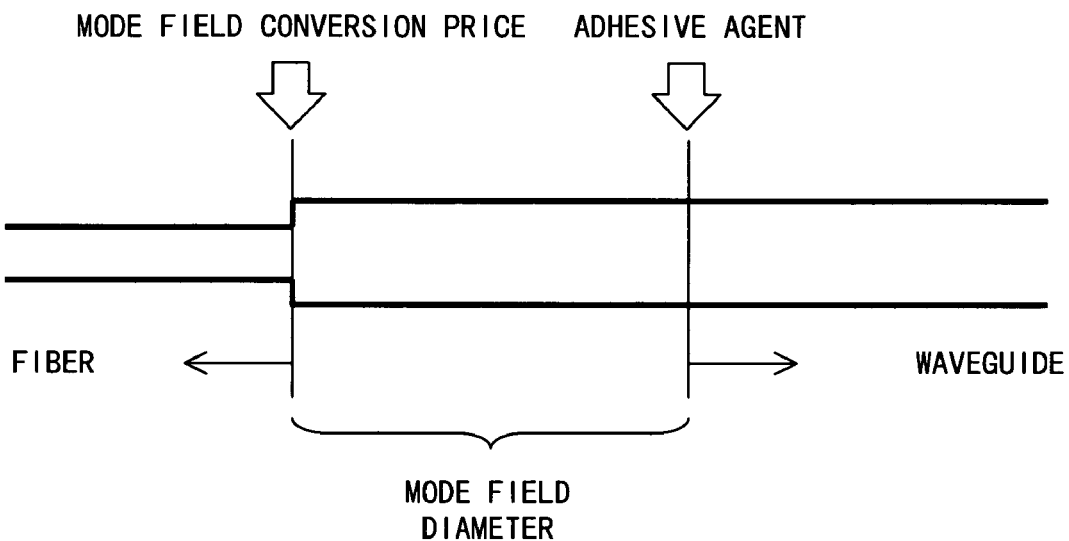
F I G. 2 7 B
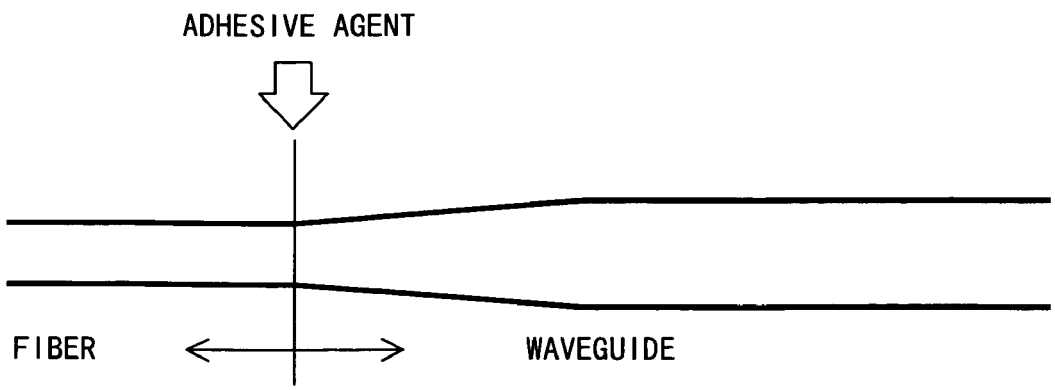
F I G. 2 7 C

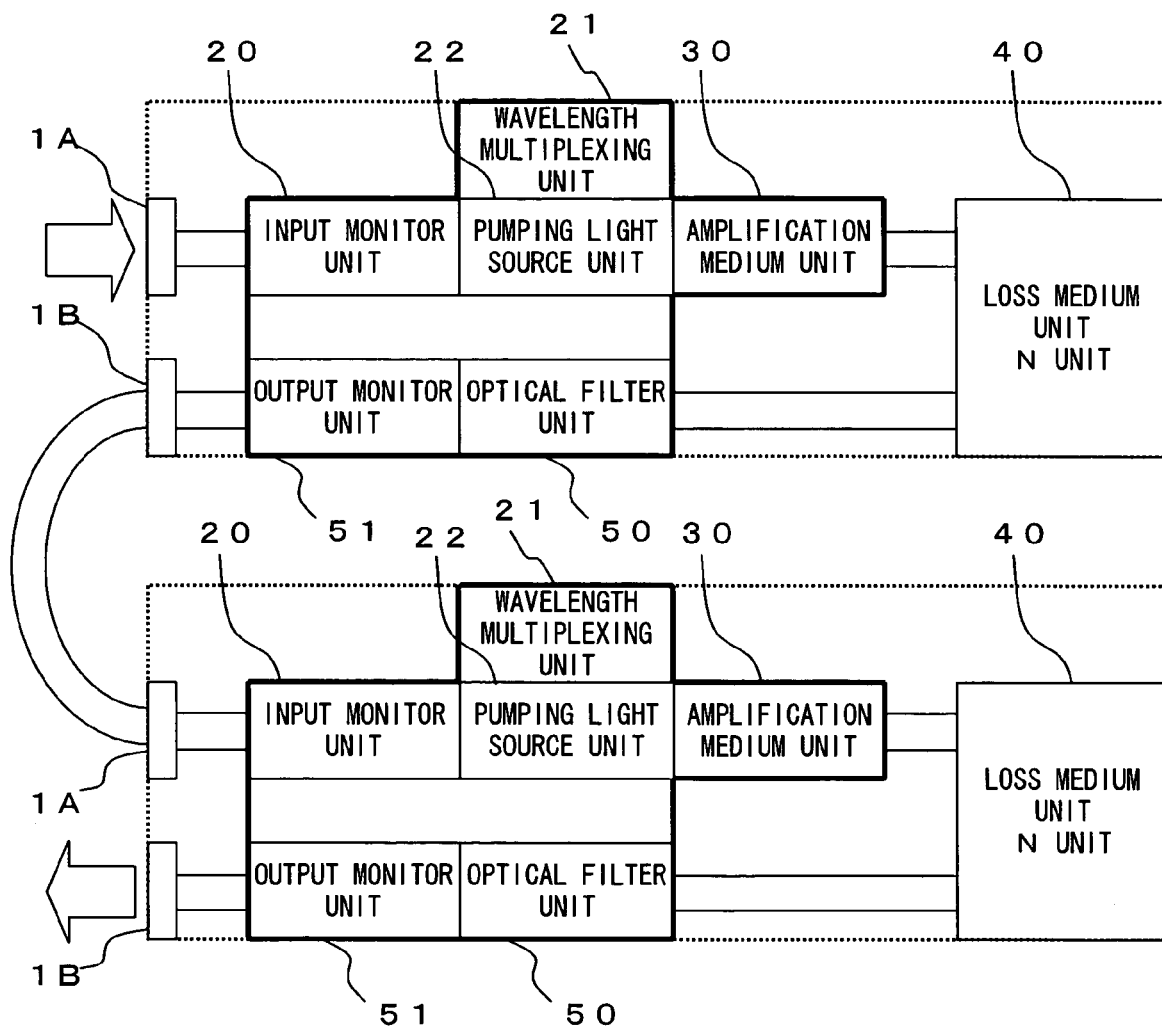
F I G. 30

OPTICAL FILTER

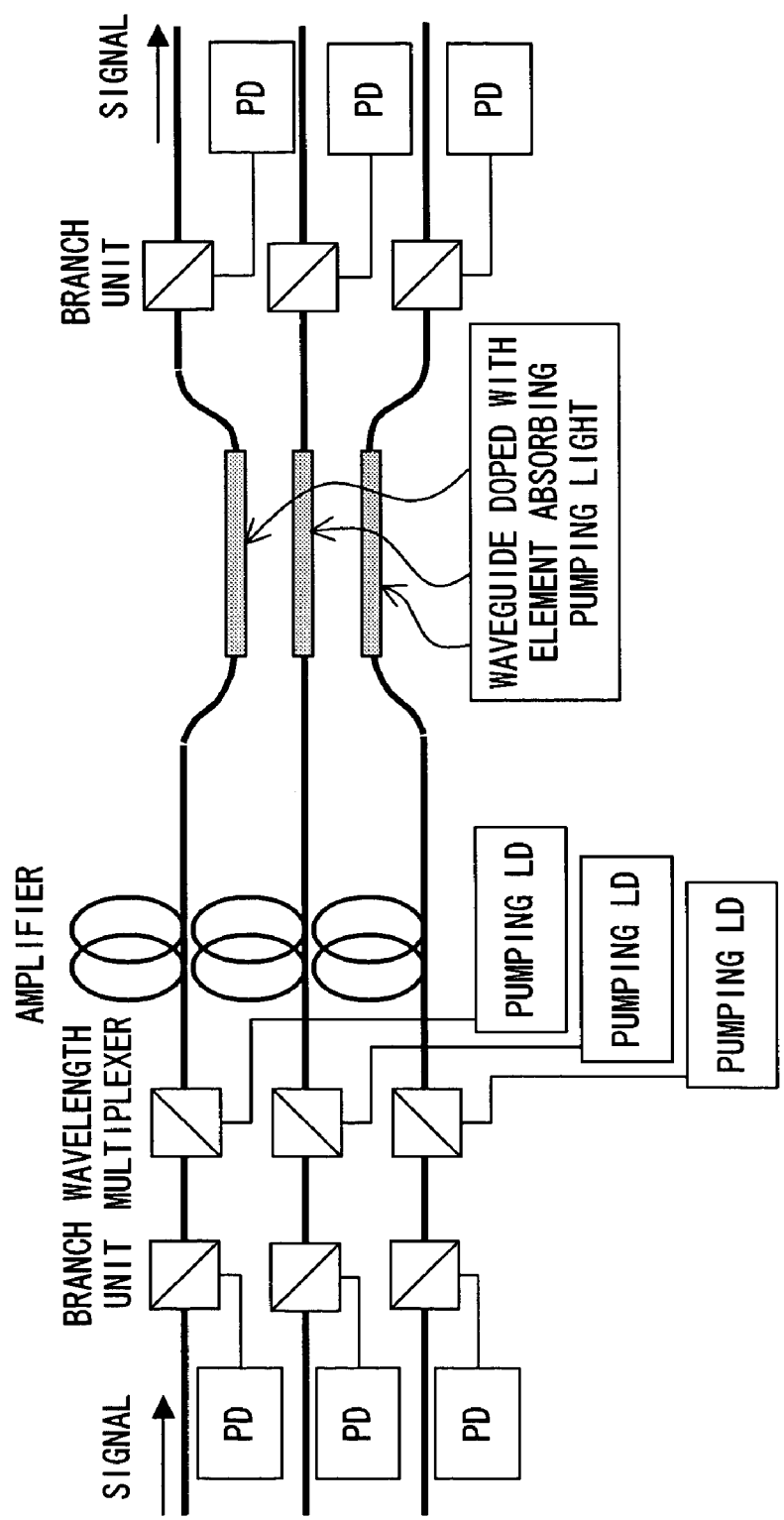
F I G. 37

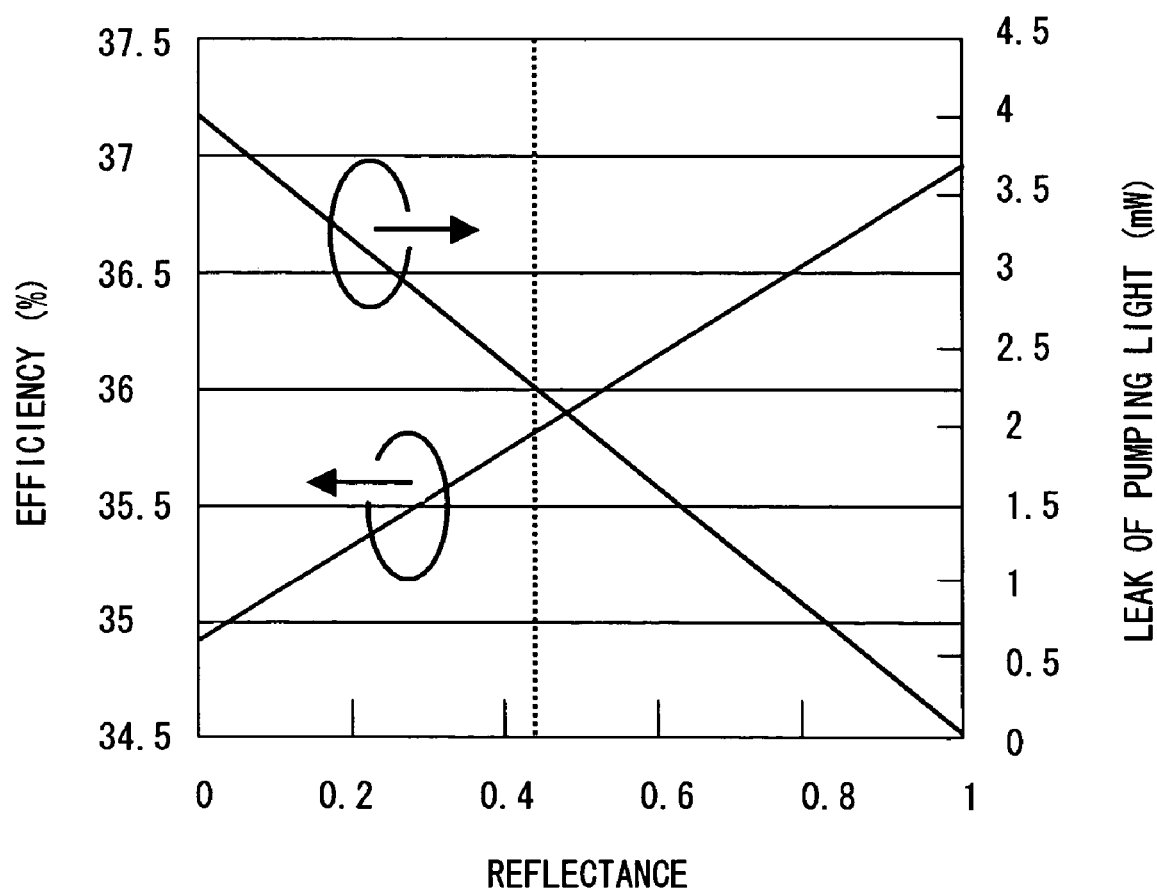
F I G. 45

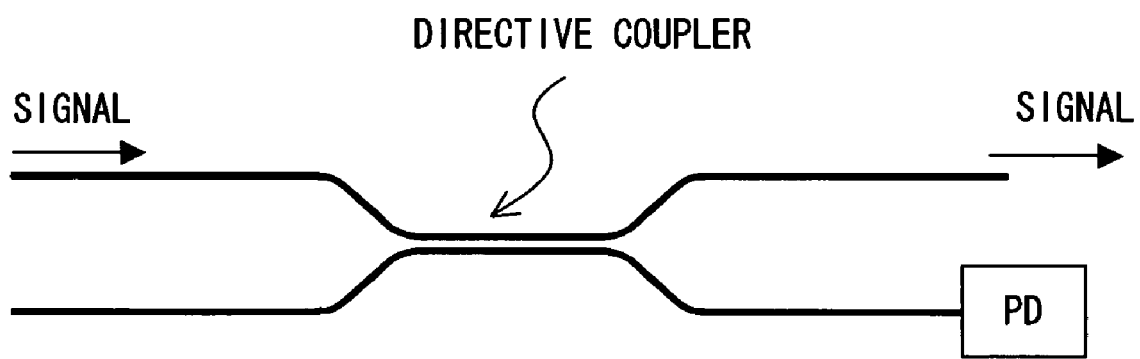
F I G. 4 8

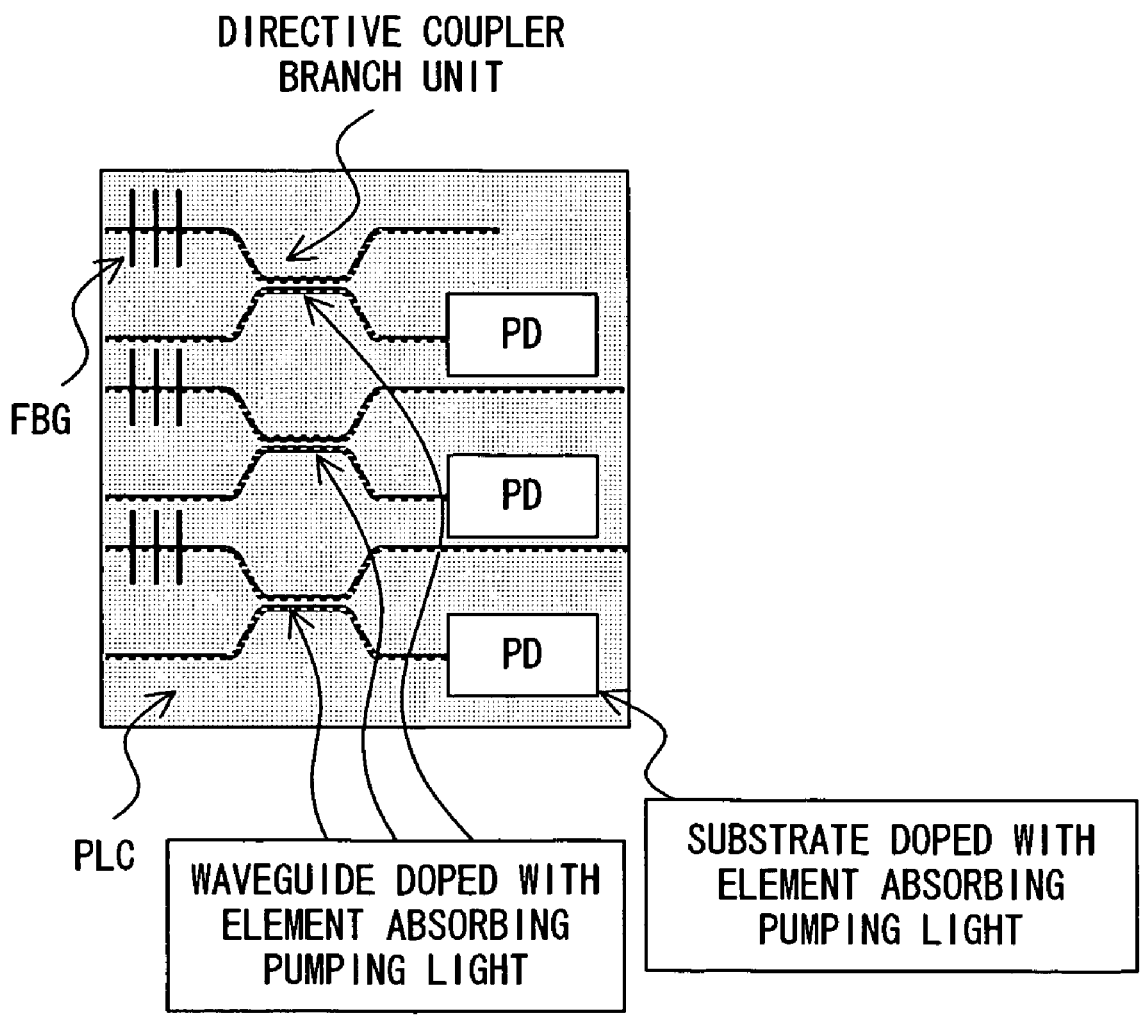
F I G. 53

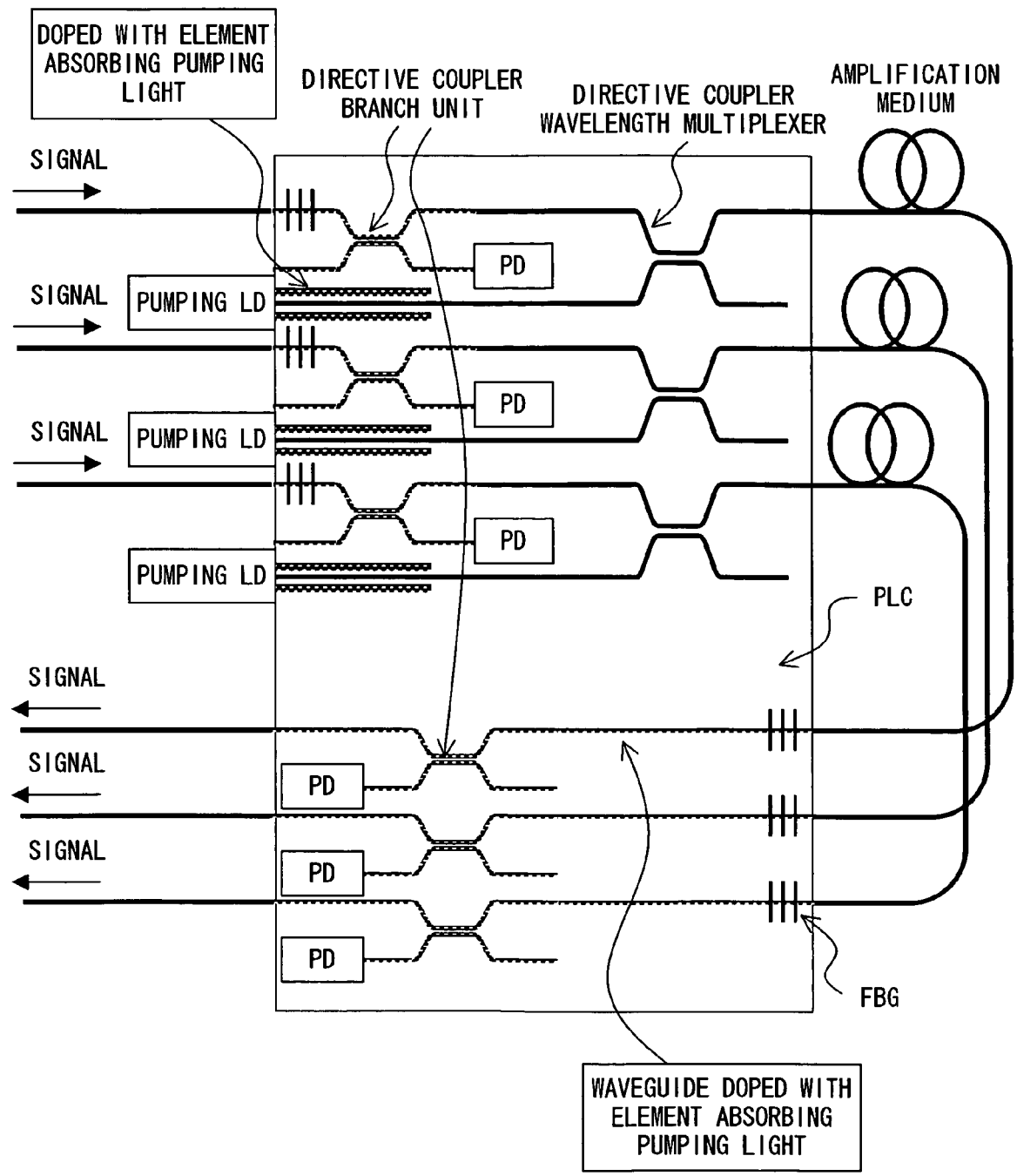
F I G. 5 9

OPTICAL APPARATUS WITH LOSS COMPENSATION CAPABILITY AND OPTICAL AMPLIFIER FOR LOSS COMPENSATION

CROSS REFERENCE TO RELATED APPLICATION

This application is a continuation of an International application No. PCT/JP03/03106, which was filed on Mar. 14, 2003.

BACKGROUND OF THE INVENTION

1. Field of the Invention

The present invention relates to an optical apparatus and an optical amplifier for use with an optical communications system, and more specifically to an optical apparatus provided with an optical amplification capability for compensation for a loss in a loss medium and a preferred optical amplifier for loss compensation.

2. Description of the Related Art

An optical amplifier is one of key components for realizing a long-distance and large-capacity optical communications system. Generally, an optical amplifier can be either a laser amplifier using stimulated emission from a population inversion medium or an amplifier based on a nonlinear optical effect such as Raman scattering, Brillouin scattering, etc. A laser amplifier can be an optical fiber amplifier using a rare earth element doped fiber or a semiconductor laser amplifier using a semiconductor optical amplification medium. The former is operated as an optical amplifier by optical pumping and the latter is operated as an optical amplifier by injected current pumping. In these optical amplifiers, a rare earth element doped fiber amplifier has a large merit in performance for a high gain, low noise, a broad band, a low coupling loss, low polarization dependency, high efficiency. In rare earth element doped fiber amplifiers, an erbium doped fiber optical amplifier (hereinafter referred to as an EDFA) is commonly used, and is practically used in the optical fiber communications system.

FIG. 1 shows an example of a configuration of an optical circuit of a common EDFA.

As shown in FIG. 1, basic parts of a common semiconductor optical amplification medium includes an erbium doped fiber (hereinafter referred to as an EDF) 100, a pumping light source 101, a wavelength multiplexer 102, a branch unit 103, an optical receiver 104, an optical filter 105 for cutting off noise light other than signal light, and an isolator 106 having the characteristic of passing light in only one direction.

The types of various devices forming an optical amplifier can be a fiber type, a discrete type (spatial coupling type), a waveguide type (PLC (planer lightwave circuit) type), etc. A fiber type device is featured by a low loss in coupling with fiber. However, since devices are coupled commonly by fusion splicing, size adjusting process is to be performed. Although a discrete type device can be downsized, it has a larger coupling loss with fiber than a fiber type device, and requires high spatial coupling precision. Therefore, it is not appropriate for integration when a large number of configuration parts are used. A waveguide type device can be easily integrated, and can be more easily downsized than a discrete type device. However, it has problems in characteristic such as a coupling loss with fiber, a polarization dependent loss (hereinafter referred to as a PDL), crosstalk, etc. The type of each of various devices and their configuring methods are selected from the characteristics, the cost, and the size of the entire optical amplifier. For example, the optical amplifier as shown in FIG. 1 is configured by performing fusion splicing on each component moduled with the fiber connected to an input port and an output port.

When the above-mentioned optical amplifier is downsized, for example, in the patent literature 1, the optical parts are configured as a waveguide type (PLC type) devices, and are collectively stored. In the patent literature 2, the optical parts other than the EDF are collectively stored by configuring a backpumping optical amplifier. Furthermore, an optical amplifier using a waveguide type optical amplification medium has been reported. The waveguide type optical amplification medium is inferior to the EDF in gain and noise figure (hereinafter referred to as an NF), efficiency, etc., but can be 10 cm in length, which is shorter than a fiber type amplification medium which is normally 10 cm long.

As described above, most of the conventional optical amplifiers are downsized for a single one-input-to-one-output optical amplifier, and there are few reports about downsizing into a plural-input-to-plural-output optical amplifier by integrating a number of optical amplifiers into one system because it seems that the system is a point-to-point system in a trunk type long-distance and large-capacity optical communications system for an optical amplifier of a conventional applicable area, and the number of available optical amplifiers is relatively small.

However, as the Internet has become widespread recently, the demand for communications traffic has exploded. To support the demand, the wavelength division multiplexing (hereinafter referred to as WDM) transmitting technology for communications by superposing a wave-multiplexed optical signal on an optical fiber has been in the limelight. Mainly a point-to-point system for connection of two points has been put to practical use, and the demand for further enlargement of the wavelength range has been issued. With the DWSM system introduced, a number of optical amplifiers for at least signal wavelengths are required for an optical amplifier for one wave in a transmitter/receiver, and correspondingly the optical amplifier is more earnestly requested to be downsized at a lower cost.

As an optical wave network system, etc., the construction of a more flexible and economical transport network is requested beyond the range of a long-distance and large-capacity trunk type system. For example, a photonic system for performing flexible optical routing such as an optical add/drop multiplexer (hereinafter referred to as an OADM) for branching or inserting a fixed wavelength during a transmitting node, an optical cross-connect (hereinafter referred to as an OXC) for switching a path, and performing editing and fault recovering processes, etc. is required. The optical network system necessarily uses a number of optical parts such as an optical switch, a variable attenuator, an OADM, etc. When optical parts are used, a number of optical amplifiers for loss compensation for various optical parts are required. Practically, several hundred levels of optical amplifiers are expected in on OXC device. These systems are expected to be led to the vicinity of a metropolis, and further to an office or home, thereby further enhancing the demand for a small optical amplifier.

In a higher-speed optical communications system such as a 40 Gb/s system, etc. a dispersion compensator, a polarization mode dispersion (hereinafter referred to as a PMD) compensator, etc. are required. Especially, a PMD compensator is to be provided for each signal channel. In this optical communications system, a number of small optical amplifiers for compensating for a loss generated in the optical parts such as the above-mentioned PMD compensator are required.

As for the optical amplifier for loss compensation for various optical parts, for example, an optical element without a loss, etc. disclosed by National Publication of International Patent Application No. 02334 is well known. It provides an optical element without a loss by providing a single optical amplifier in the remote pumping method on the input side of a single optical element, and incorporating the single optical amplifier into the single optical element. However, since this well-known technology does not provide a practical configuration appropriate for incorporating an optical amplifier to be downsized into a loss medium, it does not satisfy the request to a small optical amplifier for loss compensation as described above.

As for the request to downsize an optical amplifier, a plurality of optical amplifiers can be incorporated into one device so as to downsize each unit of optical amplifier (for example, EDWA Array™, etc. of Teem Photonics, etc.). The optical amplifier practically uses an erbium doped waveguide (hereinafter referred to as an EDW) as an amplification medium to downsize the entire system by incorporating a plurality of optical amplifiers in parallel. However, a pumping light source and an isolator are external devices. Nevertheless, the above-mentioned optical amplifier aims at only downsizing each optical amplifier basically by integration, but a practical configuration of an optical amplifier appropriate for integration with a loss medium is not realized. Therefore, the request for a small optical amplifier for loss compensation is not completely satisfied.

Patent Literature 1

Japanese Patent Application Laid-open No. Hei 10-107350

Patent Literature 2

Japanese Patent Application Laid-open No. Hei 3-296025

DISCLOSURE OF INVENTION

The present invention has been developed with the above-mentioned viewpoints taken into account, and aims at providing a technology for realizing an optical amplifier capable of obtaining a gain enough to compensating for a loss of various optical parts unlike the conventional optical amplifier in pursuit of high performance such as a high gain, a low NF (noise figure), etc., and obtaining a small and low-cost amplifier.

To attain the above-mentioned purpose, the optical apparatus having the loss compensation capability according to the present invention is provided with an optical amplifier for compensating a loss generated in a loss medium, and includes: an optical amplification unit provided between an input terminal and an output terminal; an input side monitor unit for monitoring the power of the light transmitted to the optical amplification unit; an output side monitor unit for monitoring the power of the light transmitted from the optical amplification unit to the output terminal; and a gain control unit for controlling the gain in the optical amplification unit based on each monitor result of the input side monitor unit and the output side monitor unit. The loss medium is connected to the optical path between the output end of the optical amplification unit and the input end of the output side monitor unit. The configuration is determined such that the amount of reflection attenuation on all points, on which the light can be reflected on the optical path from the output end of the optical amplification unit to the output terminal, can be smaller than the amount of reflection attenuation on the end face of the output terminal. Additionally, the gain control unit controls the operation of the optical amplification unit such that a gain at least equal to a loss generated in the loss medium can be obtained.

With the above-mentioned configuration, the connection position of the loss medium to the optical amplifier for performing loss compensation is prescribed, and the amount of reflection attenuation of the light at the connection point, etc. of the output side from the optical amplification unit is made smaller than the amount of reflection attenuation at the output terminal. As a result, at least the isolator at the output side between the isolators conventionally provided at the input side and the output side of the amplification medium can be omitted. Therefore, the apparatus can be smaller and realized at a lower cost. By increasing the loss of the loss medium, the reflected light on the output side of the optical amplification unit can be effectively reduced, thereby more widely setting the gain range in which no oscillation phenomenon occurs. Furthermore, by controlling the operation of the optical amplification unit based on the monitor result of the input light and the output light, the gain of the optical amplifier can be automatically adjusted although the amount of loss of the loss medium changes. As a result, the loss compensation of various optical parts having different amounts of loss can be realized by a small and low-cost optical amplifier.

As for the above-mentioned optical apparatus, an isolator for cutting off the light propagating from the optical amplification unit to the input side monitor unit can be provided on the optical path between the output end of the input side monitor unit and the input end of the optical amplification unit.

Thus, by providing an isolator on the input side of the optical amplification unit, the noise light generated by the optical amplifier is prevented from being reflected by the input terminal and returned to the optical amplification unit. Therefore, although a high gain is set, the reduction of the noise characteristic of the optical amplifier can be suppressed.

In addition, the above-mentioned optical apparatus can be provided with a plurality of optical amplifiers corresponding to a plurality of loss media, and at least two of the plurality of optical amplifiers can be incorporated in parallel. Thus, the entire optical apparatus can be smaller at a lower cost.

Additionally, the above-mentioned optical apparatus can be provided with a plurality of optical amplifiers corresponding to a plurality of loss media, and at least two of the plurality of optical amplifiers can be incorporated in series. Thus, the gain of the entire apparatus can be improved, and the amount of loss to be compensated for in the entire apparatus can be distributed to each optical amplifier, thereby realizing a lower NF or higher efficiency for each optical amplifier.

The optical amplifier for loss compensation according to the present invention includes: an optical amplification unit provided between an input terminal and an output terminal; an input side monitor unit for monitoring the power of the light transmitted to the optical amplification unit; an output side monitor unit for monitoring the power of the light transmitted from the optical amplification unit to the output terminal; and a gain control unit for controlling the gain in the optical amplification unit based on each monitor result of the input side monitor unit and the output side monitor unit. A pair of loss medium connection points for connection of a loss medium are provided on the optical path between the output end of the optical amplification unit and the input end of the output side monitor unit. The configuration is determined such that the amount of reflection attenuation on all points, on which the light can be reflected on the optical path from the output end of the optical amplification unit to the output terminal, can be smaller than the amount of reflection attenuation on the end face of the output terminal. The gain control unit controls the operation of the optical amplification unit such that a gain at least equal to a loss generated in the loss medium connected to the loss medium connection points can be obtained. With the above-mentioned configuration, an optical amplifier for loss compensation is realized as a smaller and lower-cost device.

BRIEF DESCRIPTION OF THE DRAWINGS

FIG. 6 shows a result of computing an NF relating to the check model shown in FIG. 4;

FIG. 8 shows a result of calculating the pumping light power for the gain in the amplification medium about the check model shown in FIG. 7;

FIG. 9 shows a result of calculating the NF for the gain in the amplification medium about the check model shown in FIG. 7;

FIG. 11 is an explanatory view of the operation effect according to the first embodiment of the present invention in which (A) shows the amount of gain reduction for the gain in the amplification medium, and (B) shows the amount of gain reduction for the net gain;

FIG. 12 is an explanatory view of the operation effect according to the first embodiment of the present invention in which (A) shows the amount of NF reduction for the gain in the amplification medium, and (B) shows the amount of NF reduction for the net gain;

FIG. 14 is an explanatory view of the operation effect according to the second embodiment of the present invention in which (A) shows the amount of gain reduction for the gain in the amplification medium, and (B) shows the amount of gain reduction for the net gain;

FIG. 15 is an explanatory view of the operation effect according to the second embodiment of the present invention in which (A) shows the amount of NF reduction for the gain in the amplification medium, and (B) shows the amount of NF reduction for the net gain;

FIG. 17 is an explanatory view (2) of the experiment showing the effect of an embodiment of the present invention;

FIG. 19 is an explanatory view (4) of the experiment showing the effect of an embodiment of the present invention;

FIG. 27 is an explanatory view showing the method of connecting an optical path having a different mode field diameter;

FIG. 30 shows the outline of the configuration of the fifth embodiment of the optical apparatus having the loss compensation capability according to the present invention;

FIG. 37 shows the configuration of an arrayed optical amplifier in which al element absorbing the pumping light is doped in place of an optical filter;

FIG. 45 is a graph showing the computed leakage light of pumping light with the reflection of a part of pumping light by the efficiency of the FBG on the reflectance and the FBG taken into account;

FIG. 48 shows the configuration using a branch unit with a directive coupler using an optical fiber as an optical waveguide;

FIG. 53 shows the configuration according to an embodiment using the sixth means;

FIG. 59 shows the second example of the structure in which an optical amplifier is arrayed.

DESCRIPTION OF THE PREFERRED EMBODIMENTS

First, the definition of the amount of reflection attenuation is explained below.

The amount of reflection attenuation refers to the ratio of the reflected light (which is returned to the same optical axis as the incident light) to the incident light when light enters a medium having a different refractive index, and is defined by the following relational expression.

amount of reflection attenuation (dB)=reflected light power (dBm)−incident light power (dBm)

In this case, a small amount of reflection attenuation indicates that the incident light travels straight in a medium (on the same optical axis as the incident light without reflection in the medium.

The amount of reflection attenuation is, as by the above-mentioned relational expression, correctly expressed as a negative value with a "−" (minus sign) added to the value, but in a catalog, etc. of optical parts, an absolute value is normally expressed. In this case, a large amount of reflection attenuation indicates that the incident light travels straight in a medium (on the same optical axis as the incident light without reflection in the medium.

In this specification, the amount of reflection attenuation is explained using a correct expression value.

The embodiments of the present invention are described below by referring to the attached drawings.

Figure 2:
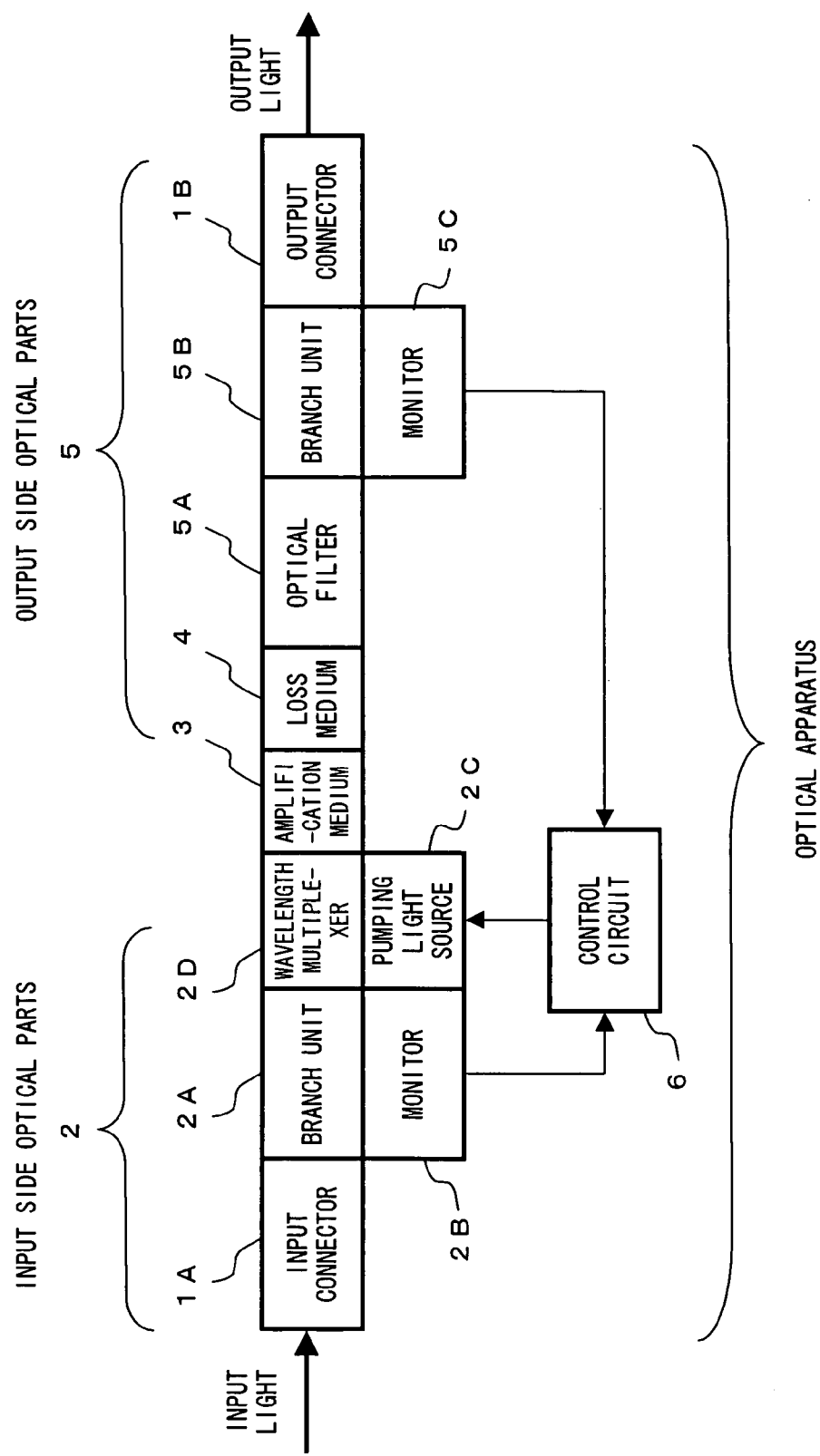
FIG. 2 shows a configuration of the first embodiment of the optical apparatus having the loss compensation capability according to the present invention.

FIG. 2 shows a configuration of the first embodiment of the optical apparatus having the loss compensation capability according to the present invention.

In FIG. 2, the optical apparatus comprises, for example, an input side optical parts 2, an amplification medium 3, a loss medium 4, and an output side optical parts 5 between an input connector 1A as an input terminal and an output connector 1B as an output terminal, and a control circuit 6 as a gain control unit for controlling the gain in the amplification medium 3.

The input side optical parts 2 comprises, for example, an input connector 1A; a branch unit 2A and a monitor 2B as an input side monitor unit for monitoring the power of the light input through the input connector 1A and transmitted to the amplification medium 3; and a pumping light source 2C and a wavelength multiplexer 2D for providing pumping light for the amplification medium 3. The branch unit 2A branches a part of the input light provided for the input connector 1A and transmits it to the monitor 2B. The monitor 2B measures the power of the light branched by the branch unit 2A, and outputs the result to the control circuit 6. The pumping light source 2C generates pumping light having a required wavelength depending on the input light. For the pumping light source 2C, the power of the pumping light generated by controlling the drive status according to the signal output from the control circuit 6. The wavelength multiplexer 2D multiplexes the pumping light output from the pumping light source 2C to the input light passing through the branch unit 2A, and outputs the result to the amplification medium 3.

The amplification medium 3 enters a pumping status by the pumping light generated by the pumping light source 2C being provided through the wavelength multiplexer 2D, and amplifying the input light transmitted from the input connector 1A through the branch unit 2A and the wavelength multiplexer 2D up to a predetermined level, and outputs it. A practical example of the amplification medium 3 can be a rare earth element doped fiber such as an EDF, etc. and a rare earth element doped waveguide such as an EDW, etc. A semiconductor element configuring a semiconductor optical amplifier (hereinafter referred to as an SOA) can be used as the amplification medium 3. In this case, an injected current can be provided in place of the pumping light and provided for a semiconductor element. The amplification medium according to the present invention is not limited to the above-mentioned practical example, but any well known amplification medium capable of amplifying the input light up to a predetermined level can be applied.

The loss medium 4 corresponds to various optical parts used in the optical communications system, and requires the compensation for a loss when they are used. A practical example of the loss medium 4 can be an optical switch, a dispersion compensator, a PMD compensator, an optical attenuator, an arrayed waveguide grating, an OADM, etc. The loss medium according to the present invention is not limited to the above-mentioned practical example, but can be any loss medium which requires loss compensation.

The output side optical parts 5 comprises, for example, an optical filter 5A for cutting off the light other than in a signal band, a branch unit 5B and a monitor 5C as an output side monitor unit for monitoring the power of the light output from the output connector 1B, and the output connector 1B. The optical filter 5A receives the residual pumping light and the light output from the loss medium 4, cuts off the noise light, etc. generated when the amplification medium 3 amplifies light, and passes only necessary light. The branch unit 5B branches a part of the output light output from the optical filter 5A and transmitted to the output connector 1B, and then transmits it to the monitor 5C. The monitor 5C measures the power of the light branched by the branch unit 5B, and outputs the result to the control circuit 6.

The control circuit 6 calculates the gain (net gain) in the entire optical apparatus based on the optical power monitored by the monitor 2B on the input side and the monitor 5C on the output side, and controls the gain in the amplification medium 3 by adjusting the drive state of the pumping light source 2C based on the calculation result.

The feature in the configuration of the optical apparatus resides first in that the loss medium 4 is connected on the optical path between the output end of the amplification medium 3 and the branch unit 5B on the output side, and second in that the method of connecting each component and the amount of reflection attenuation of each component are prescribed such that the amount of reflection attenuation on all points on which light can be reflected on the optical path from the output end of the amplification medium 3 to the output connector 1B can be smaller than the amount of reflection attenuation on the end face of the output connector 1B.

As for the second feature, since a connector connection, fusion splicing, etc. are adopted as a connecting method among the loss medium 4, the optical filter 5A, and the branch unit 5B arranged on the optical path from the output end of the amplification medium 3 to the output connector 1B, the connector used at the connection point and the splicing method are selected such that the amount of reflection attenuation at the connection points can be smaller than the amount of reflection attenuation at the output connector 1B. The following table 1 shows an example of the amount of reflection attenuation corresponding to the commonly known connecting method.

TABLE 1

| Connecting Method | Amount of Reflection attenuation |
| --- | --- |
| Fusion Splicing | <−70 dB |
| crossly ground connector (APC) | <−60 dB |
| Advanced Spherically Ground Connector (AdPC) | <−40 dB (random connection) |
| Super Crossly Ground Connector (SPC) | <−40 dB |
| Spherical Connector (PC) | <−25 dB |

However, in this example, the amount of reflection attenuation is a standard value of the NTT for a connector, and a common value for a splice. Practically, for example, when a spherically ground connector is used as the output connector 1B, each connector of the super spherically ground connector whose spherically ground connector is smaller than −25 dB is used for each connection point or each component such as a loss medium, etc. is connected through fusion splicing. Additionally, for example, when an advanced spherically ground connector is used as the output connector 1B, each component is connected through a crossly ground connector or a fusion splice. An applicable connecting method in the present invention is not limited to the example shown in Table 1, but a well-known connecting method can be applied.

Furthermore, to effectively obtain the operation effect of the present embodiment described later, it is necessary that not only the amount of reflection attenuation at the above-mentioned connection point, but also each amount of reflection attenuation of the loss medium 4 and the output side optical parts 5 is to be smaller than the amount of reflection attenuation of the output connector 1B. Each device used as the loss medium 4 and the output side optical parts 5 has normally a amount of reflection attenuation sufficiently smaller than the amount of reflection attenuation of the connector normally used in the optical communications system as shown in the lower rows in Table 1. Therefore, the device can be appropriately selected depending on the type of the output connector.

Described below is the operation effect of the optical apparatus according to the first embodiment of the present invention.

Figure 1:
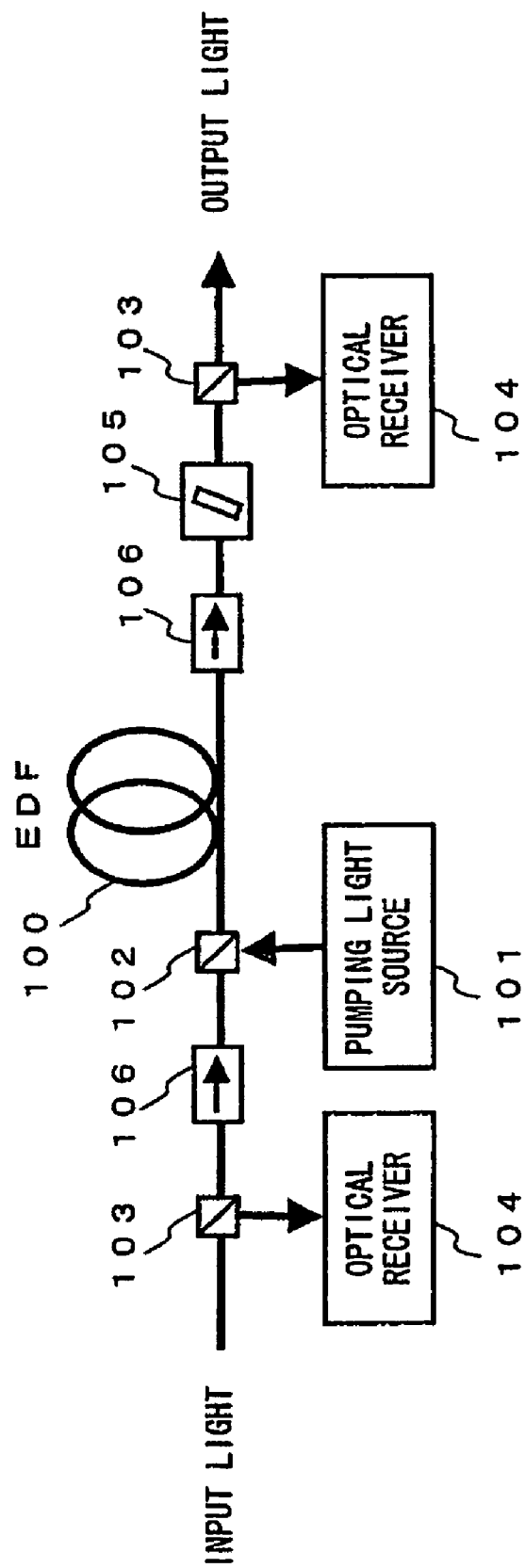
FIG. 1 shows an example of the configuration of an optical circuit of a common EDFA.

In the conventional optical amplifier in pursuit of a high gain as shown in FIG. 1, it is necessary to provide an isolator on the input side and the output side of an amplification medium such as an EDF, etc., which is a restriction in downsizing an optical amplifier. However, in the optical apparatus according to the first embodiment, it is not necessary to require each isolator on the input side and the output side, and a stable optical amplification is realized for loss compensation. Described below in detail is the reason for it.

Generally, there occurs a phenomenon called oscillation in an amplification medium (optical amplifier) when its gain and a value of the reflected light on the input side and the output side exceed a predetermined value, thereby having undesired influence such as reducing the gain of the transmission light and the NF, the fluctuation of an output level in time, etc. The condition of the occurrence of the above-mentioned oscillation can be represented by the relationship expressed by the following equation (1) where the gain in the amplification medium is G, the reflectance on the input side of an amplification medium is R1, and the reflectance on the output side of the amplification medium is R2.

$$G \cdot (R1 \cdot R2)^{1/2} > 1 \tag{1}$$

As clearly indicated in the equation (1) above, it is necessary to reduce the values of R1 and R2 to suppress the oscillation and realize high gain. To attain this, the conventional optical amplifier in pursuit of a high gain reduces the feedback of reflected light to an amplification medium by providing the isolators having the characteristic of passing light only in one direction on the input side and the output side of the amplification medium.

On the other hand, in the optical amplifier for loss compensation which is not requested to output such a high gain of the conventional optical amplifier, the value of G in the equation (1) above is smaller, the allowed values of R1 and R2 for suppression of the oscillation become relatively large. Therefore, as for the optical amplifier for loss compensation, the optical amplification can be realized on a oscillation-suppressed condition without providing an isolator on the input side and the output side of an amplification medium.

Figure 3A:
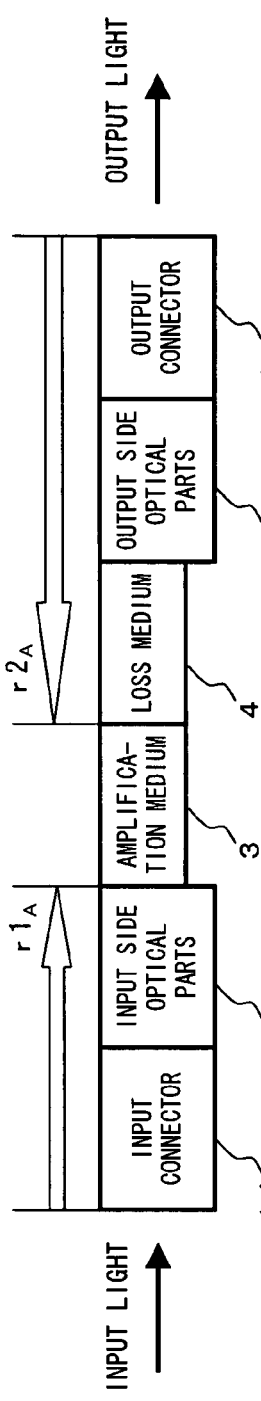
FIG. 3 shows examples of three configurations possibly designed when an isolator is omitted in combining a loss medium and an optical amplifier for loss compensation.
Figure 3B:
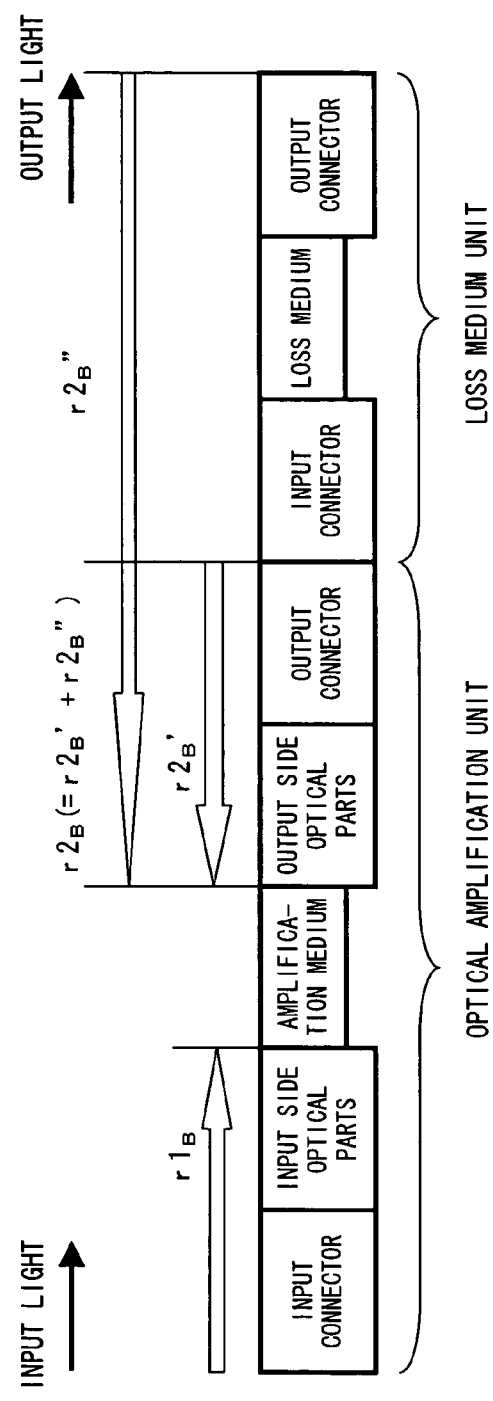
Figure 3C:
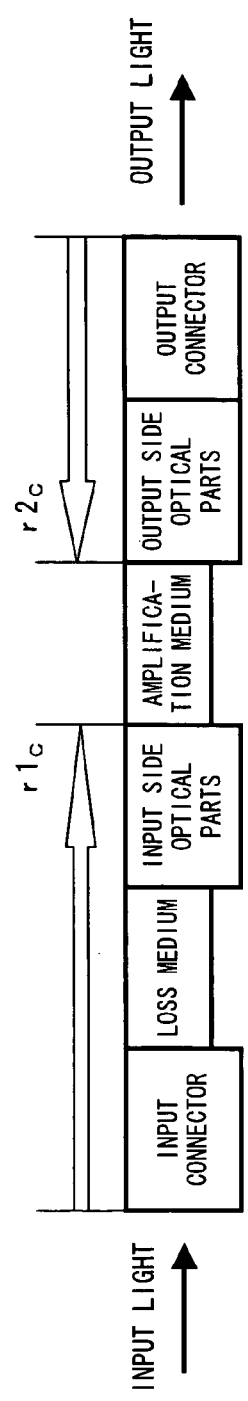

FIG. 3 shows examples of three configurations to be realized when an isolator is omitted. FIG. 3A shows an example of a configuration in which a loss medium is connected between an amplification medium and an optical part on the output side. The configuration example corresponds to the configuration of the optical apparatus according to the first embodiment shown in FIG. 2, and the corresponding components are assigned the similar reference numerals. FIG. 3(B) shows an example of the configuration of an output connector of an optical amplification unit in which an isolator is removed from the conventional optical amplifier connected with an input connector of a unit containing a loss medium. FIG. 3(C) shows an example of the configuration in which a loss medium is arranged before the amplification medium by connecting a loss medium between an input connector and an input side optical parts, and it is assumed that a desired connection status is realized in which the reflection of light at the connection point of the loss medium can be ignored.

In the configuration example shown in FIGS. 3A through 3C, the power of the reflected light r2$x$ ($x$=A~C) generated on the output side of the amplification medium is larger than the reflected light r1$x$ ($x$=A~C) by the gain in the amplification medium. Therefore, to reduce the oscillation with a predetermined gain reserved, the level of the reflected light r2$x$ on the output side has to be reduced by any means. Relating to the configuration example shown in FIG. 3A, the light r2A reflected on the end face of the output connector is returned to the amplification medium through the output side optical parts and the loss medium. Since the reflected light r2A is the light which has passed through the loss medium, reflected by the output connector, and passed again through the loss medium, it is the reflected light with the power effectively reduced by the combination with the loss medium.

On the other hand, relating to the configuration example shown in FIG. 3B, the reflected light r2B returned to the output side of the amplification medium is a sum of the light r2B' reflected at the connection point between the optical amplification unit and the loss medium unit and the light r2B" reflected on the output connector end face of the loss medium unit. Especially, relating to the reflected light r2B', the light is reflected before passing through the loss medium, the power becomes large.

Relating to the configuration example shown in FIG. 3C, the light r2C reflected on the output connector is returned to the amplification medium through the output side optical parts. The reflected light r2C has not passed through a loss medium, it has power large power as compared with the reflected light r2A. In addition, in the configuration example shown in FIG. 3C, a loss medium is provided on the input side of the amplification medium. Therefore, the pumping efficiency is higher than the configuration example shown in the configuration example shown in FIG. 3A, the inserted loss of the loss medium is added as is to the NF of the amplification medium, thereby considerable reducing the noise characteristic.

Thus, since the relation of the power of the reflected light returned to the output side of the amplification medium is r2A<r2C<r2B, the configuration of the optical amplifier for loss compensation for pursuit of a smaller system without an isolator can effectively reduce the occurrence of an oscillation phenomenon by applying the configuration example shown in FIG. 3A.

Figure 4A:
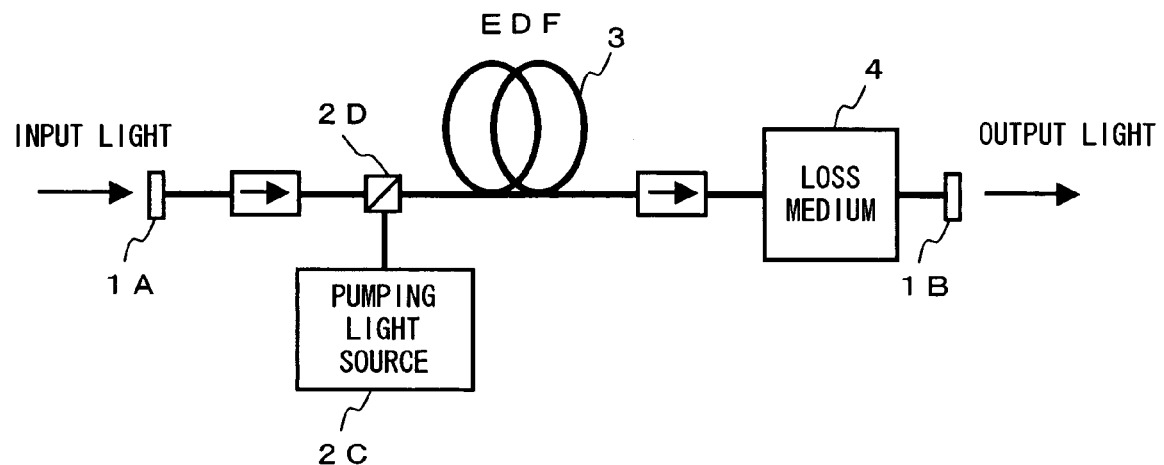
FIG. 4 shows a check model for the gain of an optical amplifier for loss compensation and a noise characteristic in which (A) shows the case where an isolator is provided before and after the amplification medium, and (B) shows the case where an isolator is omitted.
Figure 4B:
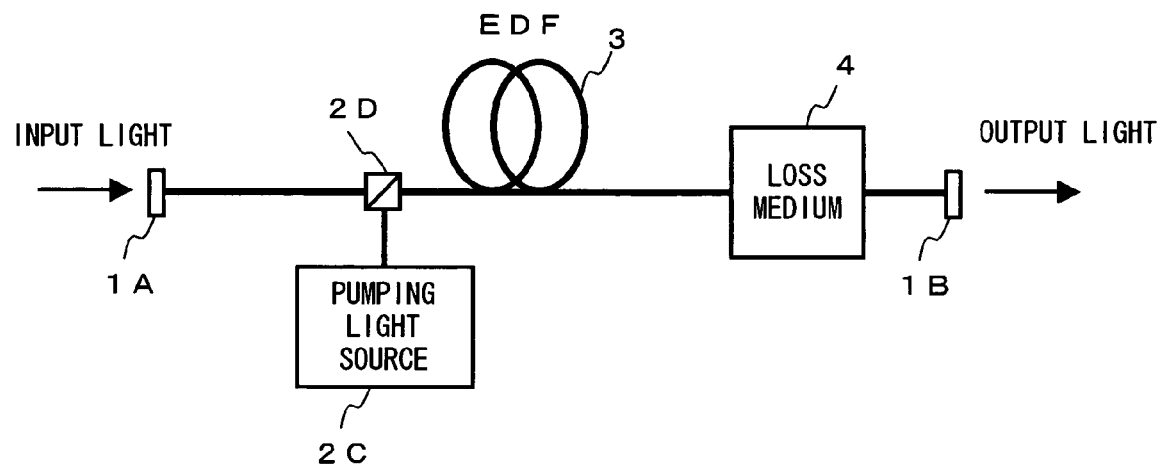

Described below are the gain of the optical amplifier for loss compensation and the noise characteristic. In this example, the gain and NF are checked by simulation with the loss in the loss medium changed to 0 dB, 7.5 dB, and 15 dB as shown in FIG. 4A when an isolator is provided before and after the amplification medium (EDF) and as shown in FIG. 4B when an isolator is omitted. The condition of the simulation is each amount of reflection attenuation of −35 db of the input connector and the output connector. The amplification medium of Al—Ge—Si-EDF (6 m long) can set the constant value of 50 mW for the pumping light power, and the reflection of light at the connection points among the components is assumed to be sufficiently small and ignored.

The above-mentioned conditions are common contents as an optical amplifier for use in an optical communications system. However, the rare earth element doped fiber is normally considered to change in characteristic (gain, NF, pumping efficiency, etc.) depending on the structure and design (Er density, the amount of dope of Al, Ge, the NA (numerical aperture), a mode field diameter, etc.). Therefore, the result of a simulation in this embodiment is an example for explanation of a qualitative tendency, but does not intend any quantitative restriction.

Figure 5:
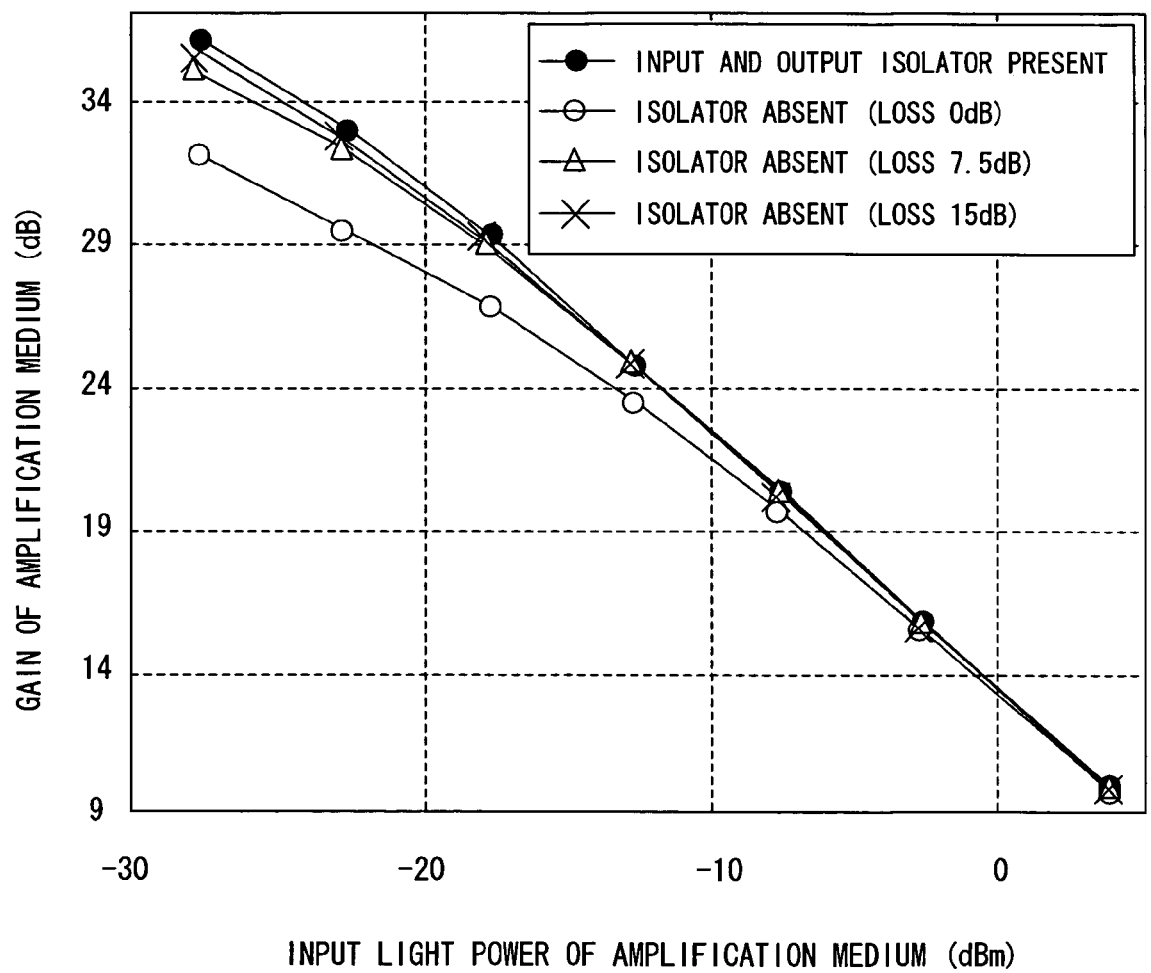
FIG. 5 shows a result of computing a gain relating to the check model shown in FIG. 4.

FIG. 5 shows a result of the calculation of the gain of each configuration shown in FIGS. 4A and 4B under the above-mentioned conditions. FIG. 6 shows a result of the calculation of the NF of each configuration shown in FIGS. 4A and 4B.

As shown in FIG. 5, when the amount of loss of the loss medium is 0 dB with the configuration in which no isolator is provided on the input side and the output side of the EDF, as compared with the case in which an isolator is provided, there is the tendency that the gain reduction becomes larger with an increasing gain. Practically, for example, when the input light power is −23 dBm, the gain reduction of about 3.5 dB occurs. However, with an increasing amount of loss of the loss medium, the reflected light decreases at the output connector depending on the amount of loss, and the amount of gain reduction decreases with the effect of the reduction of the reflected light on the output side. Practically, when the amount of loss of the loss medium is 15 dB, there is an influence of the reflected light on the input side, but the amount of gain reduction can be reduced down to 0.1 dB when the input light power is −23 dBm. Thus, with the configuration in which an isolator is omitted, the gain reduction due to the oscillation phenomenon and the output fluctuation can be effectively reduced by reducing the light reflected by the output connector and returned to the amplification medium by connecting a loss medium on the output side of the amplification medium.

Additionally, as shown in FIG. 6, the NF with the configuration in which no isolator is provided on the input side and the output side of the EDF, as compared with the case in which an isolator is provided, it is substantially at the same level in a small gain area (where the input light power is large), but the amount of reduction of NF increases when the gain increases. Considering that the power of the reflected return light of the ASE light increases with an increasing gain and especially that the NF value largely depends on the influence of the ASE light on the input side rather than the ASE light on the output side, the NF reduction occurs with an increasing power of the reflected light on the input side by the influence of the ASE light propagating in the opposite direction of the signal light. Practically, when there is no isolator, the ASE in the opposite direction is added to the input signal light, the SN-reduced signal is input to the amplification medium, and the occurrence of the forward ASE further increases with an increasing amplification of the signal, thereby developing the NF reduction.

The amount of gain reduction and the amount of NF reduction due to the omission of an isolator is substantially constant although the condition of the pumping light power changes because of the relation indicated by the equation (1) about the above-mentioned oscillation phenomenon.

Assuming that the amount of loss of a loss medium is changed with the input/output condition maintaining constant, and the power of the pumping light is adjusted depending on the amount of loss to keep the constant level of the output light, the pumping light poser and the NF are checked by simulation as described below. In this case, for example, as shown in FIG. 7, the following three models are assumed, that is, (A) an isolator is provided on the input/output sides of the amplification medium (EDF), (B) an isolator is provided on the input side only, and (C) no isolators are provided. The input/output conditions are the input light power of −5 dB to the amplification medium, and the net gain of 10 dB. Based on these values, the pumping light power and the NF are checked with the settings shown in Table 2.

TABLE 2

| Input Light Power (dBm) | Gain of Amplification (dB) | Loss Amount of Loss Medium(dB) | Output Light Power (dB) |
|---|---|---|---|
| −5 | 10 | 0 | 5 |
| −5 | 15 | 10 | 5 |
| −5 | 20 | 15 | 5 |
| −5 | 25 | 20 | 5 |

FIGS. 8 and 9 show results of the above-mentioned simulation. FIG. 8 shows the power of the pumping light to the gain in the amplification medium. FIG. 9 shows the relation of the NF to the amplification medium.

Figure 7A:
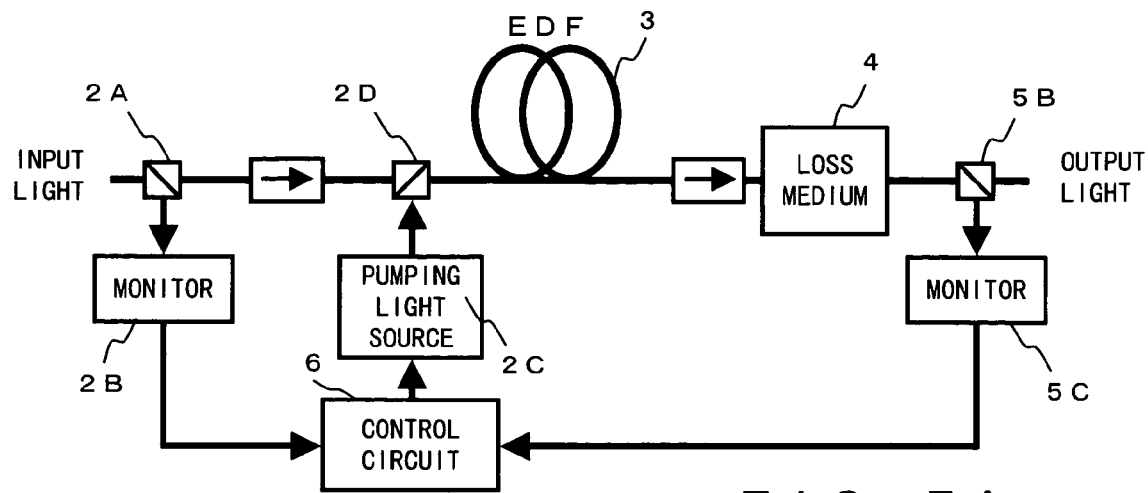
FIG. 7 shows a check model relating to the pumping light power and the NF when an input/output condition is fixed and the amount of loss of a loss medium is changed in which (A) shows the configuration of including an isolator on the input/output sides of an amplification medium, and (B) shows the configuration of omitting an isolator.
Figure 7B:
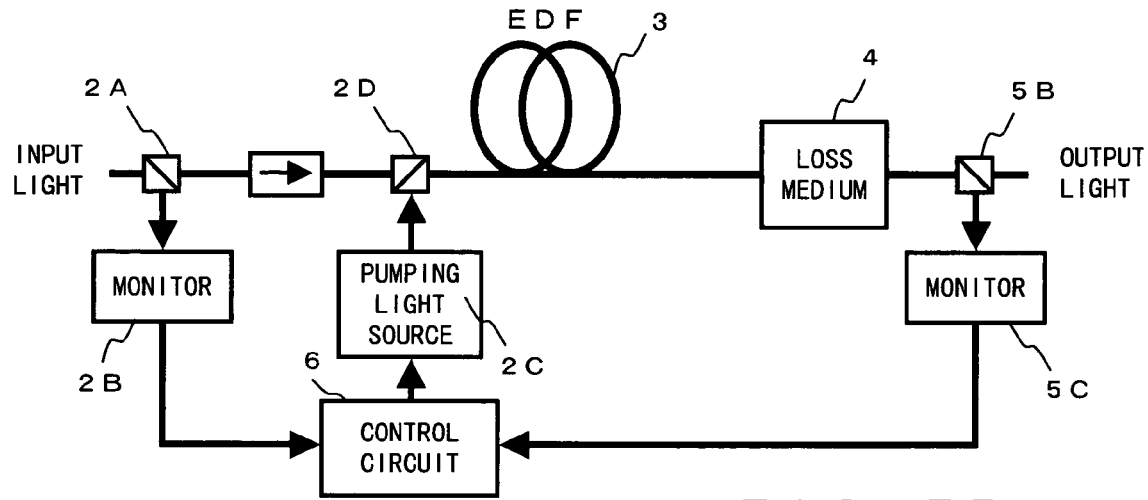
Figure 7C:
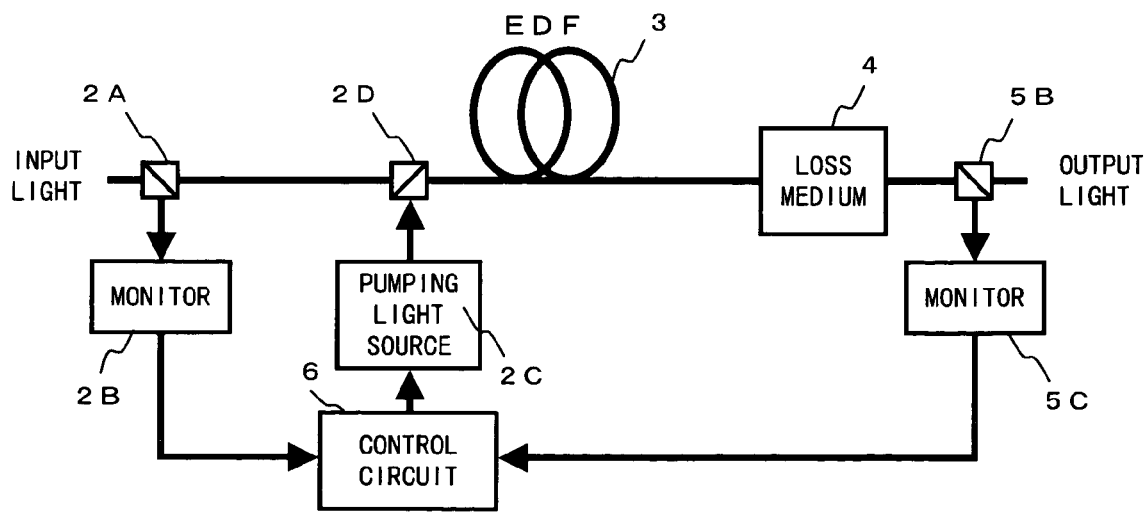

As shown in FIG. 8, the power of the reflected light in each configuration shown in FIGS. 7A through 7C is the same even in an area having a large gain. This indicates the specific effect of the present invention that the power of the input light on the output side decreases depending on the amount of loss of the loss medium. The optical amplifier for loss compensation is requested to maintain a broad loss compensation range by an optical amplifier and obtain a desired gain value. The optical amplifier for loss compensation with the configuration in which the isolator as shown in FIG. 7C is preferable in satisfying the above-mentioned request. That is, when the amount of loss of a loss medium is small, the gain of the amplification medium is also small. Therefore, as compared with the case in which an isolator is used, the influence of the reduction of the gain and NF can be eliminated. On the other hand, when the amount of loss of the loss medium is large, the specific effect of the present invention appears, and the gain reduction which is caused by omitting an isolator does not occur, thereby realizing the pumping efficiency almost at the level obtained when an isolator is applied.

Furthermore, as shown in FIG. 9, the NF for the gain indicates no reduction when an isolator is provided only on the input side shown in FIG. 7B as compared with the case in which an isolator is provided on the input/output sides shown in FIG. 7(A). However, when the isolator shown in FIG. 7C is omitted, the NF reduces with an increasing gain because, it is assumed, the power of the input light on the input side of the amplification medium increases by the influence of the ASE light propagating in the opposite direction. Therefore, when the optical amplifier for loss compensation is requested to have a relatively high gain and low (desired) NF, it is also possible to provide an isolator only on the input side of the amplification medium. This configuration is described later in detail.

Figure 10:
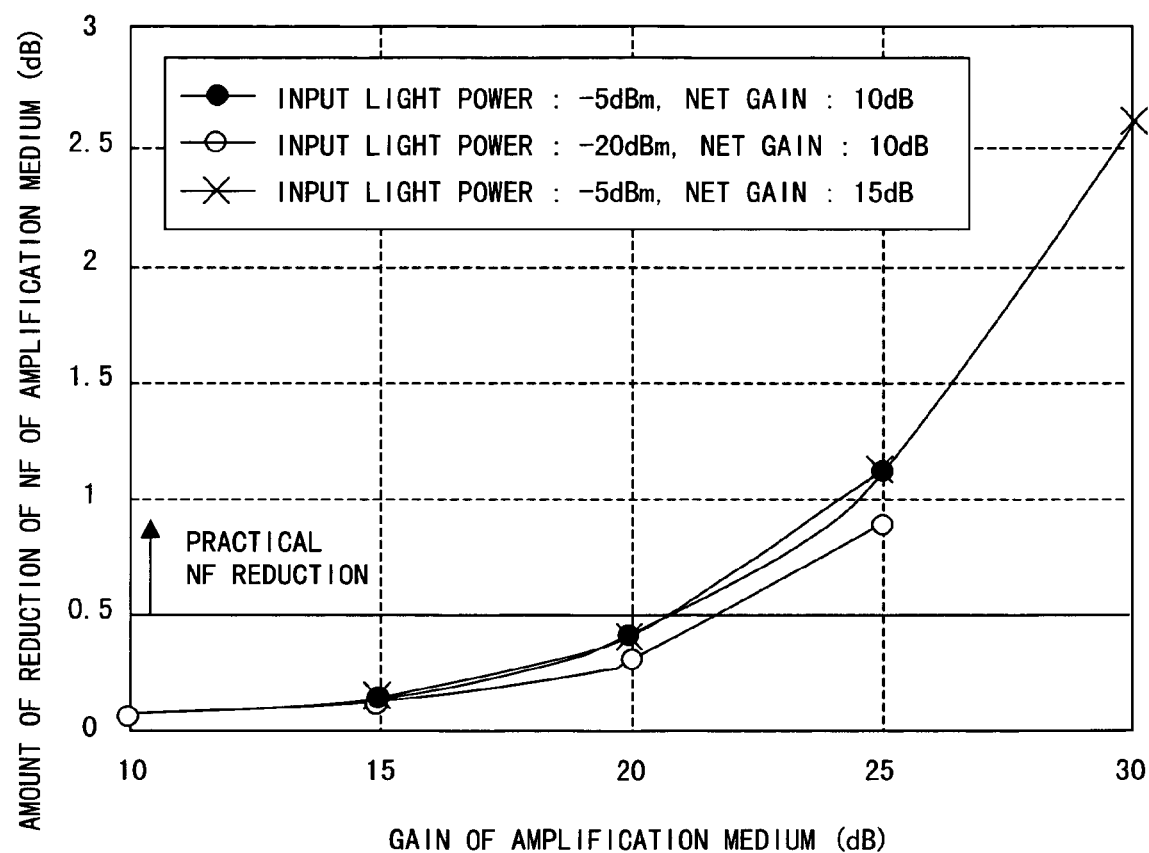
FIG. 10 shows a result of calculating the amount of reduction of the NF with the configuration shown in FIG. 7(C) to the NF in the configuration shown in FIG. 7(A)

A study is also performed about the amount of reduction of the NF when the power of the input light and the condition of a net gain are changed. FIG. 10 shows a result of the calculation of the amount of reduction of the NF with the configuration in which an isolator shown in FIG. 7C is omitted relative to the NF in the configuration in which an isolator is provided on the input/output sides shown in FIG. 7A. As shown in FIG. 10, the amount of reduction of NF depending on the presence/absence indicates a substantially constant value under different input/output conditions. It is considered that the condition of the oscillation phenomenon indicated by the equation (1) above works. As a result, the optical amplifier for loss compensation having the configuration in which an isolator is omitted can avoid the reduction from noise characteristic as compared with the configuration in which an isolator is provided so far as the gain is 20 dB or lower under a broad input/output condition.

The above-mentioned results are summed up as follows. That is, according to the optical apparatus of the first embodiment with the configuration shown in FIG. 2, the isolator normally provided on the input side and the output side of the amplification medium can be omitted. Therefore, the downsizing can be realized at a lower cost by two isolators. Relating to the characteristics, when the loss of the loss medium is large, the reflected light on the output side of the amplification medium can be effectively reduced. Therefore, a gain range in which an oscillation phenomenon does not occur can be set large. Practically, FIG. 11A shows an example of a change to the gain in the amplification medium relating to the amount of gain reduction by omitting the isolator on the output side of the amplification medium, and FIG. 11B shows an example of a change to a net gain. Since the isolator normally has an insertion loss of about 0.5 dB, it is considered that practical gain reduction occurs when the amount of gain reduction shown in FIG. 11 exceeds 1 dB which corresponds to the insertion loss of two isolators. Therefore, when the amount of loss in the loss medium is several dB or more, the loss compensation can be realized in a broad gain range.

However, the optical amplifier for loss compensation with the configuration in which an isolator is omitted on the input/output sides of the amplification medium, as apparent from the NF amount of reduction for the gain in the amplification medium shown in FIG. 12A and the NF amount of loss for the net gain shown in FIG. 12B, there is the tendency that the amount of reduction of the NF becomes large with an increasing gain. Therefore, it is desired that the upper limit of the amount of loss is assigned to the loss medium for compensation, and a relatively small gain setting which is small enough to disregard the amount of reduction of the NF is used.

In the optical apparatus of the present embodiment, each power of the input light and the output light is monitored by the branch unit 2A, the monitor 2B, the branch unit 5B, and the monitor 5C, and the control circuit 6 determines a net gain based on the monitor result, and the drive state of the pumping light is adjusted such that a gain at least equal to the loss in the loss medium 4 can be obtained. Thus, an optical apparatus without a loss, that is, a lossless optical apparatus, can be realized. Although the amount of loss of the loss medium 4 has changed, the gain in the amplification medium 3 is automatically controlled depending on the amount of a change. Therefore, for example, the loss compensation of each of the optical parts having different amounts of loss can be realized by a small and low-coat optical amplifier.

Described below is the second embodiment of the optical apparatus having the loss compensation capability according to the present invention.

Figure 13:
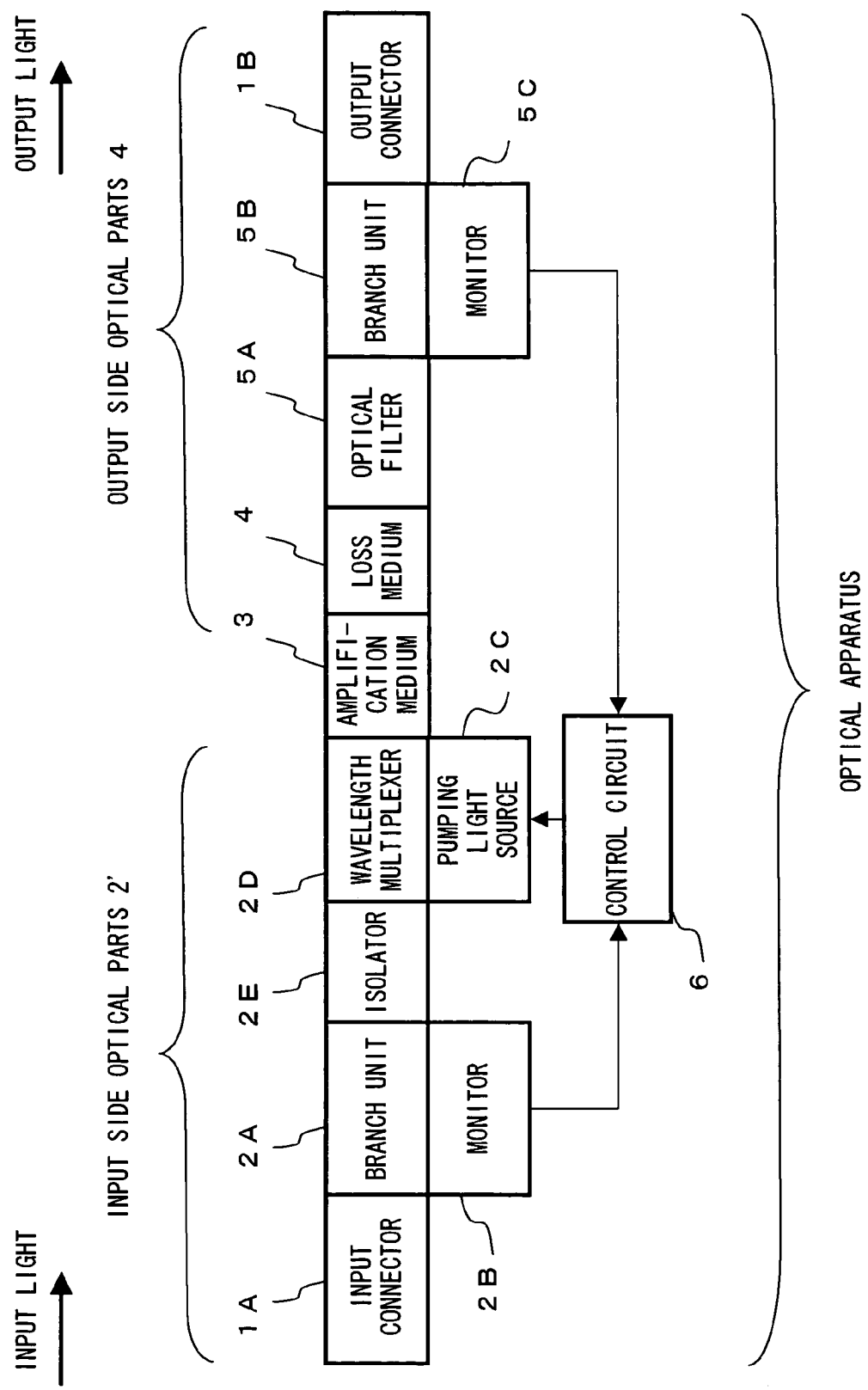
FIG. 13 shows a configuration of the second embodiment of the optical apparatus having the loss compensation capability according to the present invention.

FIG. 13 shows the configuration of the second embodiment of the optical apparatus. The components similar to those according to the first embodiment are assigned the same reference numerals, and the explanation is omitted here, which also holds with other embodiments.

In FIG. 13, In the configuration of the optical apparatus according to the present embodiment, the portions different from those in the configuration of the first embodiment shown in FIG. 2 are represented by an input side optical parts 2' for the input side optical parts 2. The input side optical parts 2' is different from the input side optical parts 2 in that an isolator 2E is connected to the optical path between the branch unit 2A and the wavelength multiplexer 2D. The other components in the configuration are the same as those according to the first embodiment.

The isolator 2E passes the light propagating from the branch unit 2A to the wavelength multiplexer 2D, and cuts off the light in the opposite direction. The isolator 2E corresponds to the isolator provided on the input side of the amplification medium in the conventional optical amplifier.

In the second embodiment of the optical apparatus, by providing the isolator 2E on the input side of the amplification medium 3, the ASE light traveling in the opposite direction of the signal light on the input side is cut off in the ASE light emitted from the amplification medium 3, and does not reach the input connector 1A. Thus, the ASE light on the input side is not reflected on the end face of the input connector 1A, and is not returned to the amplification medium 3. Therefore, as described above by referring to FIG. 9, the NF reduction caused by the increase of the power of the reflected light on the input side with an increasing gain can be effectively suppressed.

As described above, according to the second embodiment of the optical apparatus, the isolator conventionally provided on the output side of the amplification medium can be omitted. Therefore, the system can be downsized with cost reduction by one isolator. Relating to the characteristic, as in the first embodiment, the reflected light can be effectively reduced on the output side of the amplification medium by an increasing loss of the amplification medium. As a result, a broad gain range without an oscillation phenomenon can be set. Practically, FIG. 14A shows an example of a variation of the gain in the amplification medium relating to the amount of gain reduction as a result of omitting an isolator on the output side of the amplification medium. FIG. 14B shows an example of a variation of the net gain. In FIG. 14, when the amount of gain reduction exceeds 0.5 dB, which corresponds to the insertion loss of one isolator, it is considered that a practical gain reduction occurs. Therefore, when the amount of loss in the loss medium is several dB or more, the loss compensation can be performed in a broad gain range.

Furthermore, when a loss increases and the gain for compensation for the loss also increases, the isolator provided on the input side suppresses the reflection of the ASE light on the end face of the input connector 1A or the return of it to the amplification medium 3. As a result, the reduction of the NF with an increasing gain can be reduced. Practically, FIG. 15A shows an example of a variation of the gain in the amplification medium relating to the amount of NF reduction as a result of providing an isolator on the input side of the amplification medium. FIG. 15B shows an example of a variation of the net gain.

When the effect is considered on the above-mentioned characteristics, it is preferable that the optical amplifier for loss compensation in the configuration in which the isolator is omitted on the output side of the loss medium is assigned the lower limit of the amount of loss of the loss medium for compensation, and is used with high gain setting so that the reflected light power reduction effect can sufficiently work on the output side by the loss medium arranged on the output side of the amplification medium 3.

In addition, also in the second embodiment of the optical apparatus, as in the first embodiment, the gain control of the amplification medium 3 is performed based on the monitor result of the input/output light power. Therefore, an optical apparatus without a loss in the entire system can be realized, thereby automatically controlling the gain depending on the change of the amount of loss of the loss medium 4. As a result, for example, a small and low-cost optical amplifier can realize the loss compensation for various optical parts having different amounts of losses.

FIGS. 16 through 22 are explanatory views showing the experiments on the effect of the embodiment of the present invention.

Figure 16:
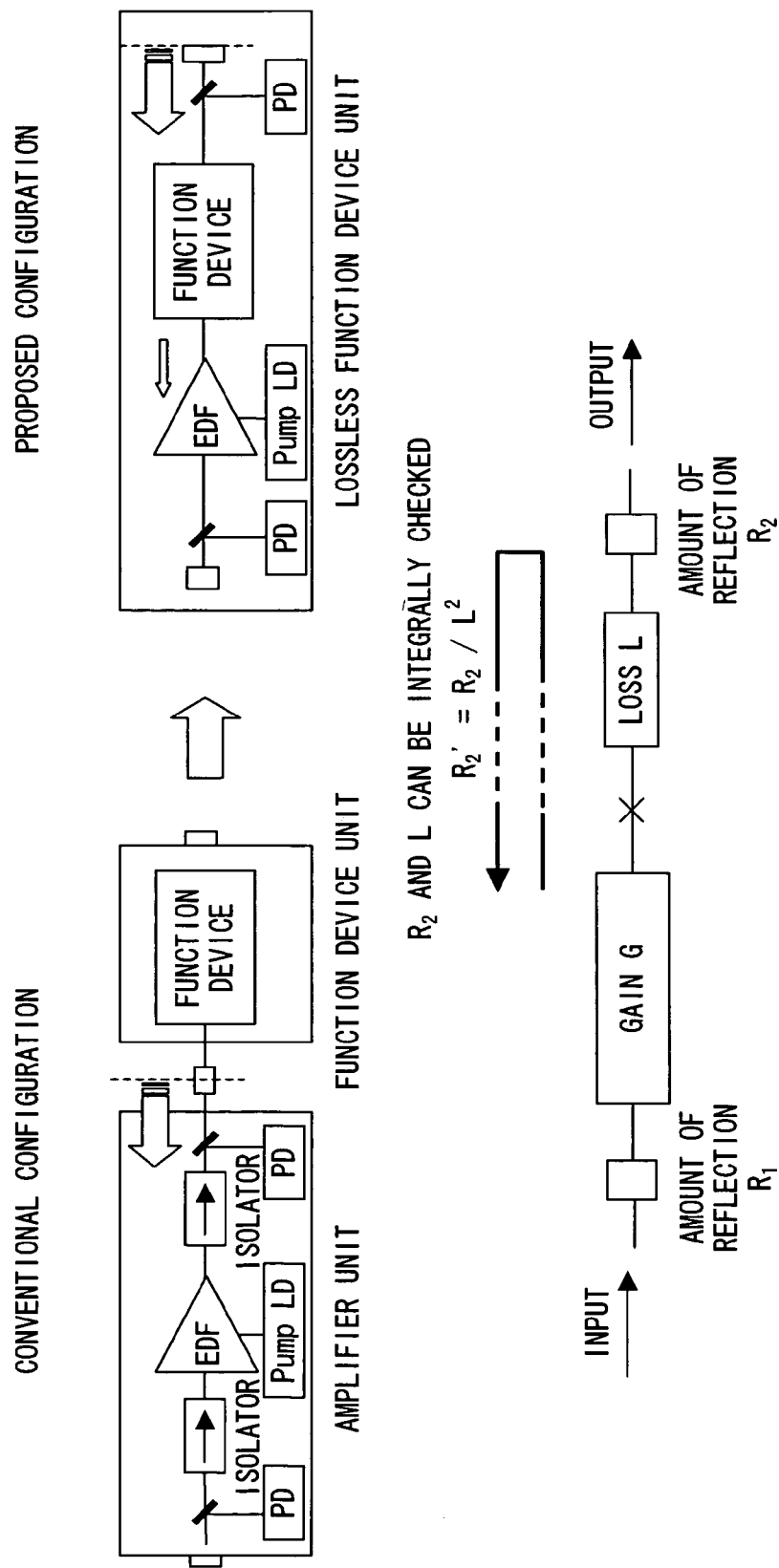
FIG. 16 is an explanatory view (1) of the experiment showing the effect of an embodiment of the present invention.

Although the conventional configuration includes an isolator, the configuration proposed by the embodiment of the present invention as shown in FIG. 16 has a function device as a loss medium in place of the conventional isolator. The function device can be a polarization mode dispersion compensator (PMDC), a VIPA-type dispersion compensator, etc.

Using a preferable connection method (splice or crossly ground connector) for the amount of reflection attenuation, the function device can be incorporated into one structure, and the amount of reflection attenuation R2 on the output side is improved by the insertion loss of the function device.

As shown at the lower portion in FIG. 16, the reflectance R2' viewed from the gain G is a combination of the loss L and the amount of reflection R2 and expressed by $R2'=R2/L^2$.

FIG. 17 shows a result of an experiment of suppressing the optical amplifier MPIXT (multipath interference crosstalk) by the insertion loss of the variable optical attenuator (VOA) corresponding to the optical function device.

In FIG. 17, the larger the amount of attenuation, the smaller the MPIXT.

Figure 18:
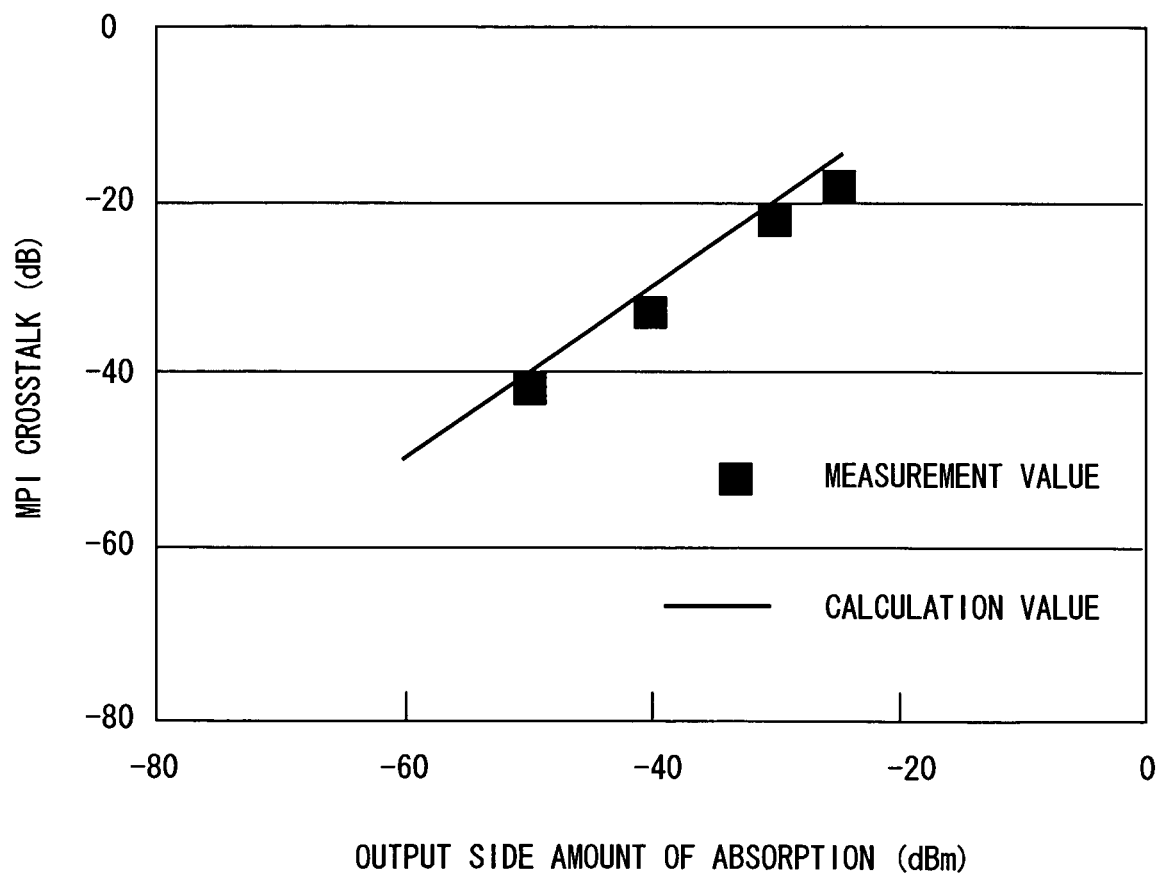
FIG. 18 is an explanatory view (3) of the experiment showing the effect of an embodiment of the present invention.

FIG. 18 is a view for checking the precision of a measured value of the MPI crosstalk. The graph shown in FIG. 18 indicates the amount of reflection on the output side, and shows a plot of the MPI crosstalk with the calculated value substantially matching the measured value. In the case shown in FIG. 18, the amplification medium gain <30 dB, and the amount of reflection attenuation on the input side <−30 dB.

FIG. 19 shows the measurement result of R2 in a variable optical attenuator corresponding to the optical function device. As shown on the left in FIG. 19, the amount of reflection attenuation including the variable attenuator VATT is represented by R2, and the reflective surface at the exit of the VAT (variable attenuator) is checked between the behavior of the VAT amount of reflection attenuation for the VAT insertion loss and the theoretical value between when a fiber is terminated by optical absorbing means and when a connector is released (reflection occurs in the position of the boundary between the connector and the air). The comparison result is shown in FIG. 19. When the reflective surface is terminated, the VAT amount of reflection attenuation indicates a high value, but when the reflective surface is released, the behavior of the VAT amount of reflection attenuation is nearly equal to the theoretical value.

Figure 20:
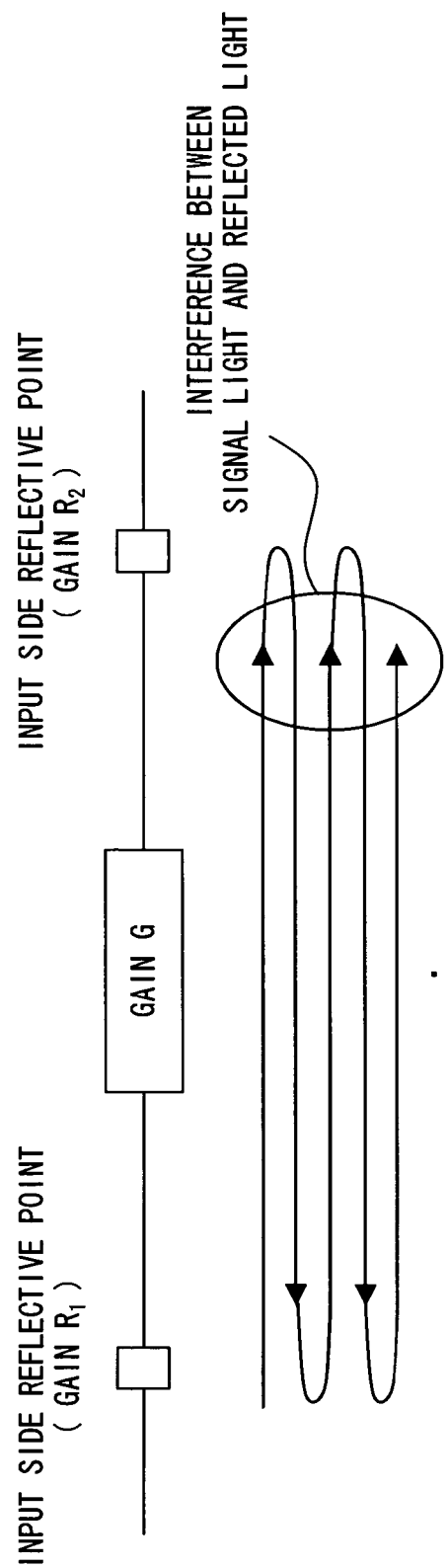
FIG. 20 is an explanatory view (5) of the experiment showing the effect of an embodiment of the present invention.

FIG. 20 is an explanatory view of the MPI (multiple path interference).

The MPI is considered to be the cause of generating interference noise FMPI and reducing the transmission quality. The crosstalk of the MPI is represented by $R^2$ and is defined as a parameter indicating the level of the MPI. When the input side amount of reflection is R1, the output side amount of reflection is R2, the optical amplifier gain is G, and the coefficient indicating the consistency of the polarization is p, the equation of $R^2=pG^2R1R2$ holds.

The MPI causes noise or the reduction of transmission quality of signal light by the travel of reflected light and the occurrence of signal light and interference between the input side reflective point and the output side reflective point as shown in FIG. 20.

Figure 21:
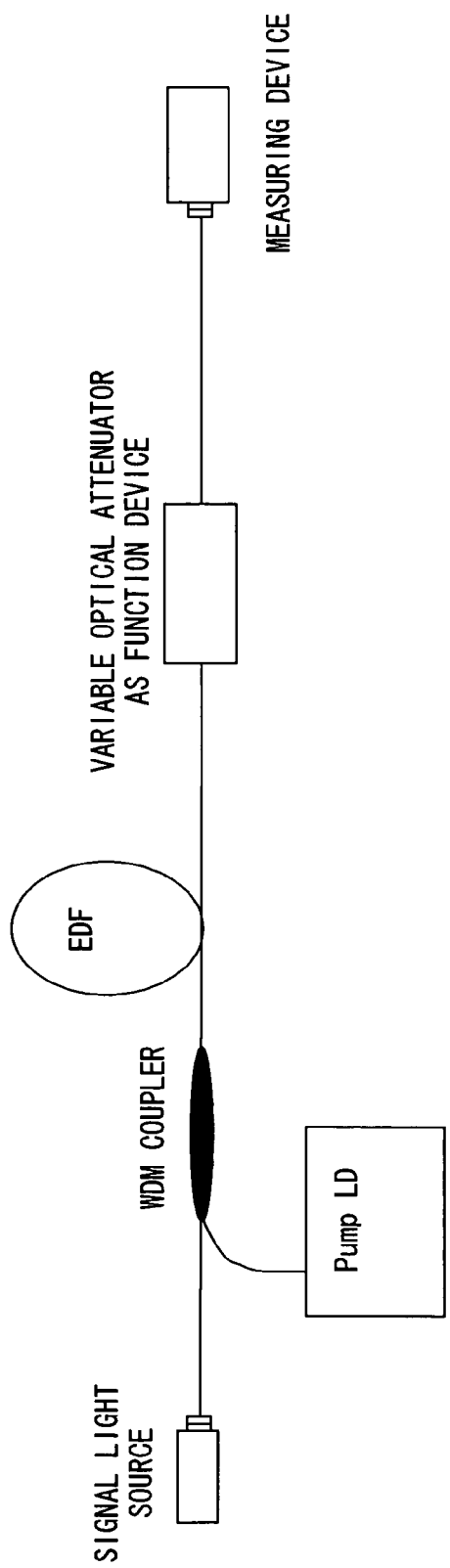
FIG. 21 is an explanatory view (6) of the experiment showing the effect of an embodiment of the present invention.

FIG. 21 shows the measuring experiment system of the MPI crosstalk.

The variable optical attenuator (VOA) as an optical function device replaces the output side isolator, and is inserted by fusion splicing. In this system, the output side gain control unit decreases depending on the amount of absorption of the VOA, and the MPI crosstalk can be improved.

Figure 22:
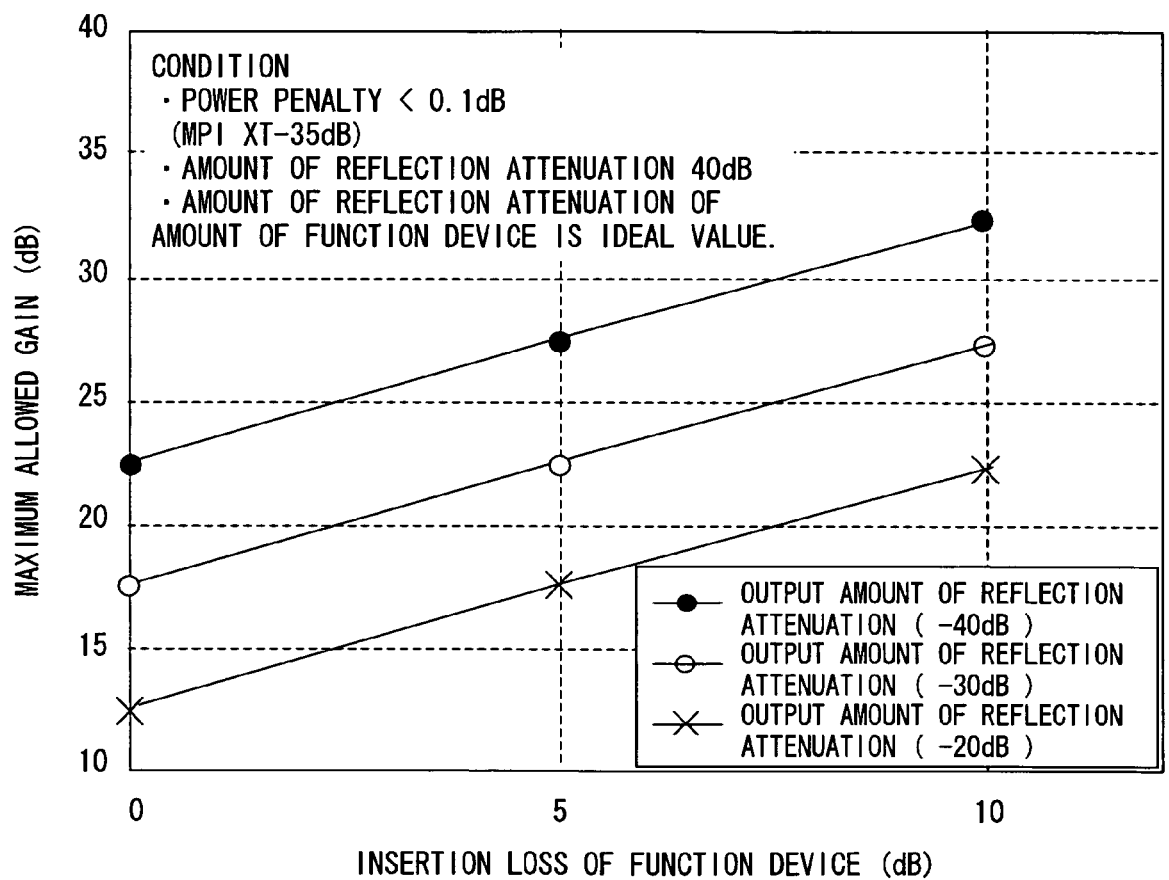
FIG. 22 is an explanatory view (7) of the experiment showing the effect of an embodiment of the present invention.

FIG. 22 is a plot of the maximum allowable gain of the amplification medium for the insertion loss of the function device.

In FIG. 22, the power penalty is smaller than 0.1 dB, the MPIXT is −35 dB, the input side amount of reflection attenuation is 40 dB, the amount of reflection attenuation of the function device is an ideal value when the output amount of reflection attenuation is −40 dB, −30 dB, and −20 dB.

In this example, the smaller the output amount of reflection attenuation, or the larger the insertion loss of the function device, the larger the gain allowable for the amplification medium. Therefore, the flexibility of the control of the amplification medium can be further improved.

Thus, the determination standard level for the isolator can be moderated, and the output side isolator can be eliminated.

For example, when an 8-port amplifier is used, the entire system can be downsized and cost-reduced by eight isolators, thereby more than 15% downsizing and cost-reducing the optical amplifier.

Described below is the third embodiment of the optical apparatus having the loss compensation capability according to the present invention.

Figure 23:
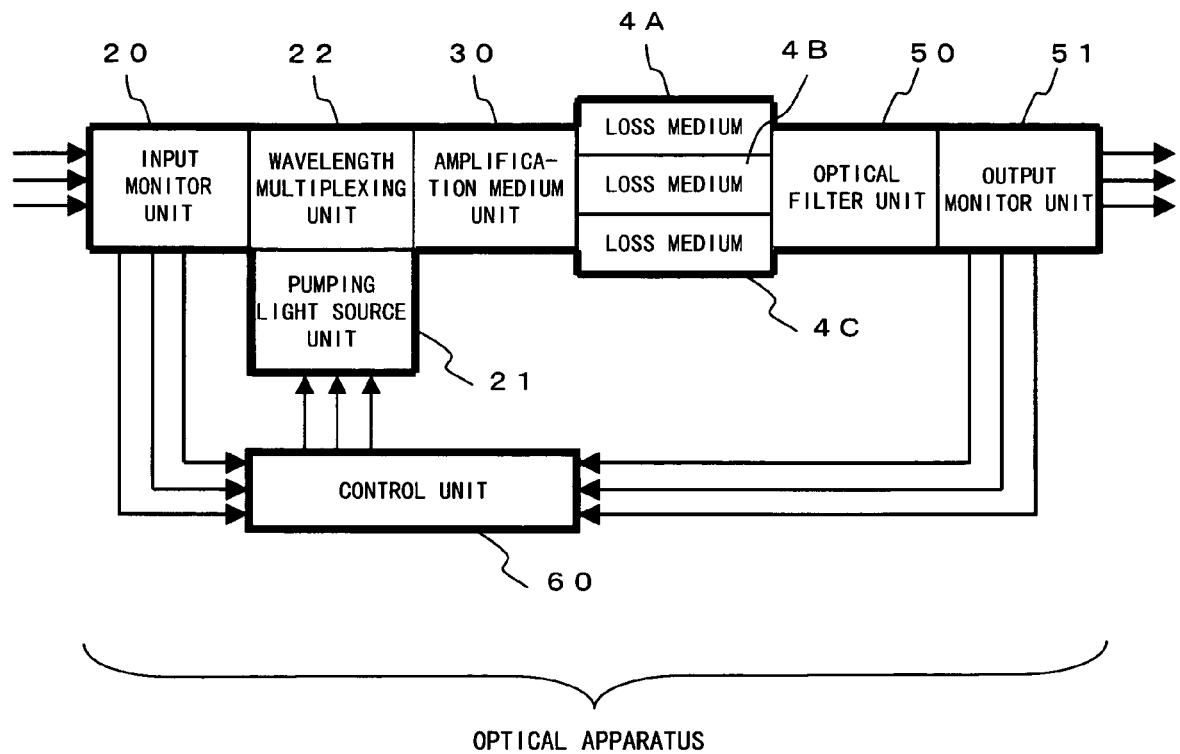
FIG. 23 shows the outline of the configuration of the third embodiment of the optical apparatus having the loss compensation capability according to the present invention.

FIG. 23 shows an example of the outline of the configuration of the optical apparatus according to the third embodiment.

In FIG. 23, the optical apparatus according to the present embodiment can be further downsized and cost-reduced for an optical amplifier for loss compensation by incorporating a plurality of optical apparatuses according to the first embodiment into one system.

In this example, three optical amplifiers for loss compensation for three loss media 4A, 4B, and 4C are arrayed for each component, and the components capable of being collectively integrated are incorporated into an array structure.

The technology of collectively integrating various optical parts configuring each optical apparatus can be, for example, the optical waveguide technology, the integration through spatial coupling, the fiber array method, the fiber sheet method, common use of a single part, etc. The type of integrated optical parts and their configurations are to be selected for better function (characteristic), cost, size, reliability, etc. with the consistency with other optical parts taken into account. For example, it is effective to use the same technology for all of various optical parts, and integrate them. Additionally, various optically integrated parts produced by different technologies can be effectively combined.

Practically, for example, the integration using the optical waveguide technology can be easily realized by integration, and can be more effectively downsized than the discrete type method. To produce and integrate a number of optical devices configuring an optical apparatus is efficient in downsizing a single optical amplifier.

Described briefly below is the outline and the characteristic of the above-mentioned optical waveguide technology. The optical waveguide technology is the process of coating the surface of a transparent dielectric substrate of glass, etc. with thin film having a little higher refractive index than the substrate and having a thickness of the optical wavelength order, thereby enclosing the light in the high refractive index thin film layer. A practical optical waveguide technology comes in various types. For example, a quartz type planer optical wave circuit (PLC) technology is excellent in flexibility in designing, physically and chemically stable, consistent with optical fiber, and is a good match with the theoretical value because of the correct waveguide structure from its processibility. With the optical waveguide technology, a waveguide type optical device can be configured on a substrate by combining various forms of optical waveguides depending on the functions of the optical device. Therefore, the optical waveguide technology is appropriate in integrating a plurality of optical devices.

For example, various components for use in an optical communications system such as an amplification medium, an optical power division, wavelength-multiplexing and interference branch waveguide, an optical directive coupler for coupling plural waveguide modes, an optical switch, a multichannel division-multiplexing circuit, an optical attenuator, etc. have already been developed using the optical waveguide technology. Practically, an isolator using the optical waveguide technology is disclosed by, for example, the literature: the electronics society meeting 2000 of the Institute of Electronics, Information and Communication Engineers, C-3-67, the literature: the Institute of Electronics, Information and Communication Engineers, the Technical Report of the IEICE, OPE 99-109 (1999-12), etc. The optical wavelength division-multiplexer is disclosed by, for example, the literature: the electronics society meeting 2000 of the Institute of Electronics, Information and Communication Engineers, C-3-20, 21, etc. Furthermore, a product realized by arraying a branch unit and a photoreceiver (monitor) are well-known. Additionally, a semiconductor laser is disclosed by, for example, the literature: the electronics society meeting 2000 of the Institute of Electronics, Information and Communication Engineers, C-3-107, 109, etc. An optical amplifier has been disclosed by, for example, the literature: the electronics society meeting 2000 of the Institute of Electronics, Information and Communication Engineers, C-3-98, etc.

Figure 24:
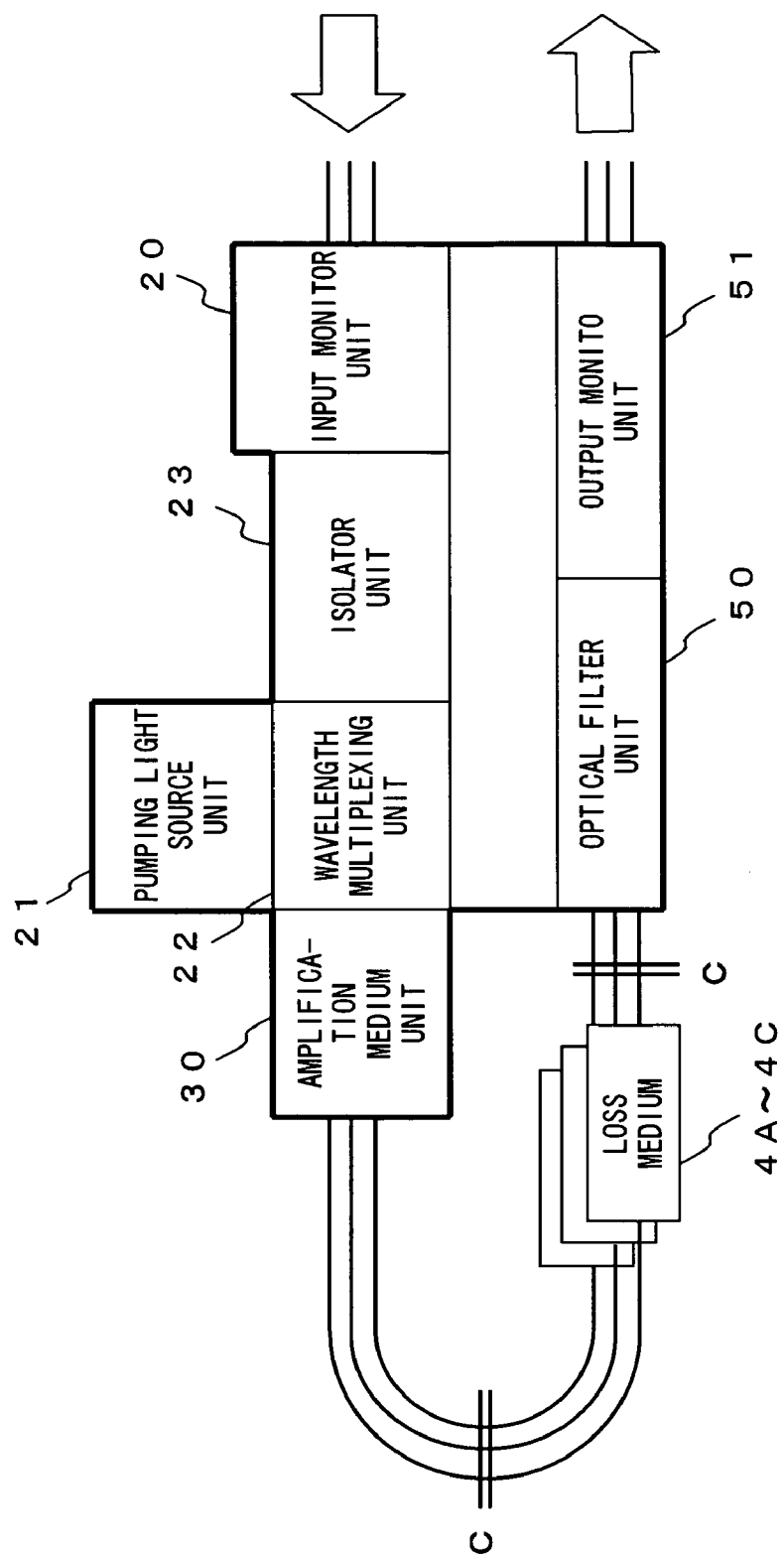
FIG. 24 shows a practical example of an application of the device using the optical waveguide technology according to the third embodiment of the present invention.

By applying the device using the above-mentioned optical waveguide technology, for example, as shown in FIG. 24, a waveguide type part can be obtained by incorporating various optical function devices in an area enclosed by bold lines. In the example of the configuration shown in FIG. 24, the connection point C of each of the loss media 4A through 4C arranged on the optical path connecting an amplification medium unit 30 and an optical filter unit 50 of the waveguide type parts is processed by the connection method in which a small amount of reflection attenuation of, for example, a splice and a crossly ground connector. In this example, the figures are omitted, but it is assumed that the control circuit of each optical amplifier is separately incorporated.

Thus, according to the third embodiment of the optical apparatus, three optical amplifiers for loss compensation for the loss media 4A, 4B, and 4C are arrayed for each component, and the components capable of being collectively integrated are incorporated into an array structure, thereby further downsizing and cost-reducing the optical apparatus. If the number of optical amplifiers is a predetermined number or larger, the cost of a optical amplifier can further be reduced. Furthermore, the consistency with other arrayed modules (for example, an optical switch, a variable optical attenuator (VOA), an AWG, etc.) can be realized. Therefore, when a very large number of optical amplifiers are applied in a system, it can be more easily designed and produced.

In the above-mentioned third embodiment, the integration using the optical waveguide technology is explained by referring to a practical example. However, although the integration using the optical waveguide technology is effective in downsizing and integrating the system, care must be taken to the technology because it causes a coupling loss with fiber, the PDL reduction by the optical diffusion by the incomplete waveguide, and the optical absorption specific to a waveguide material, the crosstalk reduction, etc. Furthermore, the integration of each component of the optical apparatus in the present invention is not limited to the method using the optical waveguide technology, but can be realized by applying the well-known technology such as the above-mentioned integration through spatial coupling, the fiber array method, the fiber sheet method, common use of a single part, etc.

Described below is the fourth embodiment of the optical apparatus having the loss compensation capability according to the present invention. In the fourth embodiment, for example, a rare earth element doped fiber is used as an amplification medium in the third embodiment. The configuration in which a rare earth element doped fiber is used as an amplification medium excels in various characteristics such as reliability, pumping efficiency, NF, etc. as compared with the configuration using other amplification media such as waveguide type and semiconductor type. Therefore, it is preferable in configuring an optical amplifier for loss compensation.

Figure 25:
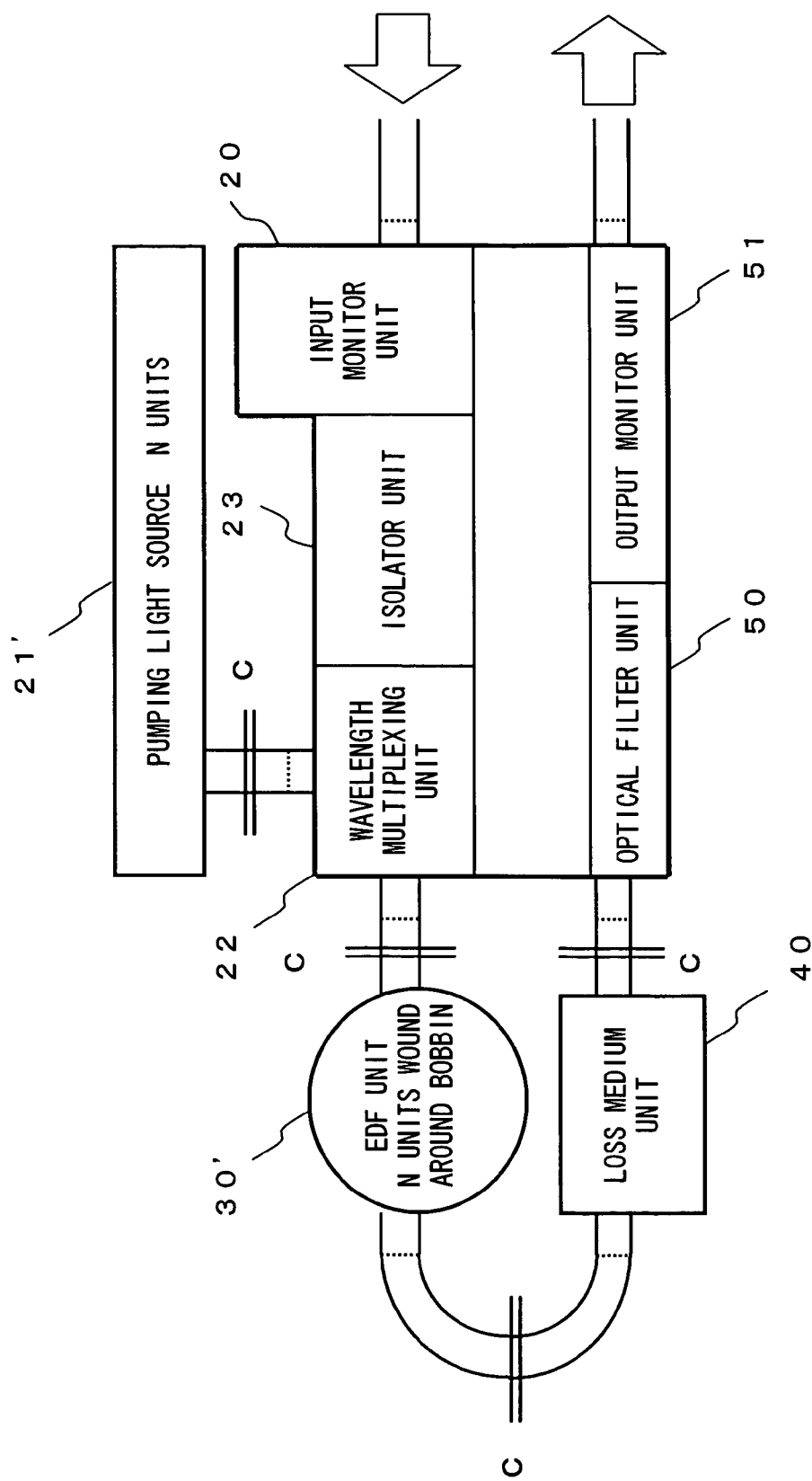
FIG. 25 shows the outline of the configuration of the fourth embodiment of the optical apparatus having the loss compensation capability according to the present invention.

FIG. 25 shows a configuration of the outline of the optical apparatus according to the fourth embodiment.

In FIG. 25, the optical apparatus has a configuration in which, for example, N erbium doped fibers (EDF) which belong to a group of rare earth element doped fiber form a EDF unit 30'. The EDF unit 30' is connected between the waveguide type parts integrated using the optical waveguide technology, etc. and a loss medium unit 40 obtained by arraying N loss media using the splice and a connector, etc. With this configuration, N pumping light sources 21' corresponding to the EDF unit 30' are externally provided for the waveguide type parts, and the pumping light emitted from each of them is supplied to the EDF unit 30' through the wavelength multiplexing unit 22 of the waveguide type parts. Although not shown in FIG. 25, but the control circuit for control of the drive state of each pumping light source 21' is separately integrated and installed.

In the EDF unit 30', for example, the erbium doped silica type fiber or the erbium doped fluoride fiber, etc. are used as N EDFs, and it is desired that the length of each fiber can be shortened by increasing the amount of dope of erbium for the optical amplification (for example, the normal length of several tens meters is to be shorter than several meters). The N EDF units 30' are treated by the fiber array process on the connection portions at both ends with the consistency with the wavelength multiplexing unit 22 of the waveguide type parts and the loss medium unit 40 taken into account, or other types of fiber is connected to both ends using the mode conversion fusion splicing technology, and then performing the fiber array process. Furthermore, for the above-mentioned EDF unit 30', it is desired from the viewpoint of reliability that, for example, resin coating is applied to make a ribbon fiber. In this embodiment, the above-mentioned processes are performed on the N EDFs, and after the radius of permissible curve depending on the increased loss, a mechanical damage, etc. is maintained, they are wound around a bobbin and implemented. The method of implementing the EDF unit 30' is not limited to an example above, but, for example, as an EDF unit 30" shown in FIG. 26, it is applied along other optical parts configuring the optical apparatus. Otherwise, although not shown in the attached drawings, a well-known fiber-sheet process is performed to apply it above or below the implementation space of other optical parts.

Other optical parts than the EDF unit 30' are also practically explained below.

First, the waveguide type parts integrated using the optical waveguide technology are to be integrated with a plurality of optical function devices formed with the same waveguide to reduce a loss and downsize the entire system. The integration of each optical function device is performed by, for example, providing convex and concave portions on the silicon substrate as one platform, forming a waveguide on the silicon substrate, incorporating the optical function device into a predetermined position, thus implementing the device and completing a hybrid integration. For the waveguide type parts, if it is necessary to suppress the crosstalk reduction by the optical diffusion caused by the incompleteness of the waveguide, the plat form can be divided, the pumping light supply port can be arranged on the side not provided with the input/output port, the interval of each of the integrated devices is broadened, etc. It is preferable that the pumping light supply port and the input/output port is provided on the same side when downsizing is required.

Furthermore, for each connection portion between the waveguide type parts and the EDF unit 30' and the loss medium unit 40, the mode field diameter of the waveguide is to match the mode field diameter of the connected fiber to reduce the connection loss due to a mode mismatch. When a optical path having a different mode field diameter is connected, for example, the connection method as shown in FIGS. 27B and 27C is to be used. That is, as shown in FIG. 27A, a connection loss due to a mode mismatch occurs when a waveguide and fiber having different mode field diameters are connected simply by an adhesive, etc. Therefore, as shown in FIG. 27B, a fiber consistent with the mode field diameter of the waveguide is provided on the waveguide side as an interagent so that the interagent fiber can be connected to a requested fiber through mode field conversion splice, etc. Otherwise, as shown in FIG. 27C, a connecting method using a tapered waveguide whose width is moderately changed can be used to reduce the connection loss due to mode mismatch.

For the N pumping light sources 21', for example, a semiconductor laser, etc. is used. If the waveguide type configuration can be realized as in the above-mentioned second embodiment, the N pumping light sources can be a component of the waveguide type parts. However, when characteristic reduction can be predicted due to the heat, etc., an individual semiconductor laser with a pigtail can be recommended as a pumping light source. In this case, each pumping light source is connected to the wavelength multiplexing unit 22 of the waveguide type parts through the fusion splicing, etc. It is desired that the semiconductor laser for a pumping light source is made of an efficient element to reduce the radiation space regardless of the integration. For example, it is recommended to use a coolerless (no temperature control required) semiconductor laser, etc. having an internal potential structure on which power reduction hardly occurs even at a high temperature. As for the arrangement of a plurality of pumping light sources, it is desired that the interval between adjacent semiconductor lasers is to be broaden for better radiation. It is also recommended to use a semiconductor laser array with a pigtail as a pumping light source.

Figure 26:
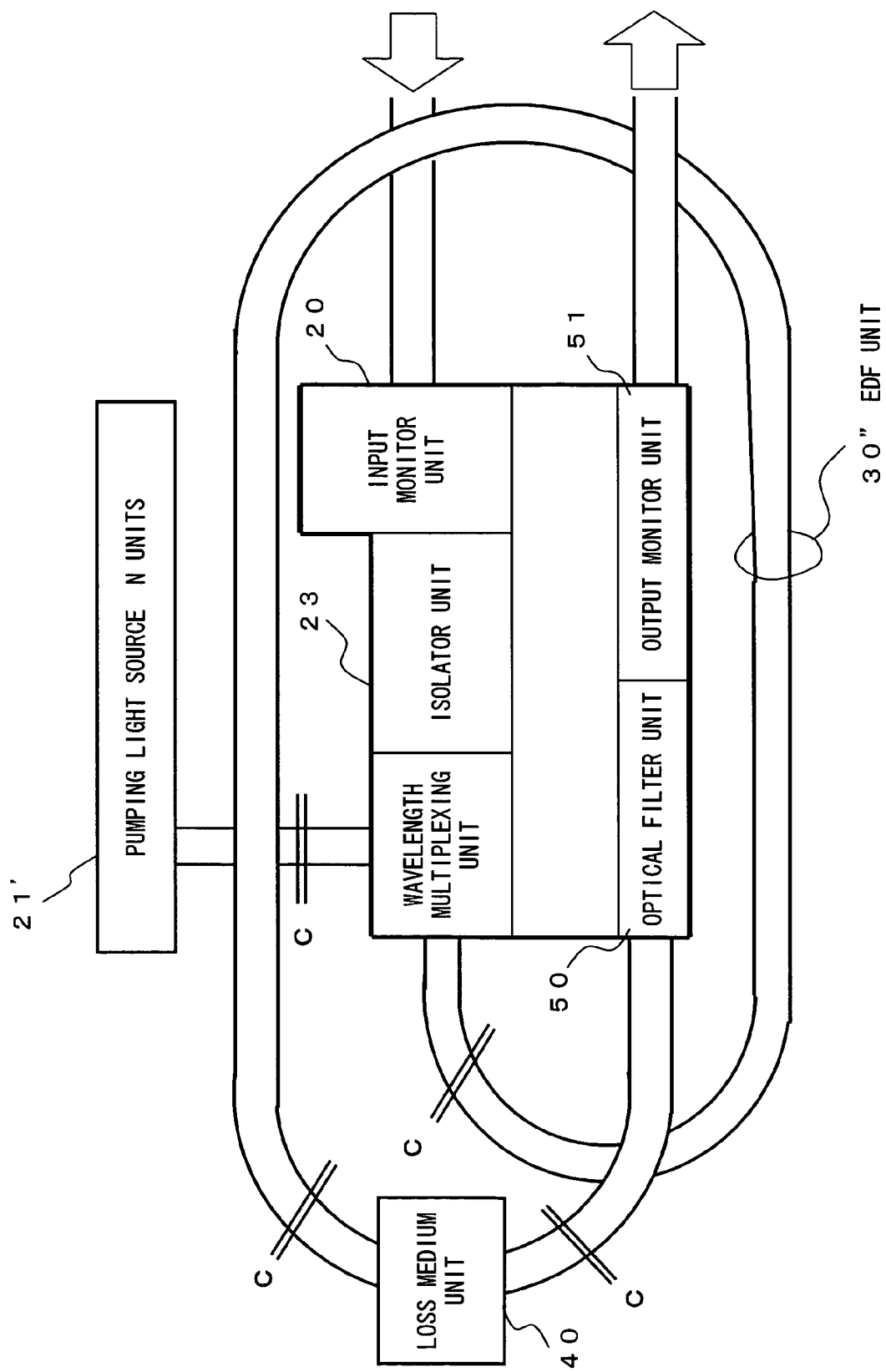
FIG. 26 shows an example of another configuration relating to the fourth embodiment of the present invention.

Regarding the input connector and the output connector not shown in FIGS. 25 and 26, for example, a multiple core ribbon fiber treated with a taping process provided with a well-known connector is preferable. The ribbon fiber is to be stored in the apparatus after shortening the length when a smaller apparatus is requested.

As for an available connector, a male-type connector which is supposed to be hardly damaged is to be used as necessary. The optical apparatus is connected to another component using a fan-out cord when the shape of the connector of the other component is a simple core. If it is a multiple core type, then a predetermined multiple core fiber cord is to be used.

Figure 28:
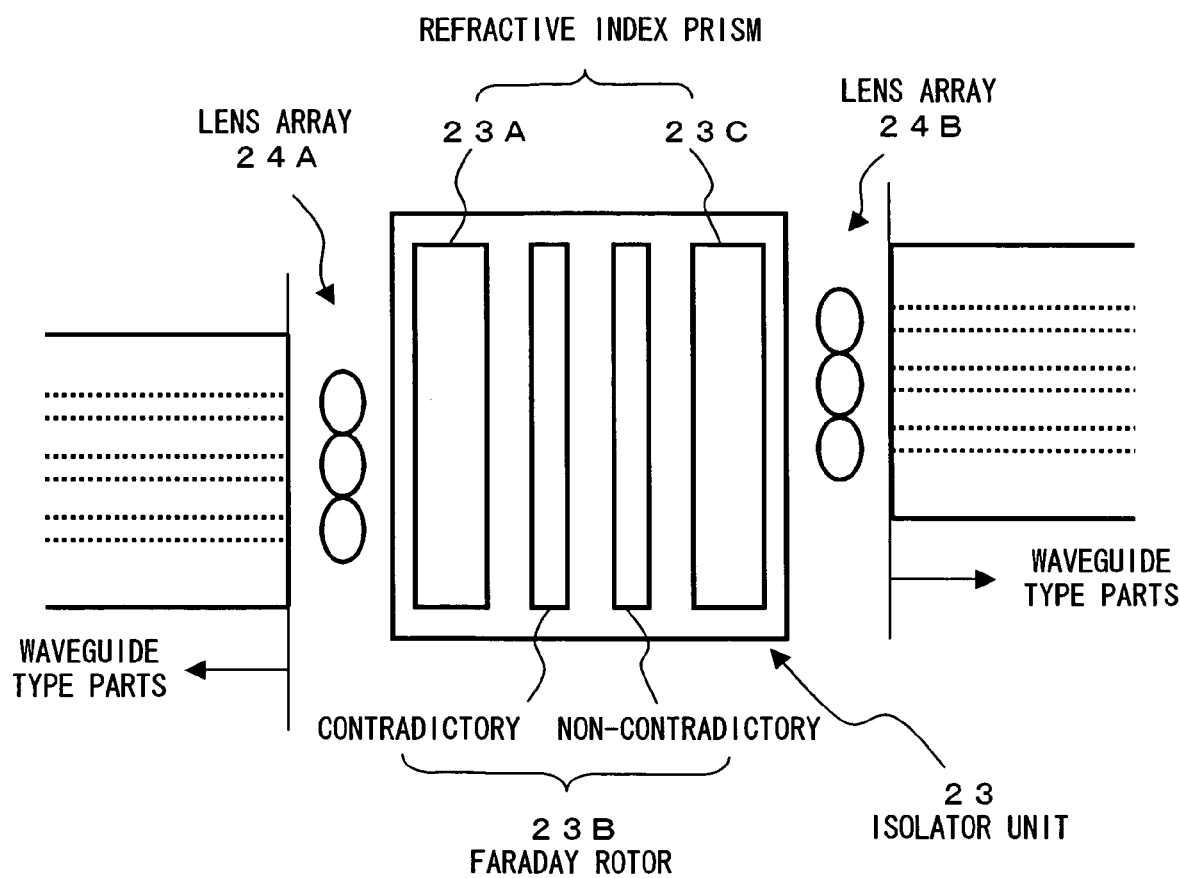
FIG. 28 is an explanatory view showing the method of connecting a spatial coupling type signal to a waveguide.

In the present embodiment, an isolator unit 23 which is one of the components of the waveguide type parts can be a spatial coupling type isolator when there are the problems of the amount of isolation, an insertion loss, etc. In this case, the connection between an input monitor unit 20 and the wavelength multiplexing unit 22 is made by, for example, spatially converging the light using lens arrays 24A and 24B as shown in FIG. 28. Practically, the light discharged from each of the output ends of a plurality of waveguides is collimated by the lens array 24A, transformed to parallel beams, and input to a predetermined position of a birefringence prism 23A of the isolator unit 23. The light passing through a Faraday rotor 23B and a birefringence prism 23C is converted to a predetermined position of the waveguide type parts by the lens array 24B. FIG. 28 shows an example of using a birefringence prism as a component of the isolator unit 23, but these parts can be polarizers.

Figure 29:
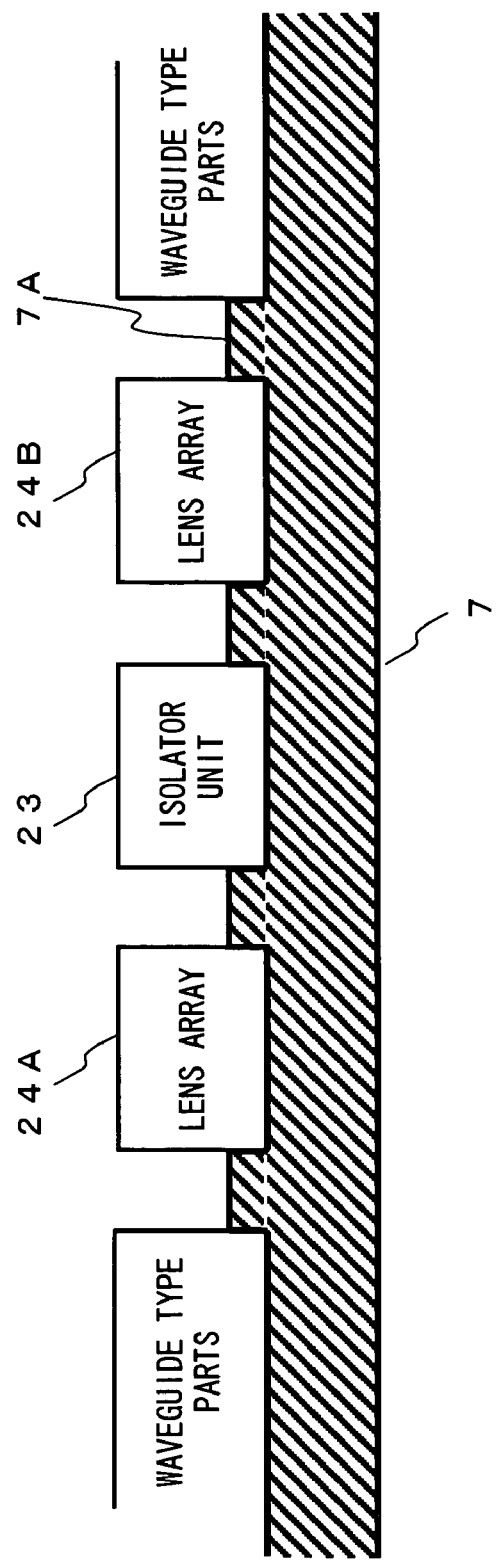
FIG. 29 shows an example of implementing, for example, an isolator shown in FIG. 20.

The method of implementing the above-mentioned isolator unit 23 and the lens arrays 24A and 24B before and after the isolator unit 23 is used by easily positioning each optical part using the substrate 7 having ratch 7A in a predetermined position as shown in FIG. 29.

As described above, according to the fourth embodiment of the optical apparatus, when rare earth element doped fiber such as an EDF, etc. is used as an amplification medium, the operation effect similar to that in the third embodiment can be obtained.

Described below is the fifth embodiment of the optical apparatus having the optical amplification capability of the present invention.

FIG. 30 shows the outline of the configuration of the optical apparatus according to the fifth embodiment.

In FIG. 30, at least two optical apparatuses (two in FIG. 30) according to the third and fourth embodiments are connected in series. Thus, by connecting in series a plurality of optical apparatuses having the loss compensation capability, the net gain can be improved, and the amount of loss to be compensated for in the entire apparatus is distributed to the optical amplifier at each stage, thereby reducing the NF or improving the efficiency for each optical amplifier.

Figure 31:
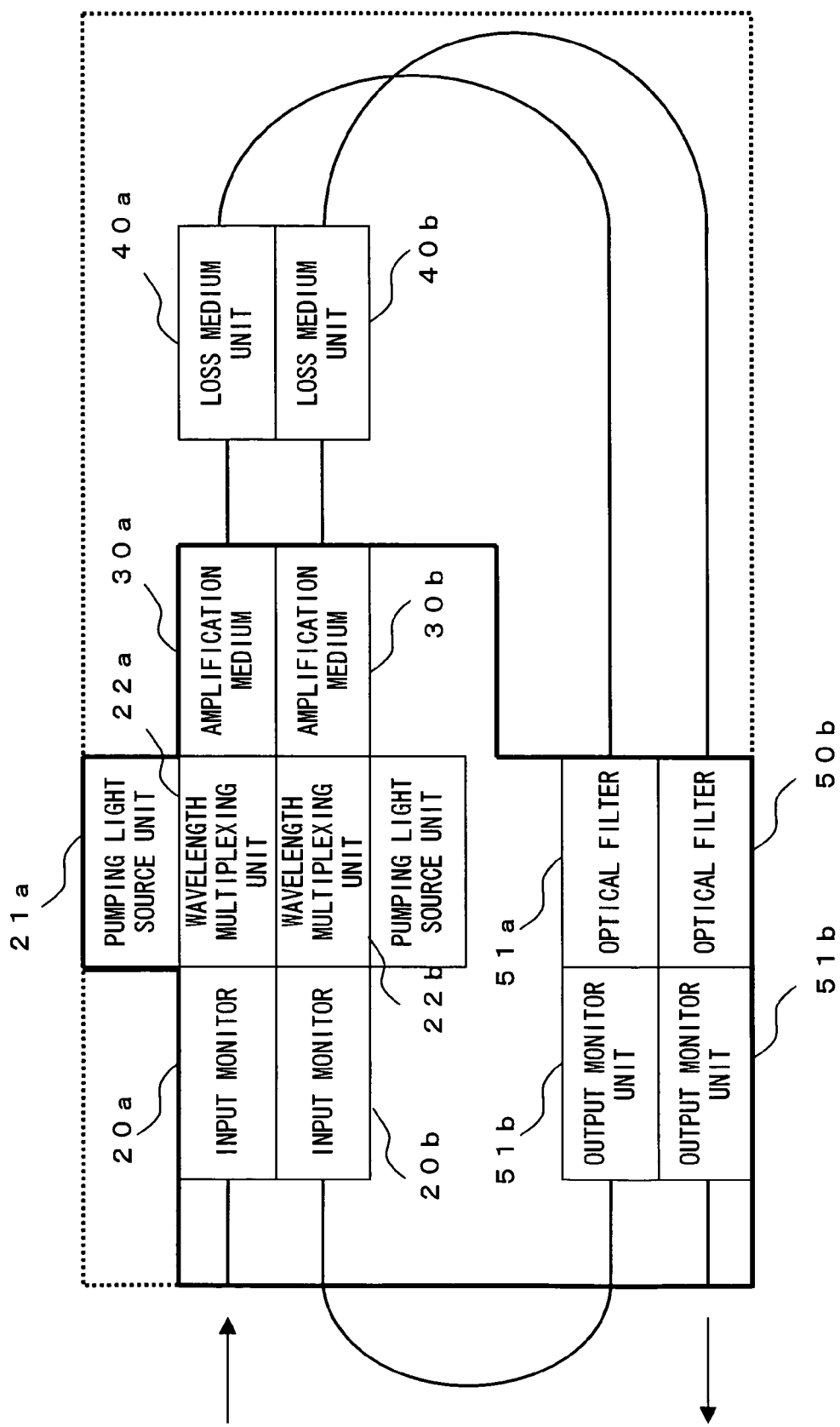
FIG. 31 shows another example of the configuration according to the fifth embodiment of the present invention.

In the above-mentioned fifth embodiment, the optical apparatus is configured by integrating a plurality of optical amplifiers for loss compensation corresponding to a plurality of loss media, and two or more optical apparatuses with the above-mentioned configuration are connected in series. However, for example, as shown in FIG. 31, in one optical apparatus, at least one of the input ports and output ports in the arrayed input and output ports are connected to serially connect all or a part of the configuration corresponding to each of the loss media connected in parallel so that the NF can be reduced or the efficiency can be improved.

Figure 32:
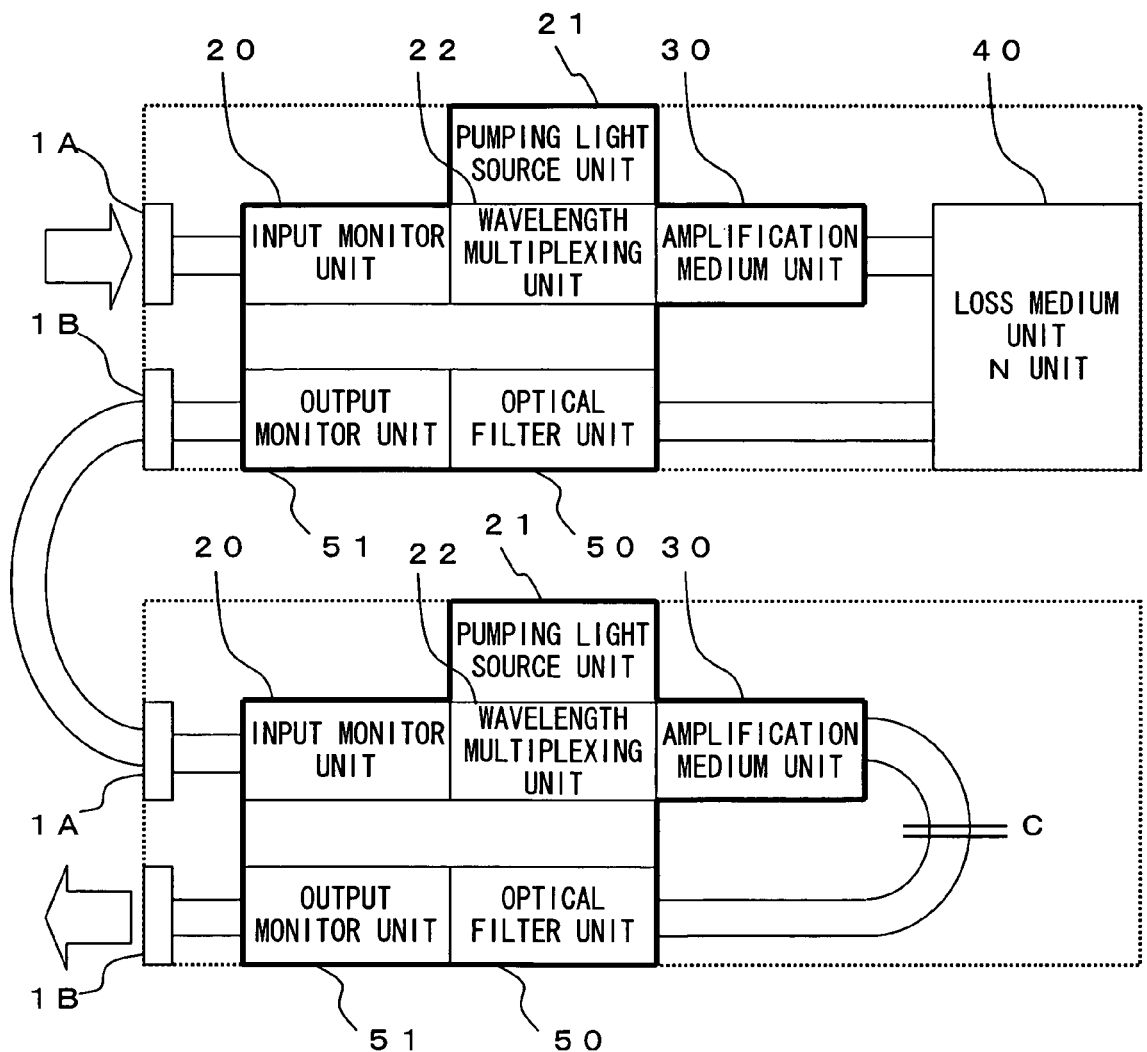
FIG. 32 shows a further example of the configuration according to the fifth embodiment of the present invention.

The optical apparatus integrated at each stage is configured to have a loss medium unit 40. However, for example, as shown in FIG. 32, where there is no compensation required for the loss medium, an a direct connection can be made between a amplification medium unit 30 and an optical filter unit 50 using the method of reserving a small amount of reflection attenuation. With the configuration, for example, when it is necessary to perform loss compensation for optical parts during the upgrade of a system, the loss compensation can be performed with the optical parts inserted to the position of the direct connection.

Described below is an application example of detecting a poor connection of a connector, etc. using the characteristic of the optical apparatus according to the present invention in an optical communications system using the optical apparatus according to each of the above-mentioned embodiments.

With a connector used in connecting various apparatuses in the optical apparatus, when a fault occurs in a connection state by dust on the end face, a connection loss and the amount of reflection attenuation are considerably reduced. If the system is operated in the status, the optical amplifier is operated with excessive specifications to compensate for the increment for the connection loss, thereby causing the problem of raising the cost from excessive pumping light power.

To solve the above-mentioned problems, the characteristic of the optical apparatus in each of the above-mentioned embodiments is used to detect the poor state at the connection point. That is, the present optical apparatus is not provided with an isolator on the output side of the amplification medium. Therefore, a high gain for a predetermined amount of reflection attenuation generates an oscillation operation, and the oscillation operation causes gain reduction, NF reduction, the output fluctuation in time. Therefore, by monitoring any of the above-mentioned phenomena, a poor connection of a connector can be detected.

Figure 33:
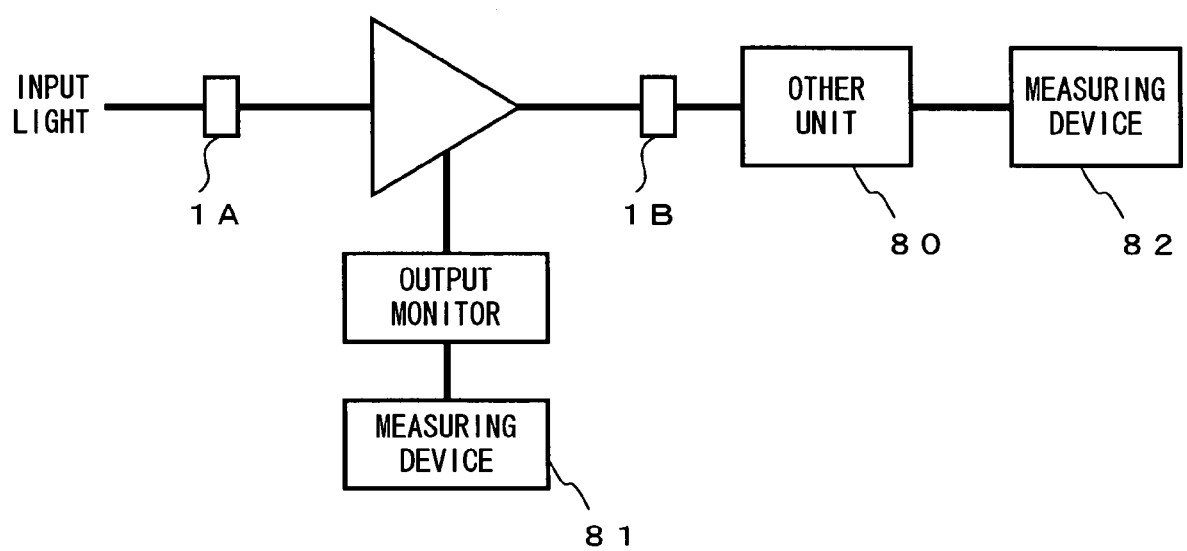
FIG. 33 is an explanatory view showing an example of an application of detecting a poor connection of a connector in the optical communications system using the optical apparatus according to the present invention.

Practically, as shown in FIG. 33, the signal monitored by an output monitor of the present optical apparatus is transmitted to a measuring device 81, or an optical signal which is output from the present optical apparatus and passes through another unit 80 is transmitted to a measuring device 82, and the stability of the output light level in time is measured. When the output fluctuation due to an oscillation phenomenon is detected, a poor connection of the output connector 1B between the optical apparatus and the other unit 80 is determined. The above-mentioned measuring devices 81 and 82 can be used with an oscilloscope for receiving an electric signal, and with an optical spectrum analyzer and an optical power meter for receiving an optical signal. The response is to be about 1 kHz.

Figure 34:
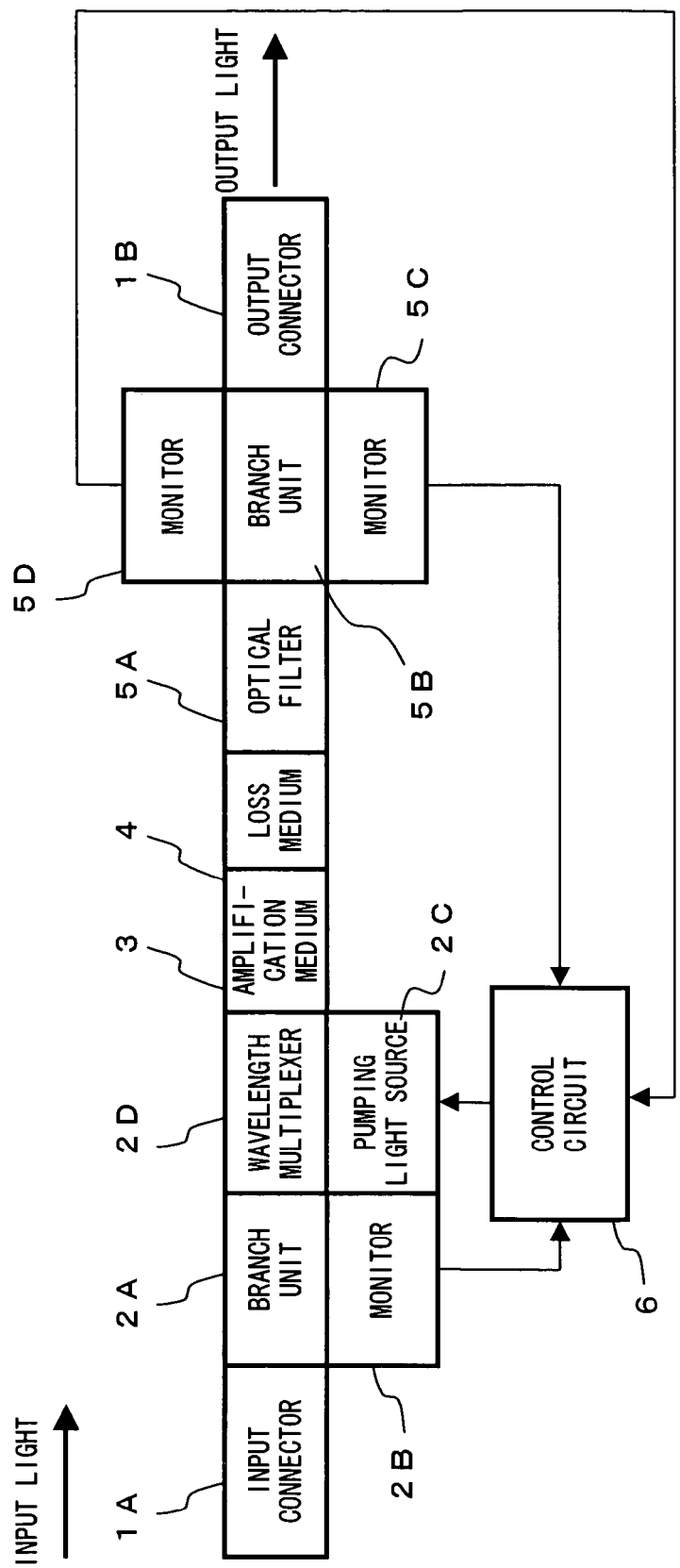
FIG. 34 is an explanatory view showing an example of an application of an output monitor relating to each embodiment of the present invention.

In the optical apparatus according to each of the above-mentioned embodiments, the gain is controlled by adjusting the drive status of a pumping light source based on the monitor result of each monitor on the input side and the output side. However, for example, as shown in FIG. 34, a monitor 5D for monitoring the power of light reflected and returned on the end face of the output connector 1B can be provided to safely control the laser by adjusting the drive status of the pumping light source by determining the poor connection of the connector depending on the monitor result. It is also possible to detect an input disconnection depending on the monitor result of the monitor on the input side.

Described below is the technology proposed by the present invention which is used in integrating optical elements.

Figure 35:
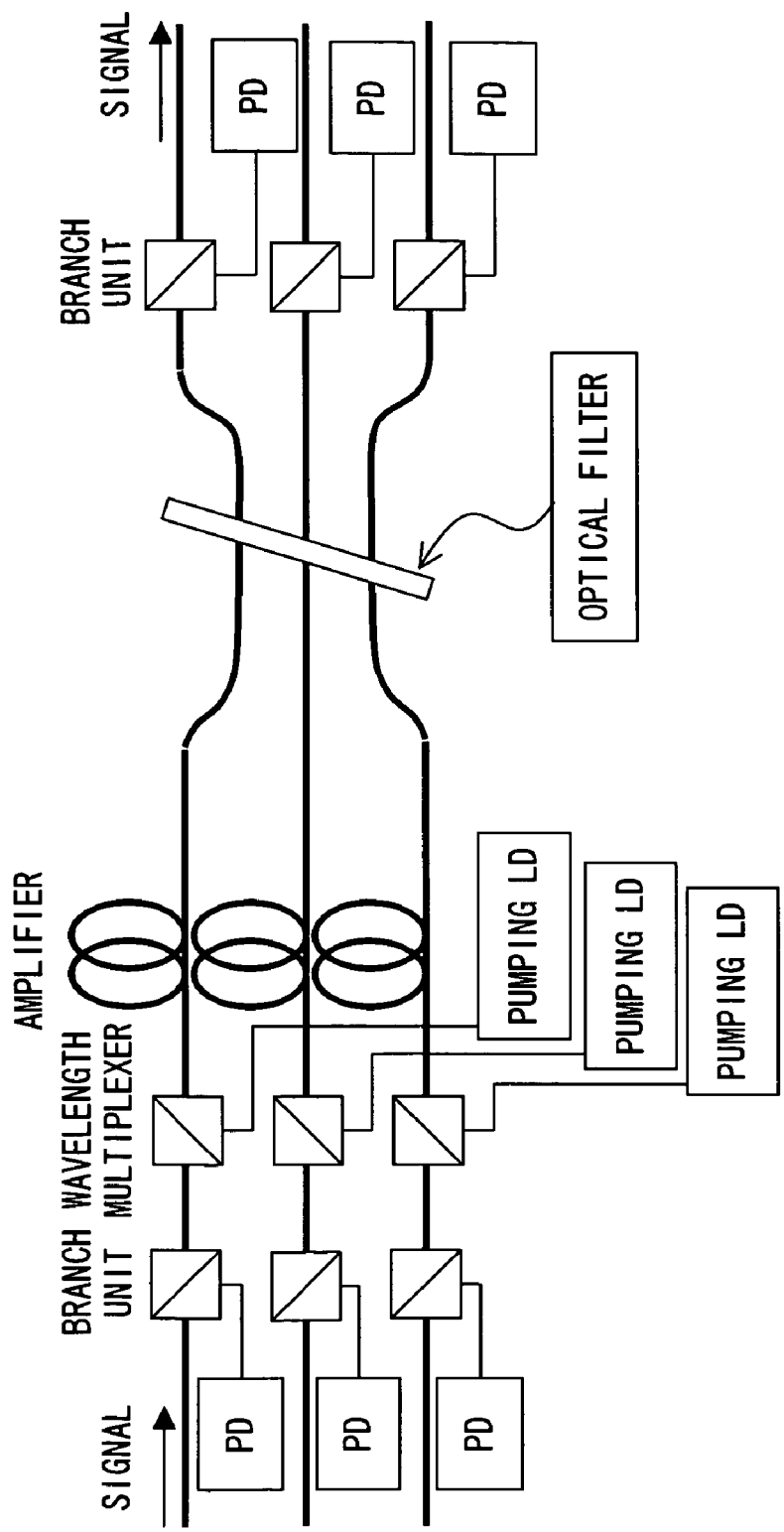
FIG. 35 shows an example of the configuration of a common array type optical amplifier with backpumping taken into account.

FIG. 35 shows an example of the configuration of a common optical amplifier for forward pumping.

In the case of backpumping, a pumping light cutoff filter is arranged in the position of cutting off the pumping light leaking to the signal light monitor on the input side. In the case of bidirectional pumping, a pumping light cutoff filter is arranged in the position of cutting off the pumping light leaking to the input/output monitor.

In the case of an optical amplifier of an array type configuration, an optical filter is a reflective film filter for cutting off pumping light for easy cost reduction, downsizing, and production. Thus, a groove is made in the optical waveguide for collective insertion.

To control the optical amplifier with constant gain and output, it is necessary to monitor an input/output signal with high precision. A factor to enhance the crosstalk of a signal monitor can be leaking light of pumping light which is not absorbed by the amplification medium. The leaking light of the pumping light cannot be ignored as compared with signal light, and the light has to be cut off before the monitor. Conventionally, an optical filter using the reflective film as shown in FIG. 35 has been used. However, when the optical amplifier is arrayed, there occurs the problem that the crosstalk increases by the leak to another port during cutoff.

Figure 36:
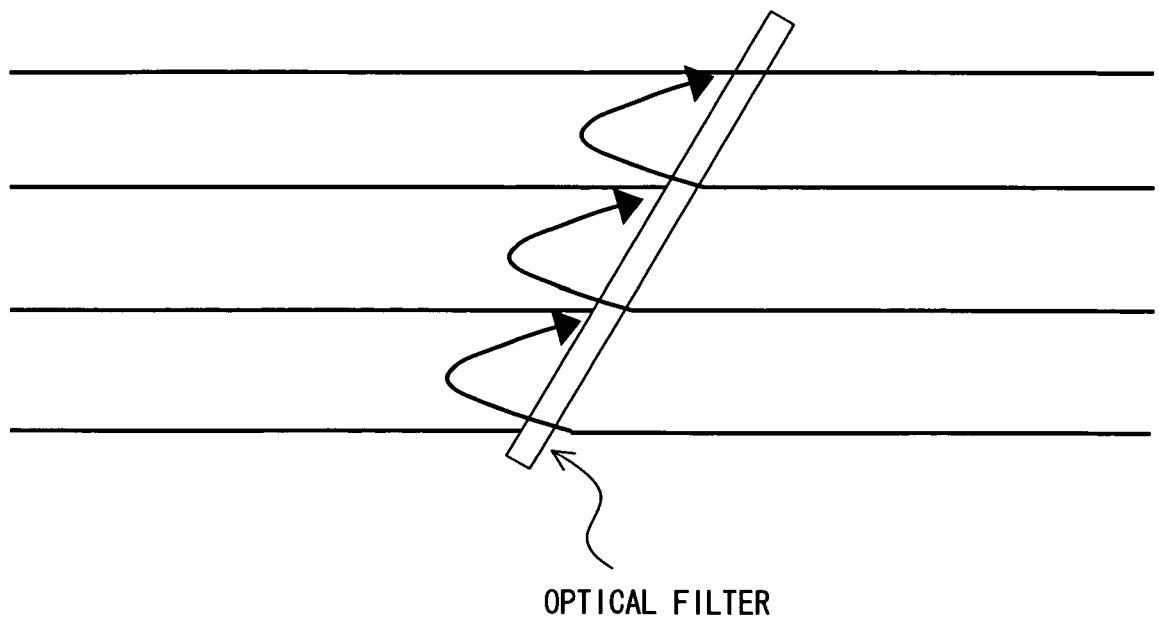
FIG. 36 is a schematic diagram showing the status in which a crosstalk occurs from leakage light to another port.

FIG. 36 is a schematic diagram showing the process of generating crosstalk by the light leak to another port. As shown in FIG. 36, the light cut off by the optical filter is reflected by the optical filter. The reflected light leaks from the arrayed waveguide into the substrate, and enters the adjacent waveguide. Thus, with the configuration in which a conventional optical filter is used, there is a problem of crosstalk.

An effective method for solving the problem is to use a waveguide doped with an element (ytterbium, etc. for 980 nm) absorbing pumping light for an optical filter. For example, refer to Japanese Patent Application Laid-open No. Hei 4-11830.

FIG. 37 shows the configuration of the arrayed optical amplifier doped with an element absorbing pumping light instead of an optical filter. As shown in FIG. 37, an optical waveguide doped with an element absorbing pumping light in the position in which an optical filter is arranged in FIG. 35.

However, when a waveguide doped with an element which absorbs pumping light is used as an optical filter, there are the problems of absorption saturation and fluorescence.

Figure 38:
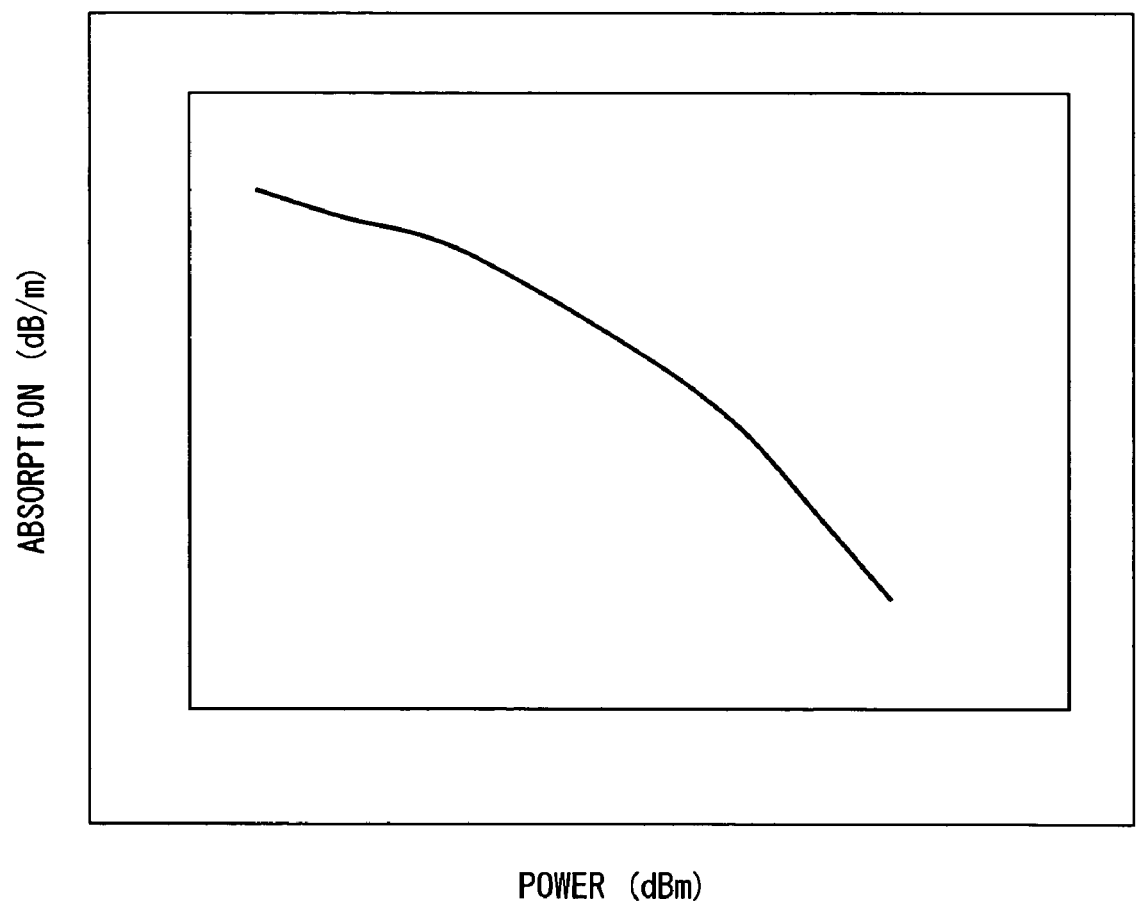
FIG. 38 shows the amount of absorption of a light-absorbing element plotted relative to the intensity of an incident light.
Figure 39:
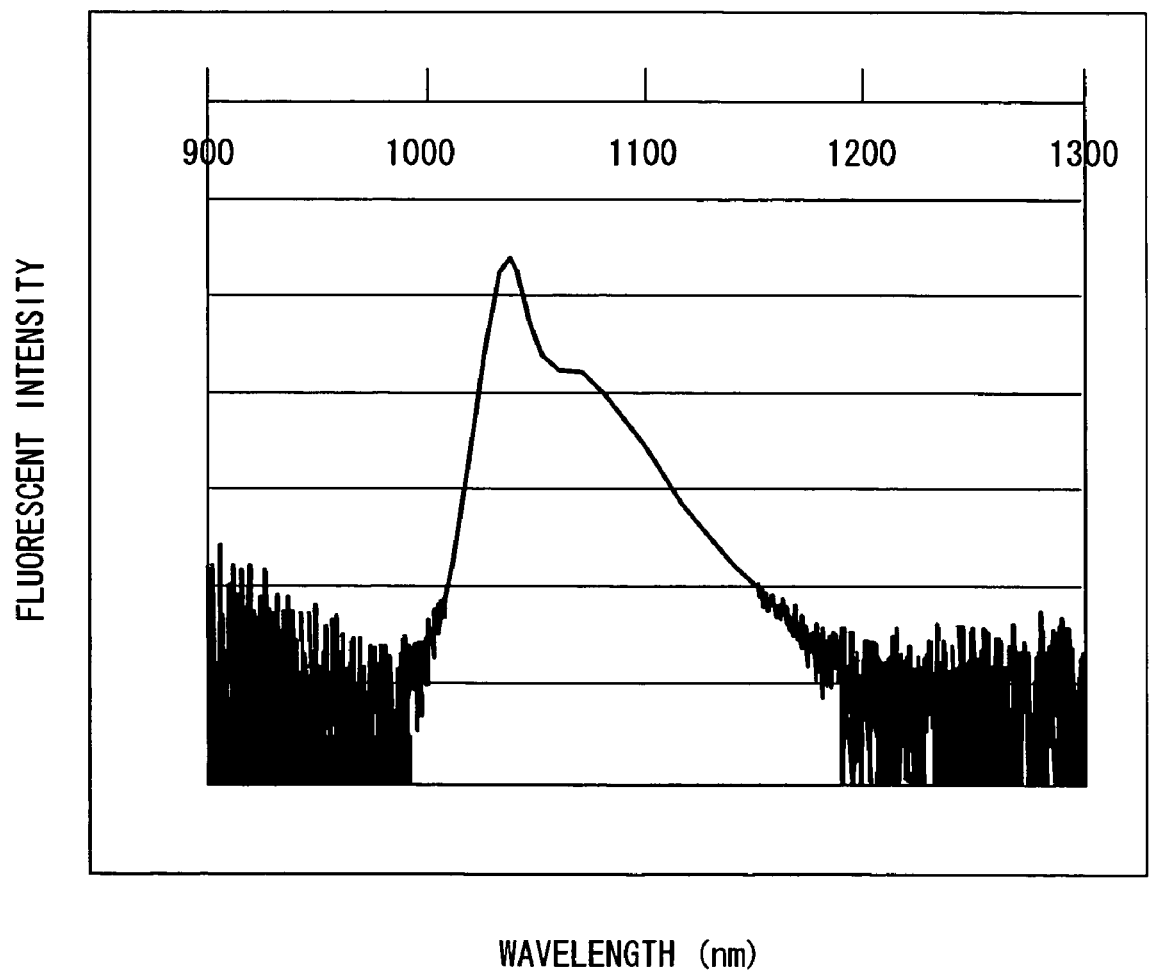
FIG. 39 shows the spectral distribution of fluorescent by defining the wavelength along the horizontal axis and the fluorescent intensity along the vertical axis.

FIG. 38 shows the absorption saturation. FIG. 38 shows a plot of the amount of absorption of a light absorbing element relative to the intensity of the input light. When the light intensity increases as shown in FIG. 38, the amount of absorption decreases by the nonlinear phenomenon. FIG. 39 shows the state of the fluorescence. FIG. 39 shows the wavelength along the horizontal axis and the fluorescent intensity along the vertical axis to indicate the spectral distribution of fluorescence. When ytterbium is used as an absorbing element, pumping light of 980 nm can be absorbed, but the light having the peak around 1030 nm is emitted as shown in FIG. 39. Although the pumping light is cut off, the problem of the noise light of fluorescence is generated.

There also is the planar lightware circuit (PLC) technology for downsizing optical parts. The PLC technology can collectively form a plurality of optical waveguides on the substrate in a small area. Therefore, it is appropriate for an array configuration (example of the conventional technology for integration using the PLC of an optical amplifier: Japanese Patent Application Laid-open No. Hei 11-5214). However, unlike fiber, a PLC has a large leak between optical waveguides (ports). Therefore, the problem of the crosstalk between the ports of the monitor by the pumping light is definite.

Figure 40:
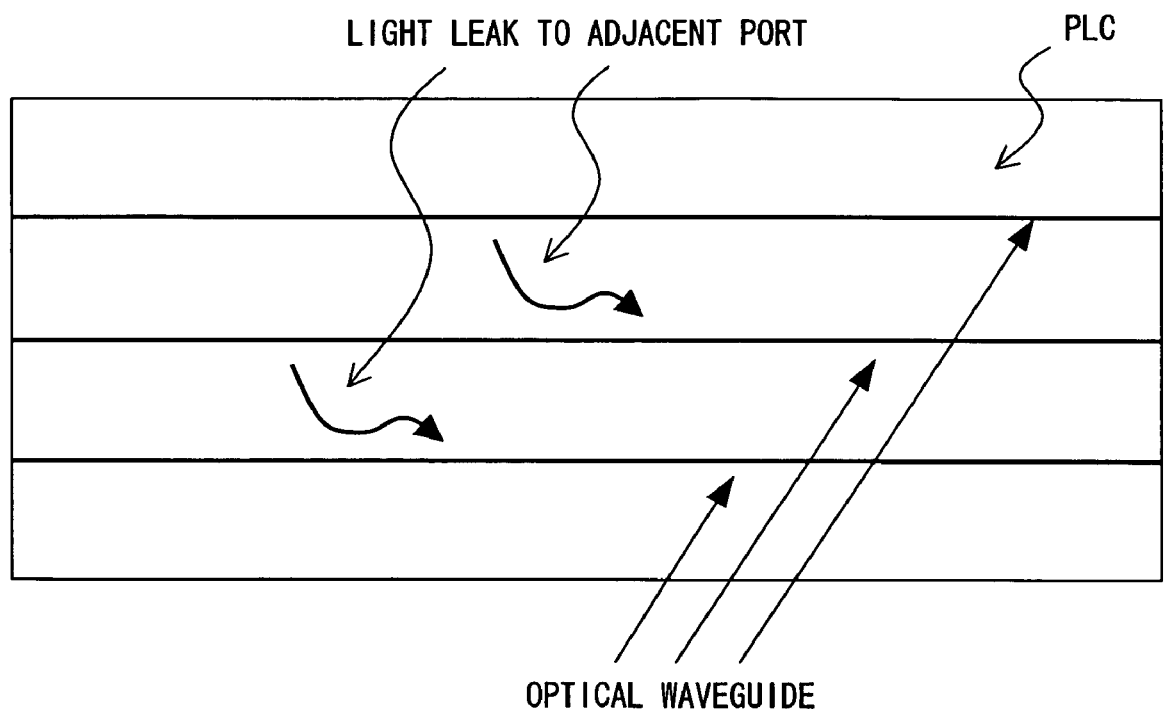
FIG. 40 is a schematic diagram showing the status in which leakage light occurs into an adjacent port of light in the optical waveguide generated by the PLC technology.

FIG. 40 is a schematic diagram of the state of the occurrence of the light leak to the adjacent port in the optical waveguide generated by the PLC technology. That is, the arrayed optical waveguide cannot completely enclose the light, and a small amount of light leaks to the adjacent port through the substrate. Therefore, the embodiments of the present invention aims at solving the problems of monitor crosstalk using an optical waveguide or a substrate doped with an element which absorbs pumping light.

As the first means for moderating the light emission by the absorption saturation and the pumping light absorbing element, a method of reducing the light-emission efficiency by an NA (numerical aperture), which is an optical waveguide parameter, and a cutoff wavelength is used. Reducing the light-emission efficiency also has the effect of moderating the absorption saturation. The second means is a method of forming a fiber black grating in an optical waveguide doped with an element which absorbs pumping light.

The first means is explained below.

Figure 41:
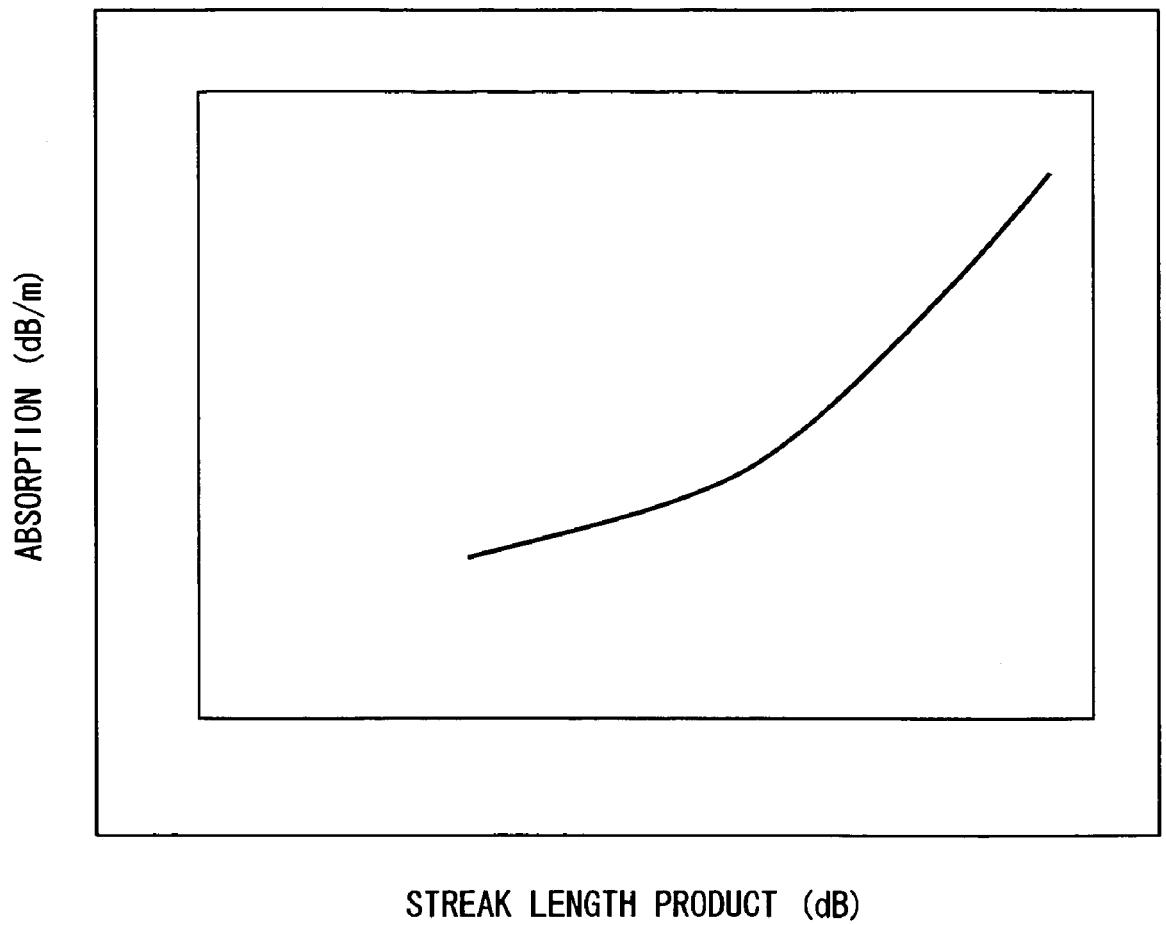
FIG. 41 shows the relationship between the amount of absorption per unit length, with the absorption saturation when the intensity of the pumping light is A dBm taken into account, and the streak length product.

FIG. 41 shows the relationship between the amount of absorption and the streak length product per unit length with the absorption saturation in the pumping light intensity of A dBm taken into account. The streak length product refers to a product of the amount of absorption (dB/m) having no absorption saturation and the length of a waveguide. When the streak length product increases, the absorption saturation is moderated and the amount of absorption can increase. The streak length product depends on the parameters of the amount of dope (determining the amount of absorption when no absorption saturation occurs) and the length of a waveguide.

A parameter for reduction of fluorescence can be the NA of an optical waveguide and the cutoff wavelength.

Figure 42:
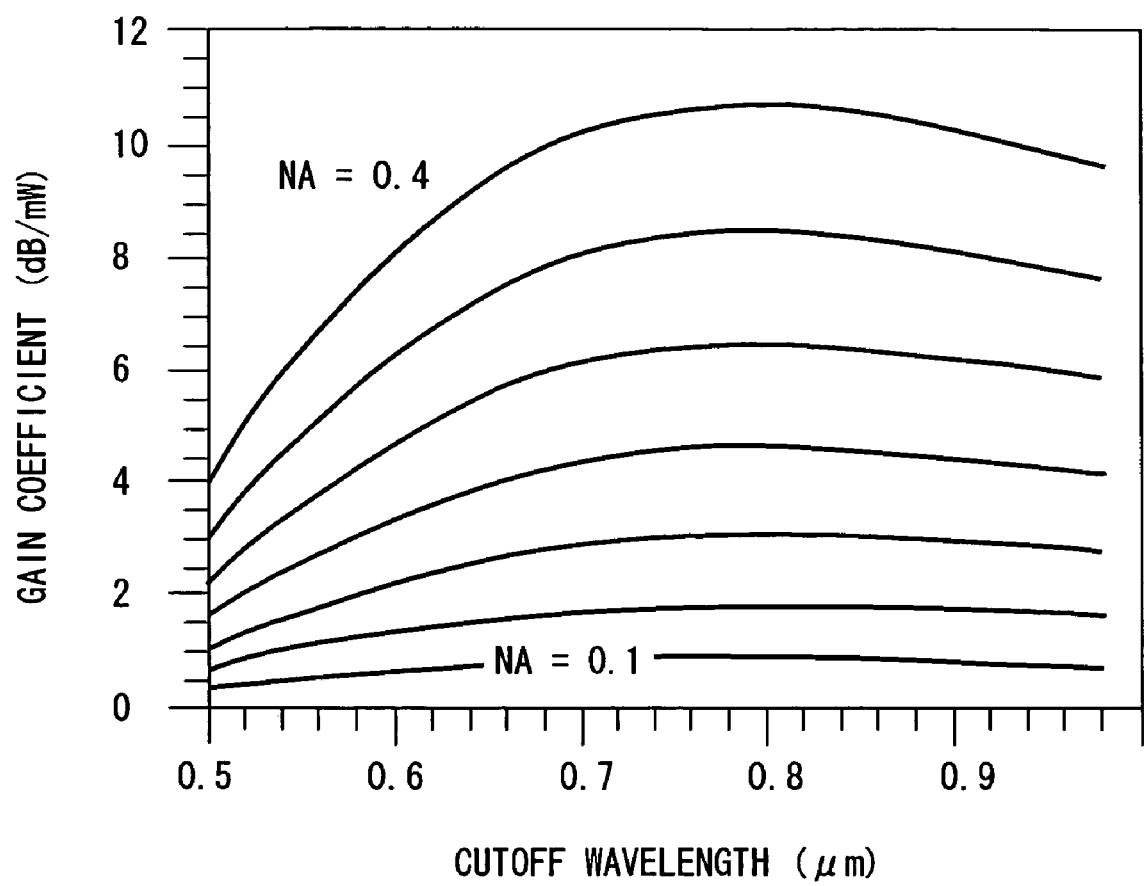
FIG. 42 shows the gain (980 nm pumping) for the cutoff wavelength.

FIG. 42 shows a gain (980 nm pumping) for the cutoff wavelength (according to Anders Bjarklev "OPTICAL FIBER AMPLIFIERS Design and system Applications" Artech House).

Generally, since the gain rate is proportional to the light-emission efficiency, the gain rate can be reduced by lowering the NA shown in FIG. 42 or by setting the cutoff wavelength as a longer wavelength, thereby moderating the light emission. Furthermore, moderating the light emission also refers to moderating the absorption saturation. That is, the fluorescence or the light-emission is generated when a number of electrons of an element gather at higher ordinal levels of the element and the electrons drop to lower ordinal levels of energy. Moderating the light emission refers to decreasing the number of electrons at higher ordinal levels. The absorption of light occurs when electrons at lower ordinal levels transfer to higher ordinal levels by the energy of the light. The absorption saturation occurs by a smaller number of electrons at lower ordinal levels. Therefore, by setting a state in which a number of electrons gather at lower ordinal levels, the fluorescence can be reduced, and the absorption saturation can be moderated.

Figure 43:
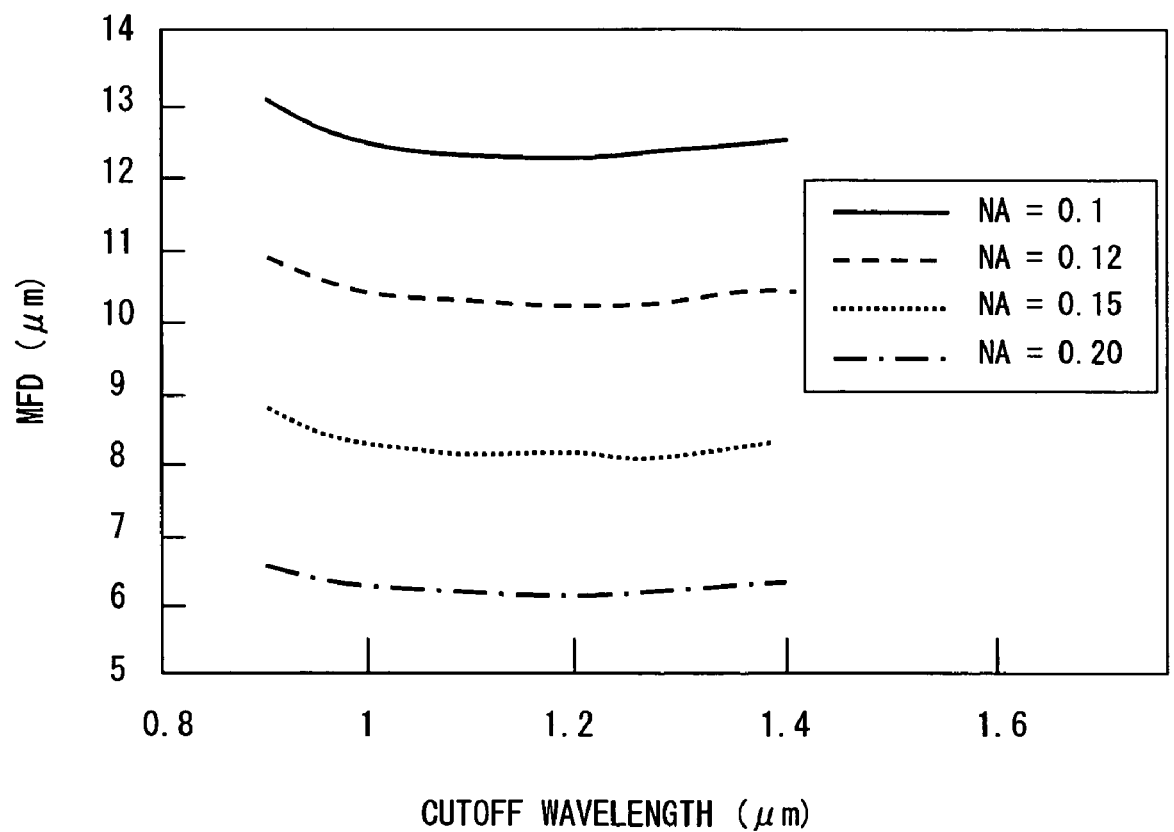
FIG. 43 shows the relationship among the NA, the cutoff wavelength, and the 1550 nm MFD.

An NA and a cutoff wavelength are parameters for determining the mode field diameter (MFD). FIG. 43 shows the relationship between the NA, the cutoff wavelength, and the MFD of 1550 nm.

As shown in FIG. 43, the MFD depends mostly on the NA. The MFD of signal light is to be 10 μm or less with the connection between an amplification medium and other optical parts taken into account. In this embodiment, the NA is to be large enough to set the MFD as 10 μm or less to moderate the fluorescence, the cutoff wavelength of an optical waveguide shifted to a longer wavelength is used within a scope of no influence on the signal light, the absorption saturation is considered based on the streak length product, and the optical waveguide determining the amount of dope of an absorbing element is used as an optical filter.

On the condition shown in table 3, when the optical amplifier is operated, a required amount of absorption of an absorption medium is checked. Table 4 shows the result of the check.

TABLE 3

| Wave Length | 1530 nm |
| Pumping Method | 980 nm forward pumping |
| Pumping Light Intensity | 80 mW |
| Amplification Medium | Erbium Doped Fiber (EDF) |
| Length of Amplification Medium | 4 m |

TABLE 4

| input signal (dBm) | output signal (dBm) | gain (dB) | NF (dB) | leak of pumping light (dBm) | required amount of absorption (dB) |
| --- | --- | --- | --- | --- | --- |
| −30 | 8.01 | 38.01 | 3.69 | 14.53 | 26.5 |
| −20 | 11.88 | 31.88 | 3.45 | 12.99 | 21.11 |
| −10 | 13.40 | 23.40 | 3.46 | 10.83 | 17.43 |
| 3 | 14.47 | 11.47 | 5.15 | 7.84 | 13.37 |

Assume that the ratio of the output signal to the leak of pumping light is 20 db or more, and required amount of absorption is calculated. When the operation of an input signal −20 dBm or more is assumed, the required amount of absorption is 21.11 dB.

The second means is explained below.

Figure 44:
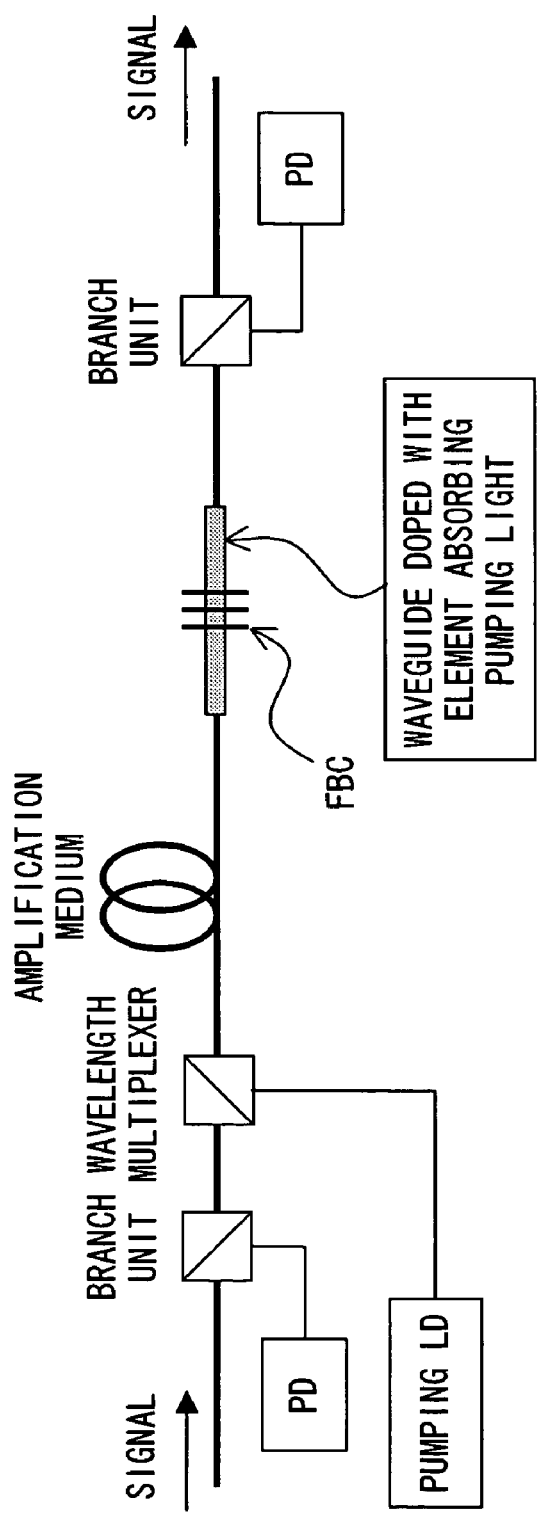
FIG. 44 shows the configuration according to the embodiment by the second means.

To solve the problem of the absorption saturation and the fluorescence, a fiber black grating (FBG) is formed to allow part of pumping light to be reflected by the optical waveguide doped with an element which absorbs pumping light. FIG. 44 shows the configuration to which the second means is applied. By forming the FBG in an absorption medium, part of the leak of pumping light can be reflected, thereby moderating the fluorescence. When the leak of pumping light is large enough to cause fluorescence, the fluorescence is amplified in the longitudinal direction, and oscillation finally occurs. However, when the leak of pumping light is small, the optical waveguide doped with an element which absorbs pumping light does not function as an amplification medium for the emitted light, but as a loss medium. Therefore, allowing part of the leak of pumping light to be reflected using the FBG has the effect of moderating the fluorescence. With the configuration in which the FBG reflects not only the pumping light but also emitted light, the crosstalk of the monitor due to light emission can be reduced.

When the leak of pumping light is reflected by the FBG, and when return pumping light returns to the pumping LD again, the central wavelength fluctuation and output fluctuation occur due to the spectrum change of the pumping LD. Generally, the return light with which the pumping LD stably operates is assumed to be −12 dB or less for the output light of the pumping LD. Therefore, it is necessary to optimize the reflectance to stabilize the operation of the pumping LD.

Figure 46:
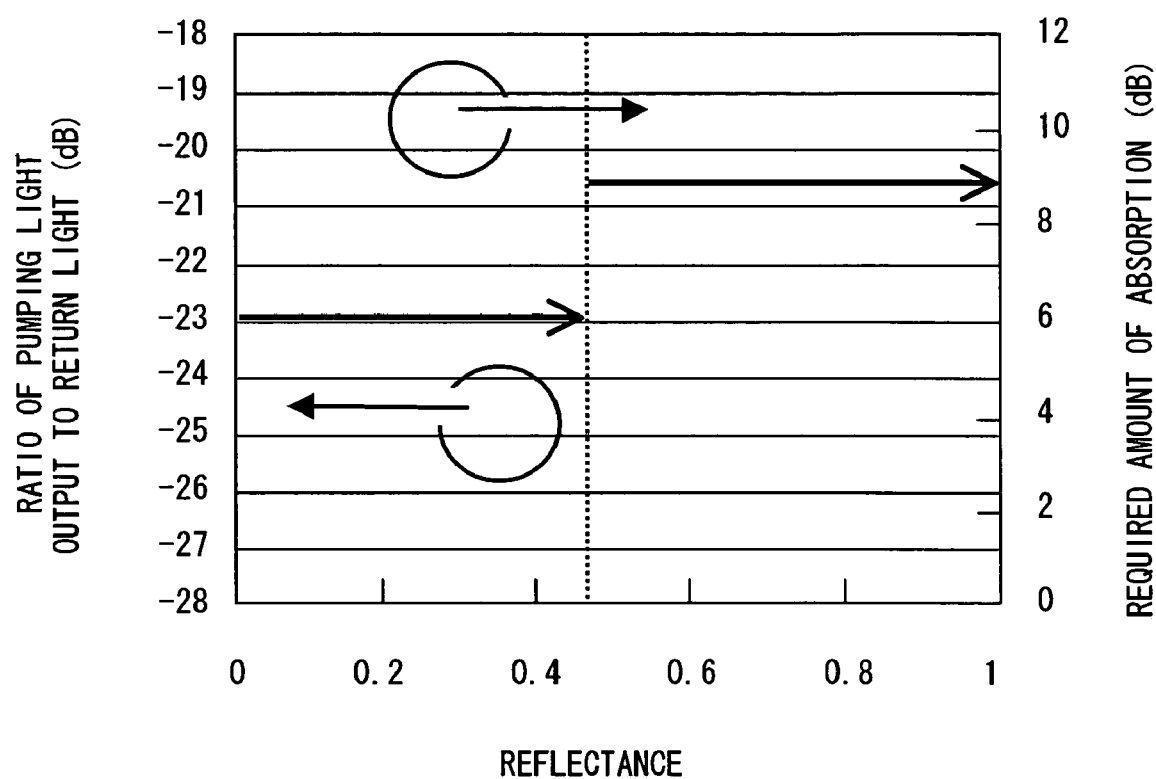
FIG. 46 is a graph showing the pumping light return light/pumping light output and a change of an amount of absorption of a required absorption medium.

The method of designing the reflectance is described below. FIG. 45 is a graph showing the calculated leak of pumping light with the efficiency of the FBG to the reflectance and the reflection of part of leak of pumping light by the FBG taken into account. The EDF is used as an amplification medium, and the length of the EDF is 4.5 m. The pumping light is 980 nm, 80 mW, the input signal wavelength 1530 nm, and the input signal intensity −3 dBm. FIG. 46 is a graph showing the change of the return pumping light/pumping light output, and the required amount of absorption of the absorption medium relative to the reflectance.

As shown in FIG. 46, the reflectance 0.45 for satisfying the return light −23 dB with which the pumping LD can stably operate is obtained, and set the value as the reflectance of the FBG. At this time, the leak of pumping light is 2.3 mW, and the required amount of absorption is 8.8 dB.

For the light emitted by mounting the FBG, the waveguide does not function as an amplification medium, but moderates the fluorescence. Moderating the fluorescence refers to the moderation of the absorption saturation, and can increase the amount of absorption. Furthermore, since the pumping light recovers the function of the amplification medium in a range in which the pumping LD stably operates, the efficiency of the optical amplifier can be improved as shown in FIG. 45 (Japanese Patent Application No. Hei 1-159736).

Described below is the third means.

The deactivator is co-doped to reduce the absorption saturation of the absorption medium. Thus, the absorption efficiency can be improved.

When the optical waveguide doped with ytterbium (Yb) is used as an absorption medium, terbium (Tb) can be co-doped to moderate the absorption saturation, and the sufficient absorption can be guaranteed −although the leak of pumping light at a high level (power) is input to the absorbing fiber.

The absorption saturation is caused by short of electrons at base ordinal levels by pumping.

Figure 47:
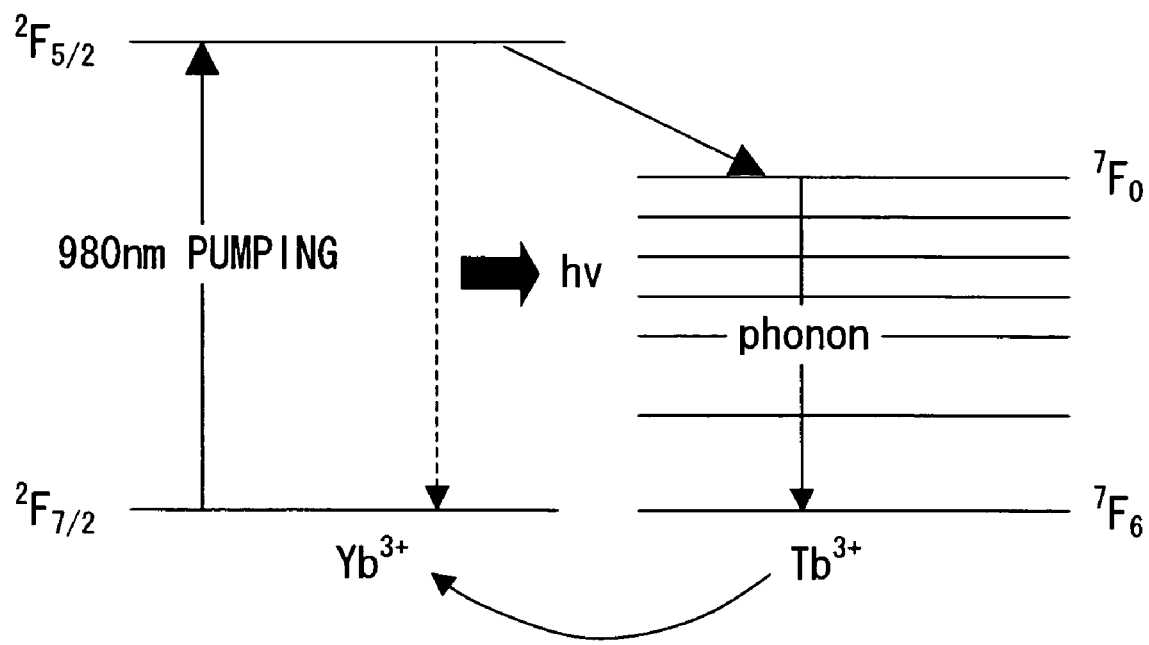
FIG. 47 is an explanatory view showing the fluorescence by the co-doping of a deactivator and the moderation of absorption saturation.

FIG. 47 is an explanatory view showing the moderation of the fluorescence and the absorption saturation by co-doping the deactivator. As shown in FIG. 47, when Yb is used, electrons of $^2F7/2$ are absorbed to $^2F5/2$ by the pumping light of 0.98 µm. When Tb is co-doped as a deactivator, the electrons of $^2F5/2$ are changed to $^7F0$ of Tb, and emit phonons at a base ordinal level for moderation, thereby compensating for the electrons at the base ordinal level. Since the electrons of $^2F5/2$ are changed to $^7F0$, the light emission from $^2F5/2$ to $^2F7/2$ can also be deactivated.

Described below is the fourth means.

Figure 49:
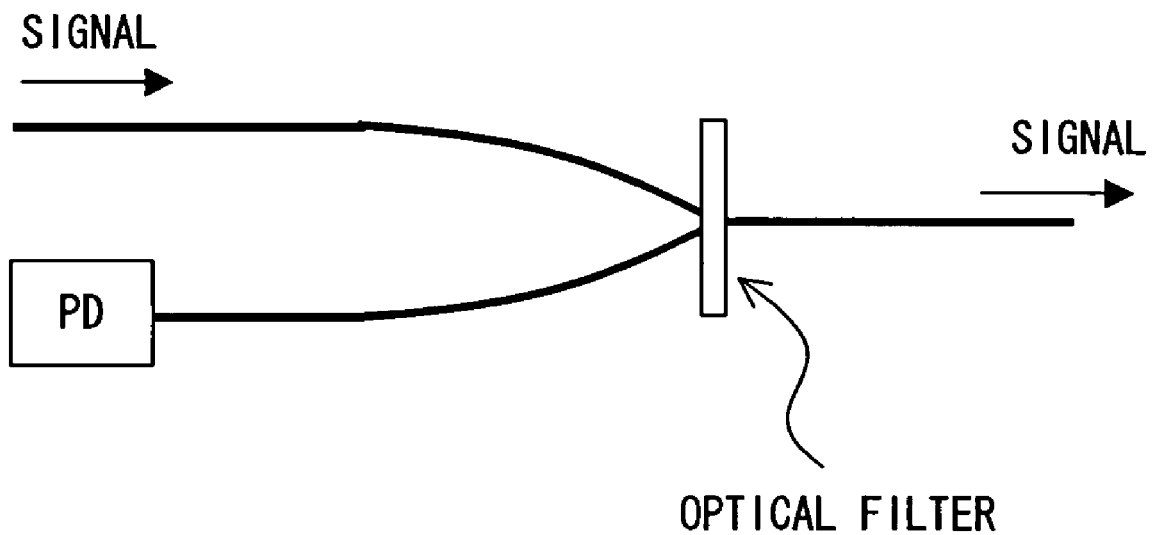
FIG. 49 shows a configuration in which an optical fiber is used as an optical waveguide and a multilayer film partially reflecting signal light is used as a branch unit.

The monitor unit of the optical amplifier has the configuration as shown in FIGS. 48 and 49. FIG. 48 shows a branch unit using a directive coupler, and FIG. 49 shows a multilayer film partly reflecting signal light used as a branch unit. Optical fiber is used as an optical waveguide.

For an optical amplifier, it is necessary to insert an optical filter for cutting off the leak of pumping light to lower the crosstalk of the signal light and the leak of pumping light.

Figure 50:
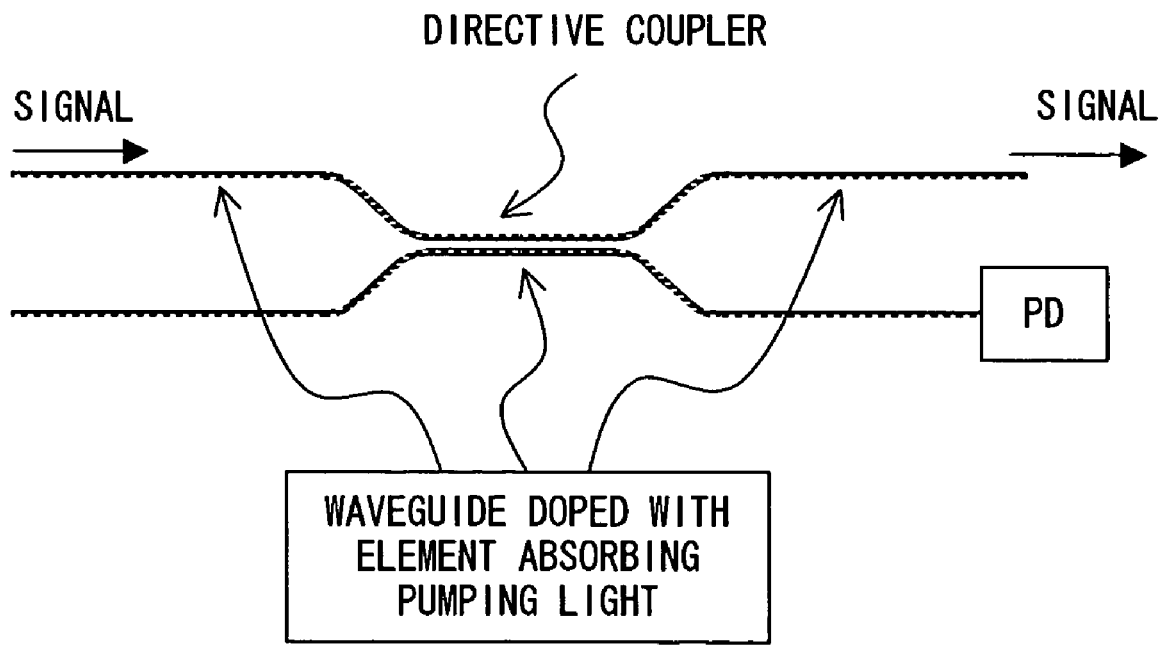
FIG. 50 shows an example of a signal light monitor using a directive coupler.

The fourth means configures an optical amplifier having a monitor using the optical fiber doped with an element which absorbs the same wavelength band as the pumping light as a branch unit as shown in FIG. 50.

FIG. 50 shows an example of a signal light monitor using a directive coupler. The monitor can also be applied to an optical monitor using a reflective film shown in FIG. 49.

Figure 51:
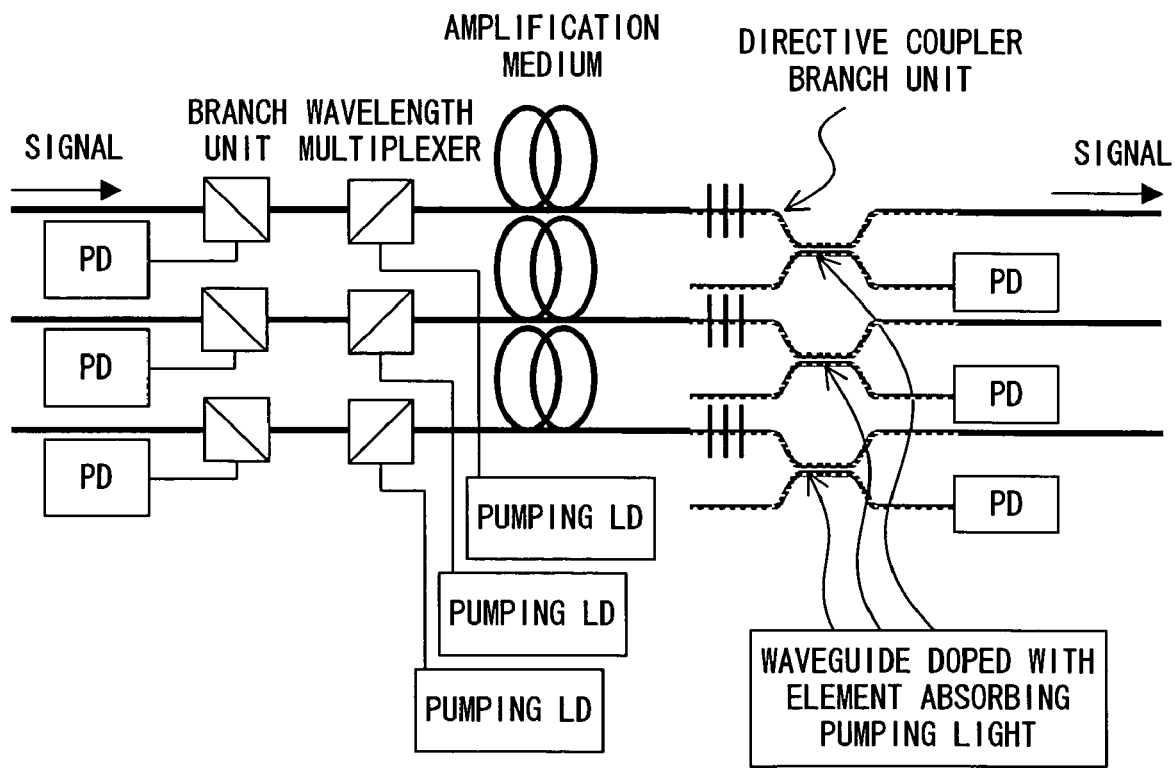
FIG. 51 shows an embodiment of an optical amplifier in which a forward pumping light amplifier is arrayed, a pumping light absorption medium is an optical waveguide, and an optical monitor (FIG. 50) is an output monitor.

FIG. 51 shows an embodiment of an optical amplifier using an optical monitor (FIG. 50), which uses has a forward pumping light amplifier in an array and a pumping light absorption medium as an optical waveguide, as an output monitor. The second means is used to moderate the absorption saturation and the fluorescence in FIG. 51, but the first or third means can be used. For backpumping, the optical monitor is used as an input monitor because the pumping light leaks to the input monitor. For bidirectional pumping it is used as an input/output monitor. By configuring the optical amplifier as shown in FIG. 51, the bottom crosstalk of the signal light monitor can be realized, and the optical filter and the branch unit can be integrated, thereby downsizing the optical amplifier.

Described below is the fifth means.

Currently, there is a method of monitoring using a directive coupler as optical parts in which a branch unit and a PD are integrated, using a multilayer film, and using a PD arranged on the top face of the waveguide using a reflective film arranged on the waveguide. However, when these PLC type optical parts are applied to an optical amplifier, the crosstalk due to the leak of the optical waveguide of the pumping light (including the leak of pumping light) is apparent in addition to the crosstalk between the ports caused by an optical filter.

To solve the problem the fifth means proposes the optical amplifier using a signal light monitor doped with an element which absorbs pumping light for the optical waveguide of the branch unit in the optical parts in which the branch unit produced using the PLC technology and the PD are integrated.

Figure 52:
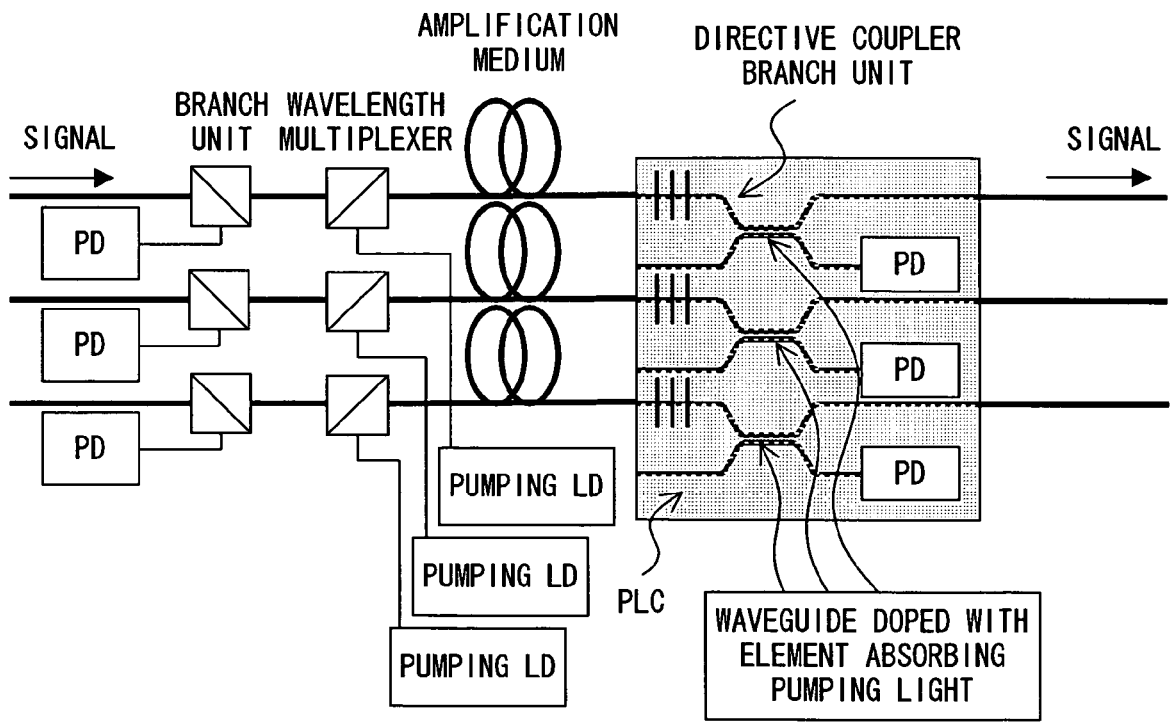
FIG. 52 shows the configuration according to an embodiment using the fifth means.

FIG. 52 shows the configuration according to the fifth means. FIG. 52 shows an example of the configuration of the optical amplifier in which forward pumping light amplifiers are arrayed and the pumping light absorption medium is an optical waveguide in the PLC type optical monitor as an output monitor. To moderate the absorption saturation and the fluorescence, the second means is used. the output monitor is integrated in the PLC. For backpumping, the optical monitor is used as an input monitor because the pumping light leaks to the input monitor. For bidirectional pumping it is used as an input/output monitor.

Since an absorption medium is doped in the optical waveguide, the pumping light leak to the adjacent port can be absorbed before input to the PD of the adjacent port. Therefore, the crosstalk between the ports, which has been the problem, can be reduced. Additionally, by configuring a monitor unit in the PLC, the system can be downsized.

Described below is the sixth means.

In the sixth means, the method of increasing the effect of the fifth means can be a monitor doped with an element which absorbs pumping light for the clad as well as the optical waveguide. FIG. 53 shows an example of a configuration according to the sixth means. The second means is used to moderate the associated with and the fluorescence. In FIG. 53, the second means is used to moderate the absorption saturation and the fluorescence, but the first or third means can also be used.

Not only the optical waveguide, but also the clad can be doped with an absorbent to increase the absorption of the leak of pumping light, and the problem with the PLC, that is, the light leak to an adjacent port can be absorbed by the clad.

Described below is the seventh means.

Pumping light indicates output much higher than signal light. It depends on the optical amplifier, but normally several ten mW to several hundreds mW. Since the PLC technology is appropriate in integrating an optical waveguide, the system can be downsized by integrating a wavelength multiplexer for multiplexing pumping light with a wavelength demultiplexer for monitoring a signal, but the PLC has a large light leak to an adjacent waveguide. Therefore, when the integration is realized, there occurs the problem of undesired crosstalk in the optical monitor of the pumping light and the signal light.

Figure 54:
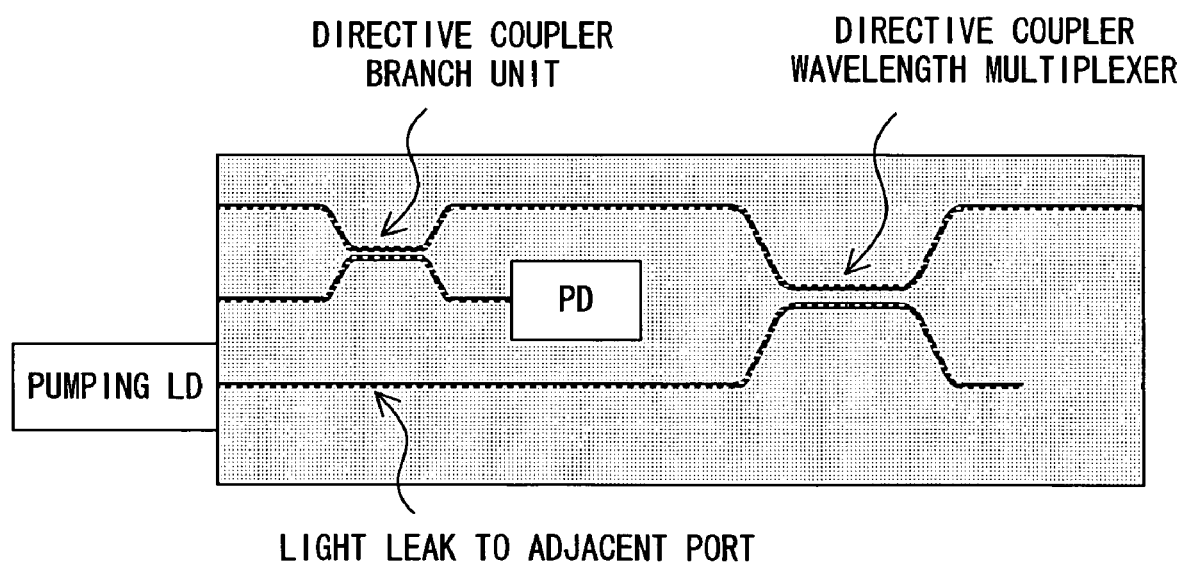
FIG. 54 is a schematic diagram of the reduction of a crosstalk in the optical monitor using pumping light and signal light.

FIG. 54 is a schematic diagram showing the degradation of crosstalk in the optical monitor of the pumping light and the signal light. The configurations shown in FIGS. 55 and 56 are proposed.

Figure 55:
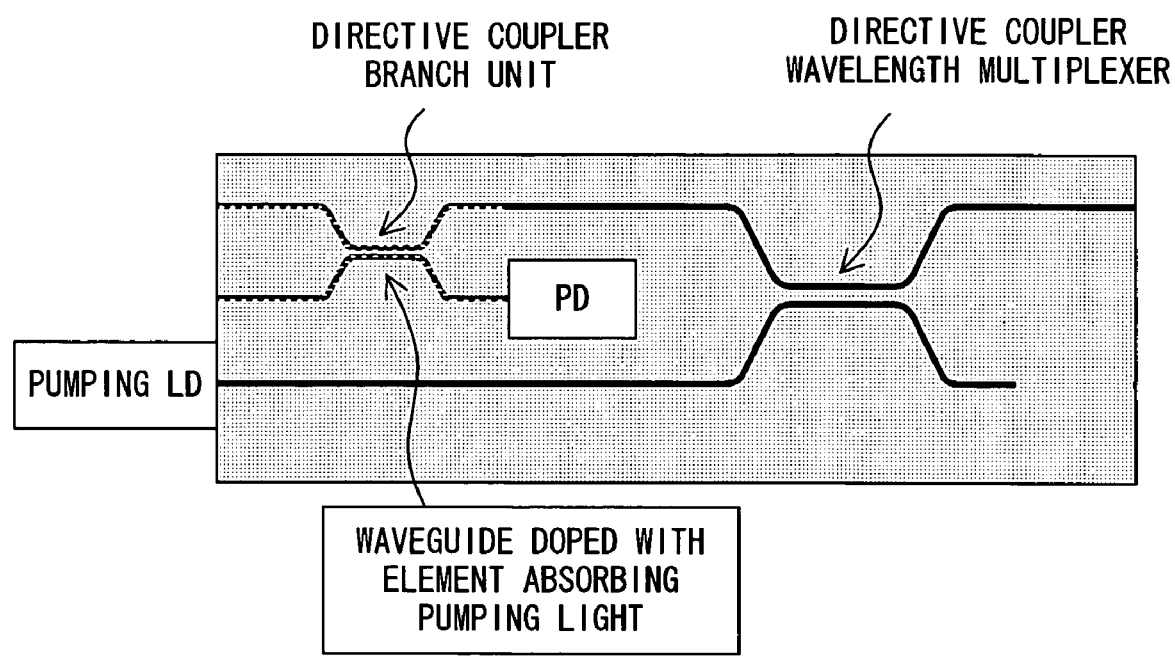
FIG. 55 shows the first configuration for solving the problem shown in FIG. 54.
Figure 56:
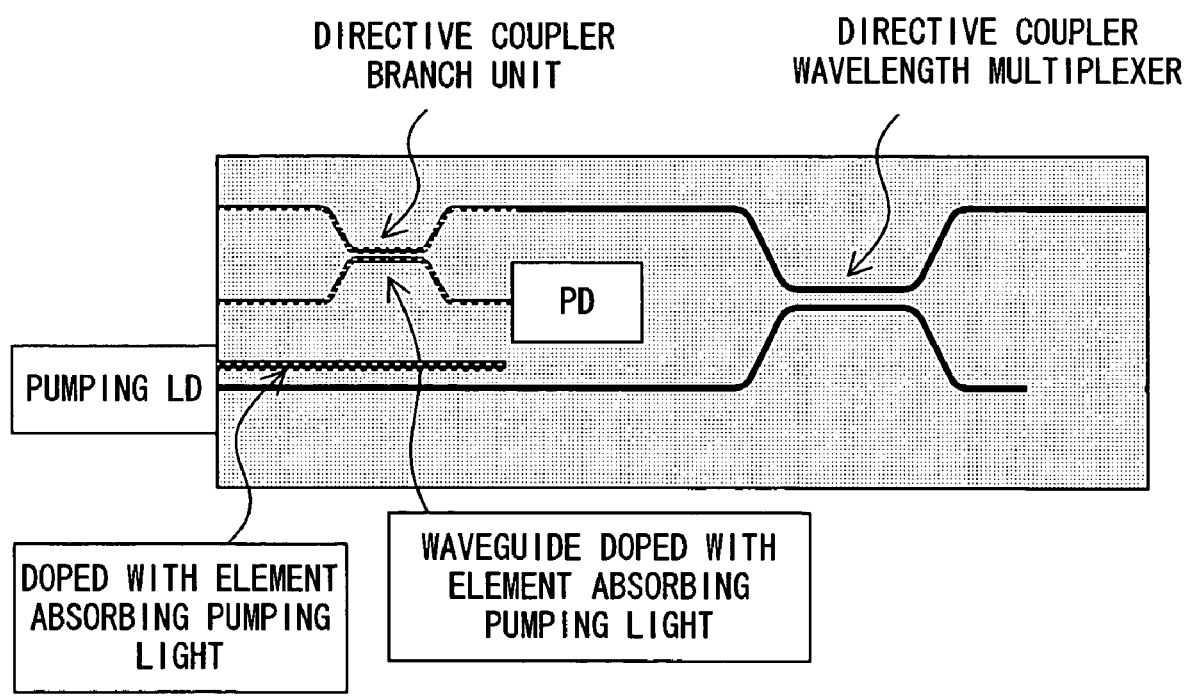
FIG. 56 shows the second configuration for solving the problem shown in FIG. 54.

In FIG. 55, by doping an element which absorbs pumping light in the waveguide of the branch unit of a monitor, the leak of the pumping light to the branch unit can be suppressed. FIG. 56 shows doping the clad around the monitor unit with an elements which absorbs pumping light in addition to FIG. 55. The second means is used to moderate the absorption saturation and the fluorescence. FIG. 56 shows the second means for moderating the absorption saturation and the fluorescence, but the first and third means can also be used.

Figure 57:
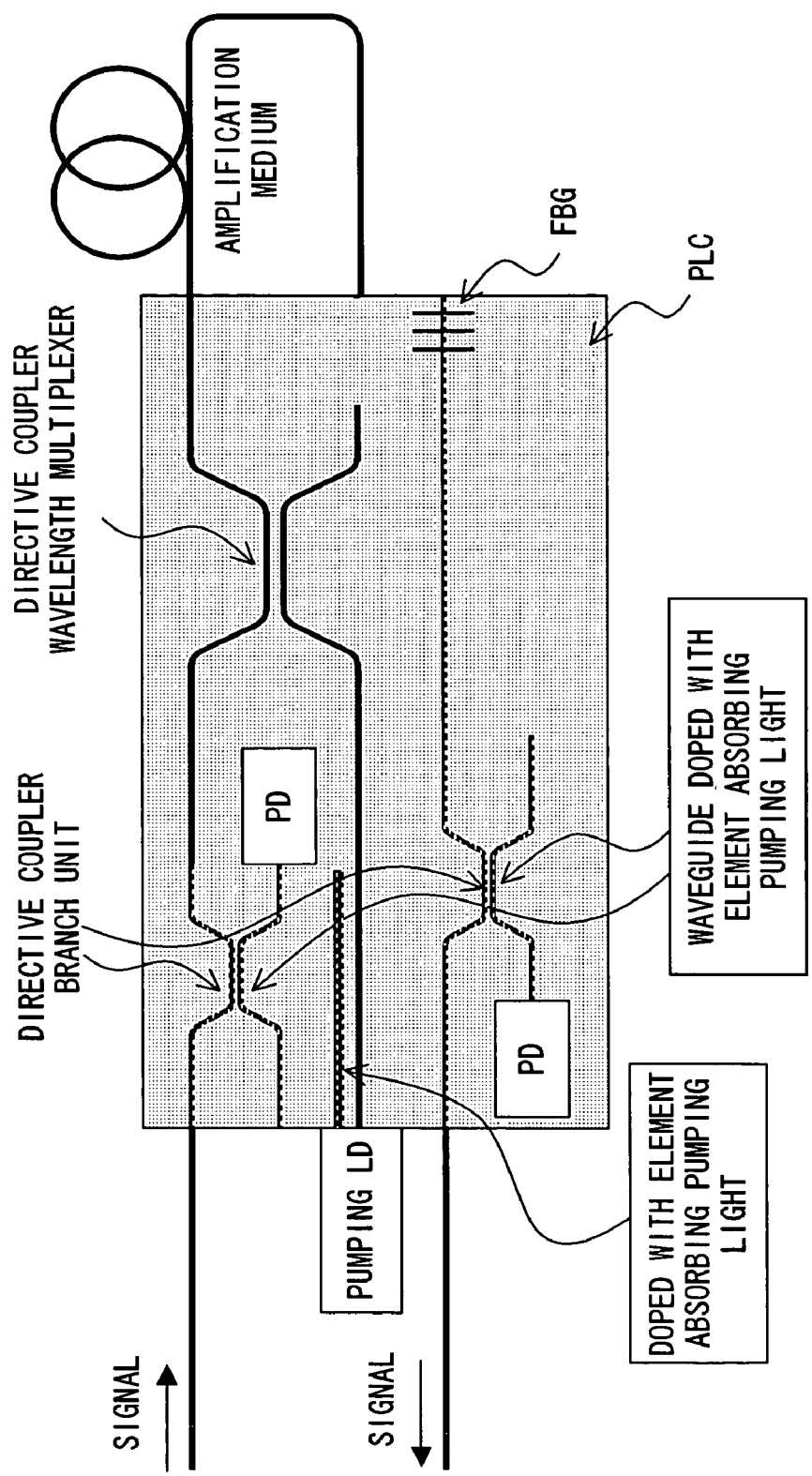
FIG. 57 is a schematic diagram showing the structure in which optical parts are incorporated.
Figure 58:
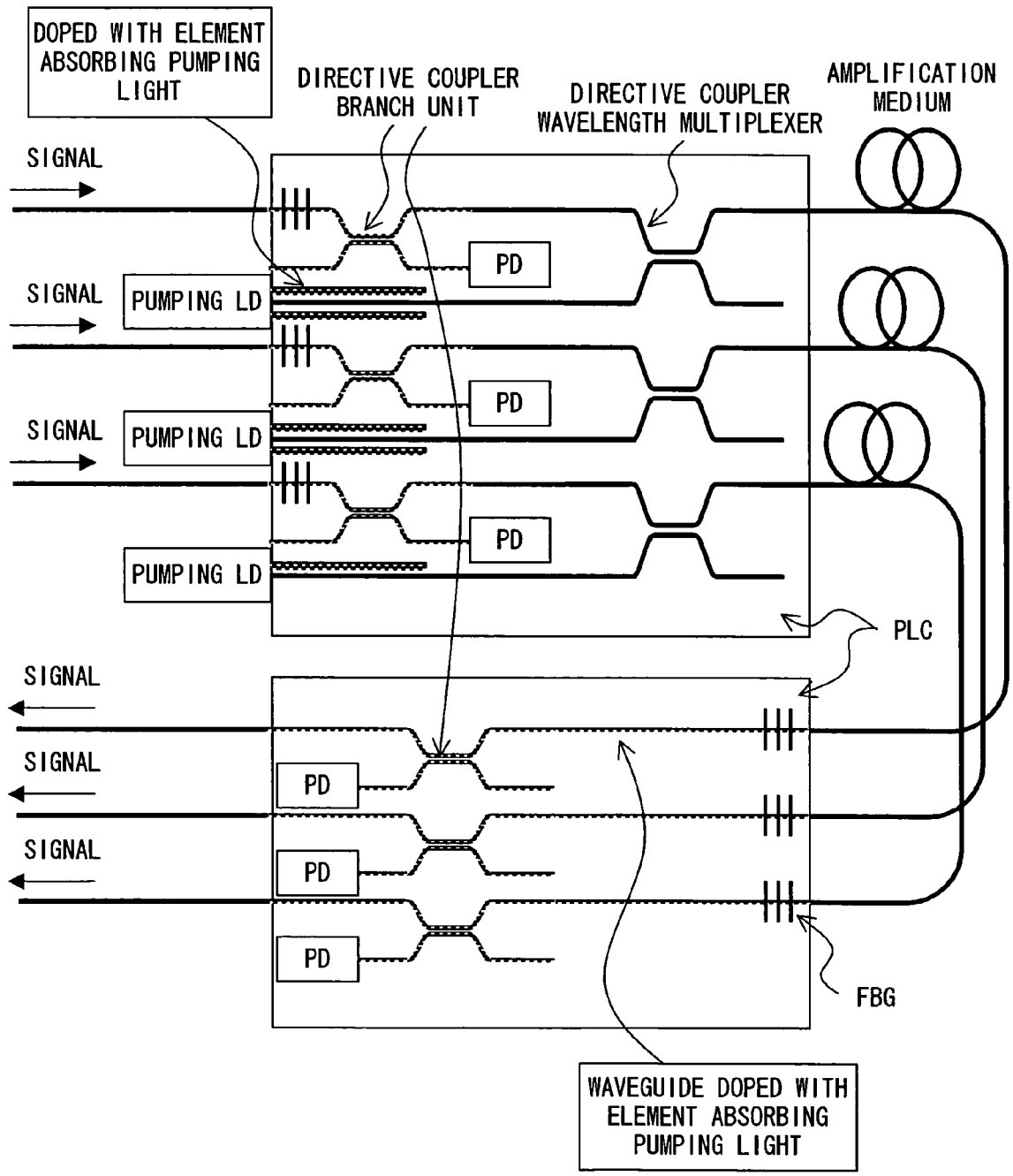
FIG. 58 shows the first example of the structure in which an optical amplifier is arrayed.

By integrating the wavelength multiplexer with the branch unit, all optical parts forming the optical amplifier can be integrated. FIG. 57 is a schematic diagram of integrating optical parts. FIGS. 58 and 59 show examples of the configuration in which optical amplifiers are arrayed.

FIGS. 57, 58, and 59 show examples of forward pumping light amplifiers. In backpumping and bidirectional pumping, the integration can be realized. The second means is used to moderate the absorption saturation and the fluorescence. In these examples, the second means is used to moderate the absorption saturation and the fluorescence, but the first and third means can also be used.

In the above-mentioned embodiments, an optical waveguide doped with an element which absorbs pumping light is used as a pumping light cutoff filter to solve the problem of the absorption saturation and the fluorescence. The absorption saturation and the fluorescence have been moderated. thus, in the optical amplifier configured in an array, an optical waveguide doped with an element which absorbs pumping light can be applied as an optical filter. Therefore, an optical amplifier with an array type configuration having low crosstalk between the ports during pumping light cutoff can be realized.

Furthermore, an optical waveguide of a monitor branch unit is doped with an element which absorbs pumping light to configure a signal light monitor resistant to the leak of pumping. Thus, when optical parts configuring an optical amplifier are integrated in a PLC, the crosstalk of the pumping light and the signal light in a monitor can be reduced.

As described above, the present invention prescribes the connection position of a loss medium to the optical amplifier for performing loss compensation, and sets the amount of reflection attenuation of light at the connection point, etc. on the output side from the optical amplification unit smaller than the amount of reflection attenuation of light at the output terminal, thereby downsizing and cost-reducing an optical apparatus. By increasing the loss of the loss medium, the reflected light on the output side of the optical amplification unit can be effectively reduced. Therefore, the gain range in which no oscillation phenomenon, which causes undesired influence on the signal transmission characteristic, occurs can be broadly set. Furthermore, based on the monitor result of the input light and output light, the operation of the optical amplification unit is controlled. As a result, although the amount of loss of the loss medium has changed, the gain of the optical amplifier can be automatically adjusted, thereby realizing the loss compensation of various optical parts having different amounts of losses by a small and low-cost optical amplifier. If a plurality of optical amplifiers are integrated in parallel, the entire optical apparatus or the optical amplifier for loss compensation can be further smaller at a lower cost.

What is claimed is:

1. An optical apparatus having loss compensation capability, provided with an optical amplifier for compensating any loss generated in a loss medium, wherein
said optical amplifier comprises:
an optical amplification unit provided between an input terminal and an output terminal;
an input side monitor unit for monitoring the power of the light transmitted from the input terminal to the optical amplification unit;
an output side monitor unit for monitoring the power of the light transmitted from the optical amplification unit to the output terminal; and
a gain control unit for controlling the gain in the optical amplification unit based on each monitor result of the input side monitor unit and the output side monitor unit, wherein
said loss medium is connected to the optical path between the output end of the optical amplification unit and the input end of the output side monitor unit, and said loss medium is configured such that the amount of reflection attenuation on all points, on which the light is reflected on the optical path from the output end of the optical amplification unit to the output terminal, is smaller than the amount of reflection attenuation on an end face of the output terminal; and
said gain control unit controls the operation of the optical amplification unit such that a gain at least equal to a loss generated in the loss medium is obtained.

2. The apparatus according to claim 1, wherein
said loss medium is connected to an optical path by fusion splicing.

3. The apparatus according to claim 1, wherein
said loss medium is connected to an optical path using a connector having an amount of reflection attenuation better than an amount of reflection attenuation of a connector used for the output terminal.

4. The apparatus according to claim 1, further comprising:
an isolator for cutting off light propagating from the optical amplification unit to the input side monitor unit on an optical path between the output end of the input side monitor unit and the input end of the optical amplification unit.

5. The apparatus according to claim 1, further comprising:
a plurality of optical amplification units for a plurality of loss media, wherein at least two of the plurality of optical amplifiers are integrated in parallel.

6. The apparatus according to claim 5, wherein
said optical amplifiers integrated in parallel are integrated using an optical waveguide technology on all or a part of corresponding components.

7. The apparatus according to claim 6, wherein
each of said optical amplifiers has an optical amplification unit using a rare earth element doped fiber, and waveguide type parts integrated using the optical waveguide technology are connected to the rare earth element doped fiber with mode field diameters set consistent with each other.

8. The apparatus according to claim 5, wherein
at least two of the optical amplifiers integrated in parallel are connected in series.

9. The apparatus according to claim 1, including:
a plurality of optical amplification units for a plurality of loss media, wherein at least two of the plurality of optical amplifiers are integrated in series.

10. The apparatus according to claim 1, where in said apparatus is an optical communications system.

11. The apparatus according to claim 10, wherein
a connection status of an optical connector of the system can be detected based on light output from said optical apparatus.

12. An optical amplifier for loss compensation comprising:
an optical amplification unit provided between an input terminal and an output terminal;
an input side monitor unit for monitoring the power of the light transmitted to the optical amplification unit;
an output side monitor unit for monitoring the power of the light transmitted from the optical amplification unit to the output terminal; and
a gain control unit for controlling the gain in the optical amplification unit based on each monitor result of the input side monitor unit and the output side monitor unit, wherein
a pair of loss medium connection points for connection of a loss medium are provided on the optical path between the output end of the optical amplification unit and the input end of the output side monitor unit;
said loss medium is configured that the amount of reflection attenuation on all points, on which the light is reflected on the optical path from the output end of the optical amplification unit to the output terminal, is smaller than the amount of reflection attenuation on the end face of the output terminal; and said gain control unit controls the operation of the optical amplification unit such that a gain at least equal to a loss generated in the loss medium connected to the loss medium connection points is obtained.

13. The optical amplifier according to claim 12, wherein a plurality of optical amplifiers for loss compensation are provided, and at least two of the plurality of optical amplifiers are integrated in parallel.

14. The optical amplifier according to claim 12, wherein said pair of loss medium connection points are made, when the loss media are not connected, by using a connector having an amount of reflection attenuation better than an amount of reflection attenuation of a connector used for the output terminal, or by fusion splicing.

* * * * *